(12) United States Patent
Kim et al.

(10) Patent No.: US 11,063,104 B2
(45) Date of Patent: Jul. 13, 2021

(54) LIGHT EMITTING DISPLAY DEVICE

(71) Applicant: LG Display Co., Ltd., Seoul (KR)

(72) Inventors: Hyoung-Su Kim, Paju-si (KR);
Jonghyeok Im, Paju-si (KR);
Gyungmin Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 27 days.

(21) Appl. No.: 16/719,219

(22) Filed: Dec. 18, 2019

(65) Prior Publication Data

US 2020/0212154 A1    Jul. 2, 2020

(30) Foreign Application Priority Data

Dec. 28, 2018  (KR) .................. 10-2018-0173128
Aug. 6, 2019   (KR) .................. 10-2019-0095326

(51) Int. Cl.
*H01L 27/32*   (2006.01)
*H01L 49/02*   (2006.01)

(52) U.S. Cl.
CPC ...... *H01L 27/3265* (2013.01); *H01L 27/3218* (2013.01); *H01L 27/3248* (2013.01); *H01L 27/3276* (2013.01); *H01L 28/60* (2013.01)

(58) Field of Classification Search
CPC ............. H01L 27/3265; H01L 27/3218; H01L 27/3276; H01L 27/3225; H01L 28/60
See application file for complete search history.

(56) References Cited

U.S. PATENT DOCUMENTS

2014/0077186 A1* 3/2014 Kim .................... H01L 27/3218
257/40

FOREIGN PATENT DOCUMENTS

KR    10-2017-0055239 A    5/2017

* cited by examiner

*Primary Examiner* — Quoc D Hoang
(74) *Attorney, Agent, or Firm* — Birch, Stewart, Kolasch & Birch, LLP

(57) ABSTRACT

A display device can include a first sub pixel disposed on a substrate; a second sub pixel disposed on the substrate, the second sub pixel being adjacent to the first sub pixel; a first electrode disposed in each of the first and second sub pixels; a first capacitor disposed on the first electrode in each of the first and second sub pixels, the first capacitor being located at a periphery of the corresponding first electrode; an emission layer disposed on the first electrode in each of the first and second sub pixels; and a second electrode disposed on the emission layer in each of the first and second sub pixels.

27 Claims, 29 Drawing Sheets

LIGHT EMITTING DISPLAY DEVICE

CROSS-REFERENCE TO RELATED APPLICATIONS

The present application claims the benefit of priority to the Korean Patent Application No. 10-2018-0173128 filed in the Republic of Korea on Dec. 28, 2018, and the Korean Patent Application No. 10-2019-0095326 filed in the Republic of Korea on Aug. 6, 2019, all of these applications are incorporated by reference into the present application.

BACKGROUND

Technical Field

The present disclosure relates to a display device configured to display an image.

Description of the Related Art

With the advancement of an information-oriented society, requirements for a display device of displaying an image are increasing in various types. For example, various display devices, such as liquid crystal display (LCD), plasma display panel (PD) and organic light emitting display (OLED) have been utilized.

Recently, a head mounted display (HMD) device including the above display device has been developed. The head mounted display (HMD) device, which is worn as part of glasses or helmet, is an eyeglass-type monitor device of virtual reality (VR) or augmented reality (AR), in which a focus is formed within a short distance in front of user's eyes.

This head mounted display (HMD) device should have a high resolution, whereby a PPI (pixels per inch) is increased. According as the PPI is increased, it has limitations on the increase of capacitance in a capacitor of the head mounted display (HMD) device.

BRIEF SUMMARY

The present disclosure has been made in view of the above problems, and it is an object of the present disclosure to provide a display device capable of securing a capacitance of a capacitor even in a high resolution.

In accordance with an aspect of the present disclosure, the above and other objects can be accomplished by the provision of a display device including a substrate including a first sub pixel and a second sub pixel, a first electrode patterned in each of the first sub pixel and the second sub pixel on the substrate, a first capacitor in the periphery of the first electrode on the first electrode, an emission layer on the first electrode and the first capacitor, and a second electrode on the emission layer.

According to an aspect of the present disclosure, the capacitor is formed on the first electrode, and a first capacitor electrode of the capacitor is formed of a vertical aligned carbon nanotube. According the first capacitor electrode having a predetermined height in a vertical direction is formed along the periphery of the first electrode, it is possible to increase an area of the first capacitor electrode. Accordingly, it is possible to sufficiently secure a capacitance of the capacitor in a high resolution.

Also, according to an aspect of the present disclosure, the first capacitor electrode is vertically formed so that it is possible to increase an area regardless of an arrangement relation between other wirings or electrodes. That is, the present disclosure facilitates to increase a capacitance of the capacitor in accordance with a resolution.

Also, according to the present disclosure, a second capacitor electrode is formed of a metal material with high reflectance, whereby some of light emitted from an organic light emitting layer, which otherwise would advance toward the neighboring sub pixel, may be reflected to a front direction. Thus, according to the present disclosure, it is possible to prevent colors from being mixed in the neighboring sub pixels without using a black matrix.

Also, according to an aspect of the present disclosure, a groove portion (trench) may be formed between the sub pixels by the first capacitor electrode of the vertical aligned carbon nanotube. Thus, the groove portion (trench) is formed so that it is possible to minimize an influence on the neighboring sub pixels by a leakage current via the organic light emitting layer.

In addition to the effects of the present disclosure as mentioned above, additional advantages and features of the present disclosure will be clearly understood by those skilled in the art from the description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
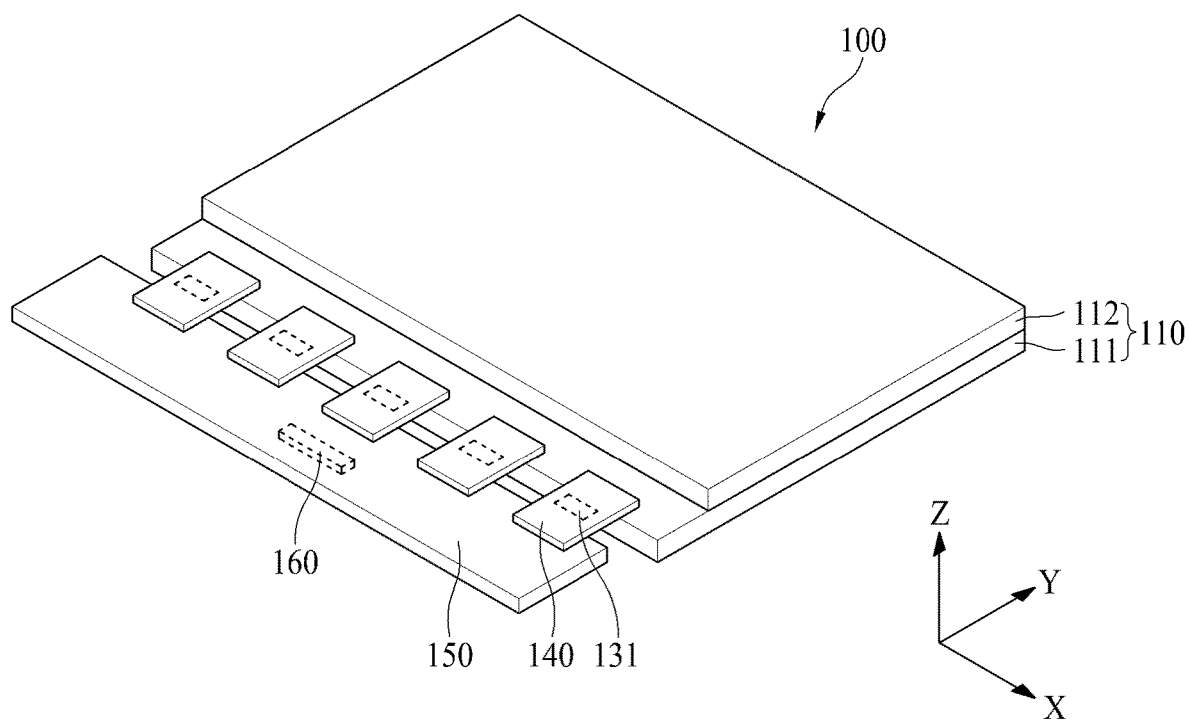
FIG. 1 is a perspective view illustrating a display device according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where "comprise," "have," and "include" described in the present specification are used, another part may be added unless "only" is used. The terms of a singular form may include plural forms unless referred to the contrary.

In construing an element, the element is construed as including an error range although there is no explicit description.

In describing a position relationship, for example, when the position relationship is described as "upon," "above," "below," and "next to," one or more portions may be arranged between two other portions unless 'just' or 'direct' is used.

In describing a time relationship, for example, when the temporal order is described as "after," "subsequent," "next," and "before," a case which is not continuous may be included unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "X-axis direction," "Y-axis direction," and "Z-axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 2:
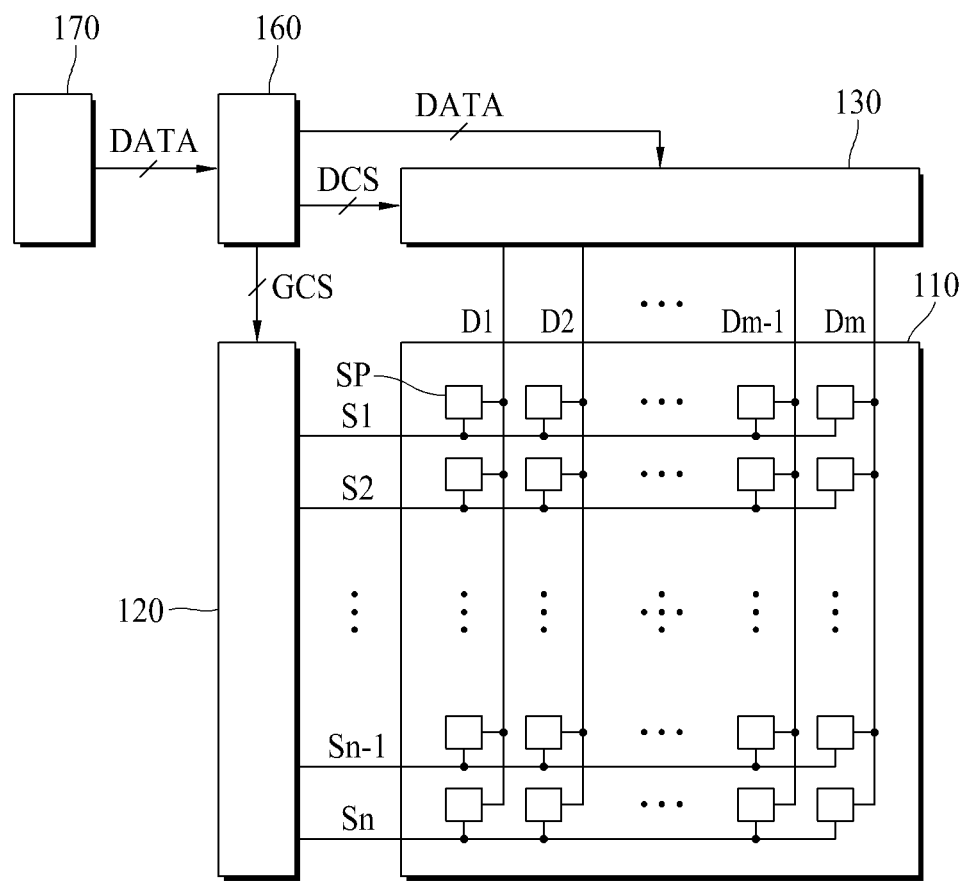
FIG. 2 is a block diagram illustrating the display device according to an embodiment of the present disclosure.

FIG. 1 is a perspective view illustrating a display device according to one embodiment of the present disclosure. FIG. 2 is a block diagram illustrating the display device according to one embodiment of the present disclosure.

Referring to FIGS. 1 and 2, the display device according to one embodiment of the present disclosure includes a display panel 110, a scan driver 120, a data driver 130, a timing controller 160, and a host system 170.

The display panel 110 includes a first substrate 111 and a second substrate 112. The second substrate 112 may be an encapsulation substrate. The first substrate 111 may be a plastic film or a glass substrate, but not limited to these materials. The first substrate 111 may be formed of a semiconductor material, such as silicon wafer. The second substrate 112 may be a plastic film, a glass substrate, or an encapsulation film (e.g., protection film).

The display panel 110 includes a display area with sub pixels (SP) prepared to display an image. The display panel 110 may include data lines (D1~Dm, 'm' is an integer of 2 or more than 2), and scan lines (S1~Sn, 'n' is an integer of 2 or more than 2). The data lines (D1~Dm) may intersect with the scan lines (S1~Sn). Herein, the sub pixels (SP) may be formed at respective intersection areas defined by the gate and data lines crossing each other.

Each of the sub pixels (SP) of the display panel 110 may be connected with any one of the data lines (D1~Dm) and any one of the scan lines (S1~Sn). Each of the sub pixels (SP) of the display panel 110 may include a driving transistor for controlling a drain-to-source current in accordance to a data voltage supplied to a gate electrode, a scan transistor which is turned-on by a scan signal of the scan line to supply the data voltage of the data line to the gate electrode of the driving transistor, an organic light emitting diode which emits light in accordance with the drain-to-source current of the driving transistor, and a capacitor for storing the voltage of the gate electrode of the driving transistor. Thus, each of the sub pixels (SP) may emit light in accordance with a current supplied to the organic light emitting diode.

The scan driver 120 receives a scan control signal (GCS) from the timing controller 160. The scan driver 120 supplies the scan signals to the scan lines (S1~Sn) in accordance with the scan control signal (GCS).

The scan driver 120 may be disposed in a non-display area at one peripheral side or both peripheral sides of the display area of the display panel 110 by a gate driver in panel (GIP) method. In another way, the scan driver 120 may be fabricated in a driving chip, and mounted on a flexible film, in which the scan driver 120 of the driving chip may be attached to the non-display area at one peripheral side or both peripheral sides of the display area of the display panel 110 by a tape automated bonding (TAB) method.

The data driver 130 receives digital video data (DATA) and data control signal (DCS) from the timing controller 160. The data driver 130 converts the digital video data (DATA) to an analog positive/negative data voltage in accordance with the data control signal (DCS), and supplies the analog positive/negative data voltage to the data lines. That is, the pixels to be supplied with the data voltages are selected by the scan signals of the scan driver 120, and the data voltages are supplied to the selected pixels.

As shown in FIG. 1, the data driver 130 may include a plurality of source drive ICs 131. Each of the plurality of source drive ICs 131 may be mounted on a flexible film 140 by a chip on film (COF) or chip on plastic (COP) method. The flexible film 140 is attached onto pads prepared in the non-display area of the display panel 110 by the use of anisotropic conducting film, whereby the plurality of source drive ICs 131 may be connected with the pads.

A circuit board 150 may be attached to the flexible films 140. A plurality of circuits formed of driving chips may be mounted on the circuit board 150. For example, the timing controller 160 may be mounted on the circuit board 150. The circuit board 150 may be a printed circuit board or a flexible printed circuit board.

The timing controller 160 receives the digital video data (DATA) and timing signals from the host system 170. The timing signals may include a vertical synchronization signal, a horizontal synchronization signal, a data enable signal, a dot clock, and etc. The vertical synchronization signal is a signal for defining 1 frame period. The horizontal synchronization signal is a signal for defining 1 horizontal period to supply the data voltages to the pixels for 1 horizontal line of the display panel (DIS). The data enable signal is a signal for defining a period in which valid data is input. The dot clock is a signal which is repeated every preset short time period.

In order to control an operation timing of each of the scan driver 120 and the data driver 130, the timing controller 160 generates a data control signal (DCS) for controlling the operation timing of the data driver 130, and a scan control signal (GCS) for controlling the operation timing of the scan driver 120 on the basis of timing signals. The timing controller 160 outputs the scan control signal (GCS) to the scan driver 120, and outputs the digital video data (DATA) and the data control signal (DCS) to the data driver 130.

The host system 170 may be embodied in a navigation system, a set top box, a DVD player, a BLU-RAY player, a personal computer (PC), a home theater system, a broadcasting receiver, a phone system, and etc. The host system 170 includes a SoC (system on chip) with a scaler, which enables to convert the digital video data (DATA) of input image into a format appropriate for the display on the display panel (DIS). The host system 170 transmits the digital video data (DATA) and timing signals to the timing controller 160.

Figure 3:
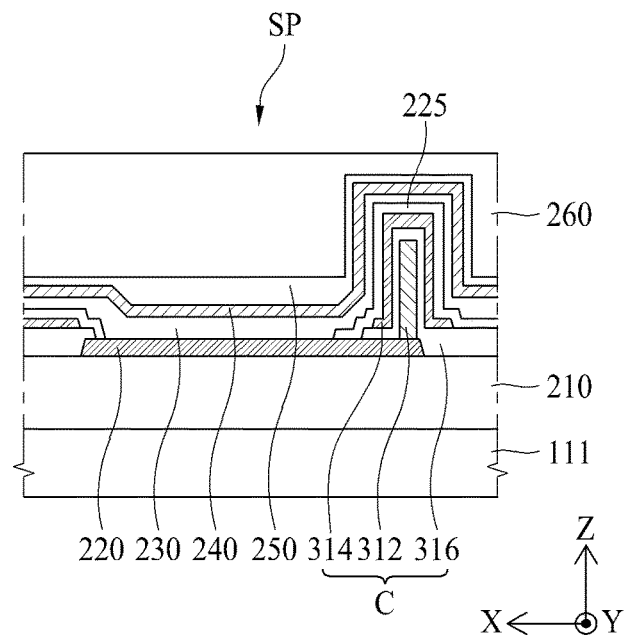
FIG. 3 is a cross sectional view illustrating a sub pixel according to an embodiment of the present disclosure.

The display panel 110 according to one embodiment of the present disclosure is characterized in that the capacitor (C) is provided on a first electrode 220, as shown in FIG. 3.

In more detail, each of the sub pixels (SP) provided in the display panel 110 includes the first electrode 220, an organic light emitting layer 230, and a second electrode 240. In each sub pixel (SP), the organic light emitting layer 230 may emit light by a potential difference between the first electrode 220 and the second electrode 240.

In addition, the capacitor (C) is provided in each of the sub pixels (SP). In the sub pixel (SP) according to one embodiment of the present disclosure, the capacitor (C) may be provided on the first electrode 220.

The capacitor (C) may be provided in the peripheral area of at least one side of the first electrode 220. The capacitor (C) may include a first capacitor electrode 312, a second capacitor electrode 314, and a capacitor dielectric film 316.

The first capacitor electrode 312 may be configured to have a predetermined vertical height, and may be electrically connected with the first electrode 220. The capacitor dielectric film 316 is provided between the first capacitor electrode 312 and the second capacitor electrode 314, and is configured to store electric charges therein. The second capacitor electrode 314 is provided on the capacitor dielectric film 316, and may be electrically connected with the ground or the gate electrode of the driving transistor.

Hereinafter, various embodiments of the display panel including the above capacitor will be described in detail with reference to FIGS. 4 to 28.

First Embodiment

Figure 4:
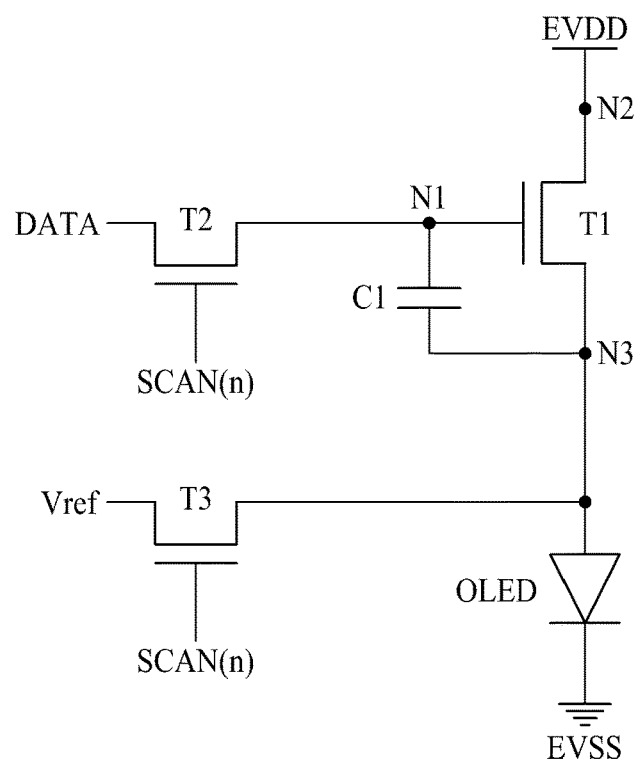
FIG. 4 is a circuit diagram illustrating one example of a sub pixel according to an embodiment of the present disclosure.

FIG. 4 is a circuit diagram illustrating a sub pixel of a display device according to the first embodiment of the present disclosure.

Referring to FIG. 4, each sub pixel (SP) can have 3T(Transistor)1C(Capacitor) structure including three transistors (T1, T2, T3) and one capacitor (C1).

In each sub pixel (SP), the first transistor (T1) is connected between a first electrode of an organic light emitting diode (OLED) and a driving voltage line for supplying a driving voltage (EVDD), or between the first electrode of the organic light emitting diode (OLED) and a connection line connected with the driving voltage line. In this situation, the driving voltage (EVDD) is applied to a second node (N2) of the first transistor (T1).

The first transistor (T1) corresponds to a driving transistor for driving the organic light emitting diode (OLED). The first transistor (T1) is controlled by a voltage of the first node (N1), and the first transistor (T1) supplies a current to the organic light emitting diode (OLED). Accordingly, the organic light emitting diode (OLED) is driven.

In each sub pixel (SP), the second transistor (T2) is controlled by a scan signal (SCAN(n)) supplied from a scan line (S1~Sn), and the second transistor (T2) is connected between the first node (N1) of the first transistor (T1) and a data line (DL).

The second transistor (T2) corresponds to a switching transistor. The second transistor (T2) is controlled by the scan signal (SCAN(n)), and the second transistor (T2) supplies a data voltage (Data) supplied from the data line (DL) to the first node (N1) of the first transistor (T1). Accordingly, it is possible to control a turning-on/off state of the first transistor (T1).

In each sub pixel (SP), the first capacitor (C1) is connected between the first node (N1) of the first transistor (T1) and a third node (N3) of the first transistor (T1).

The first capacitor (C1) maintains a potential difference between the first node (N1) of the first transistor (T1) and the third node (N3) of the first transistor (T1) for one frame. The first capacitor (C1) corresponds to a storage capacitor.

In each sub pixel (SP), the third transistor (T3) is controlled by the scan signal (SCAN(n)) supplied from the scan line (S1~Sn), and the third transistor (T3) is connected between the third node (N3) of the first transistor (T1) and a reference voltage line for supplying a reference voltage (Vref).

The third transistor (T3) corresponds to a switching transistor. The third transistor (T3) is controlled by the scan signal (SCAN), and the third transistor (T3) applies the reference voltage (VRef) supplied from the reference voltage line to the third node (N3). Accordingly, it is possible to adjust a voltage in the third node (N3) of the first transistor (T1).

Figure 5:
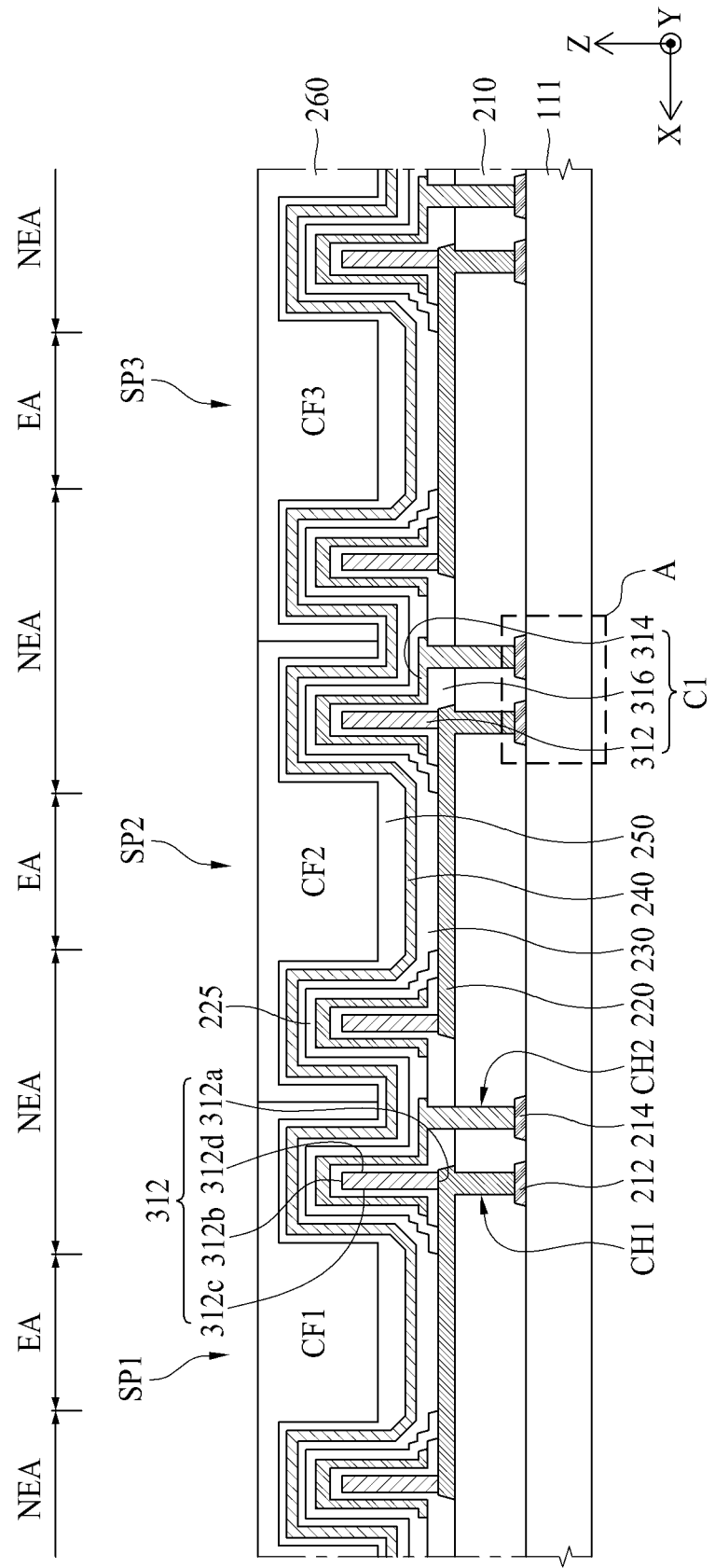
FIG. 5 is a cross sectional view illustrating an embodiment of a display device having a sub pixel shown in FIG. 4.
Figure 6:
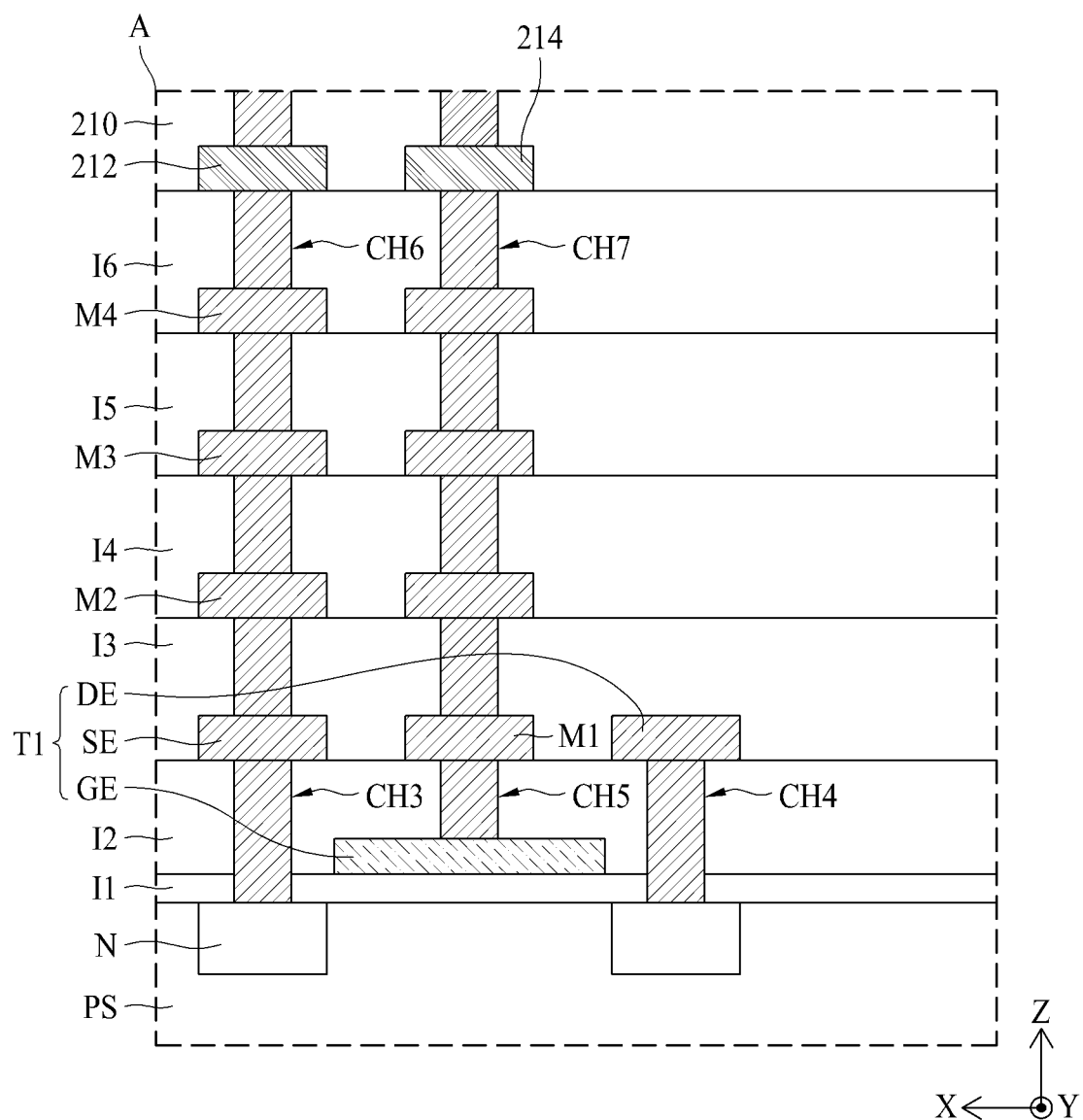
FIG. 6 is an expanded view illustrating one example of "A" area in FIG. 5 according to an embodiment of the present disclosure.
Figure 7:
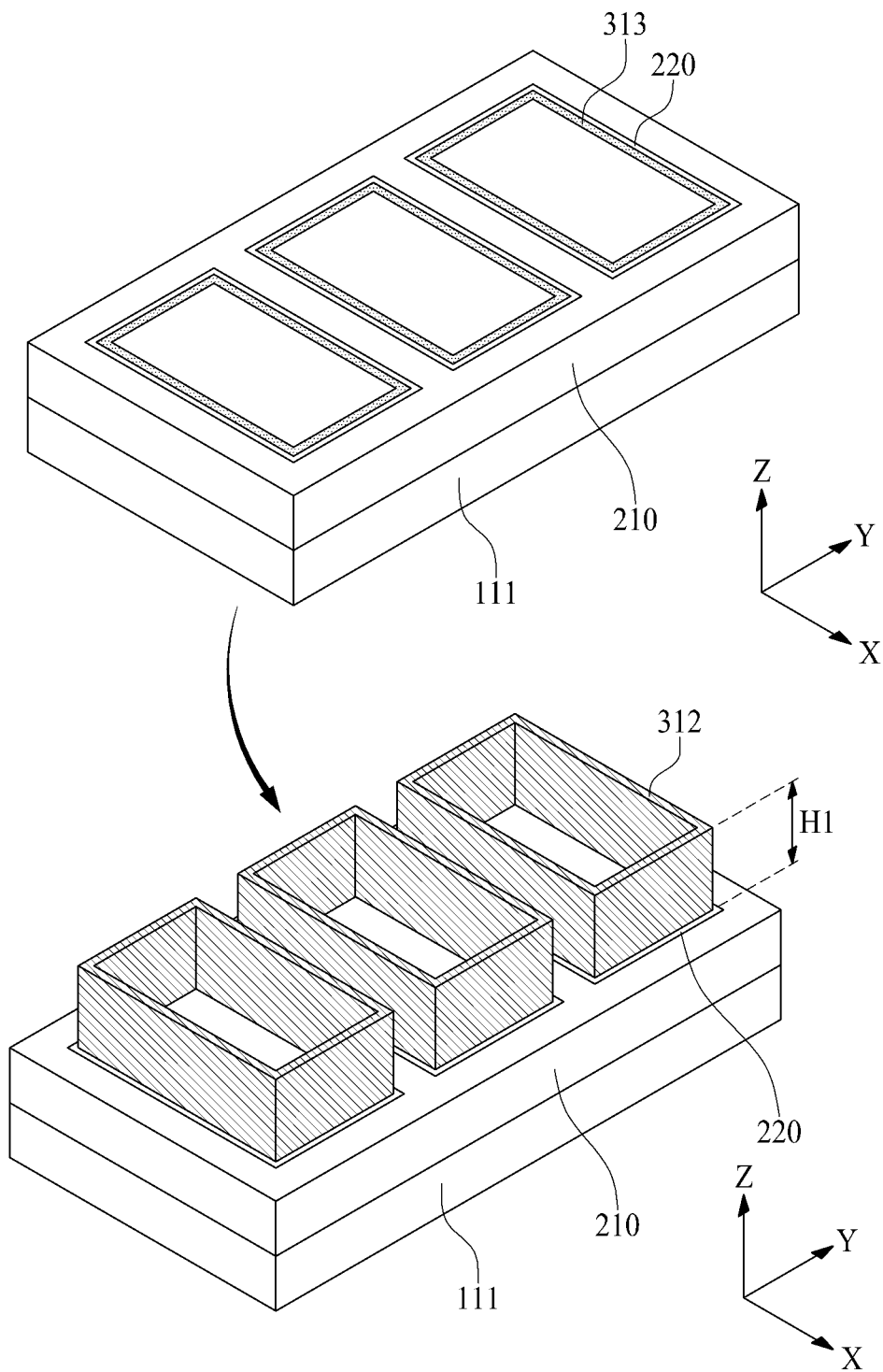
FIG. 7 is a perspective view illustrating a process of forming a first capacitor electrode shown in FIG. 5 according to an embodiment of the present disclosure.
Figure 8:
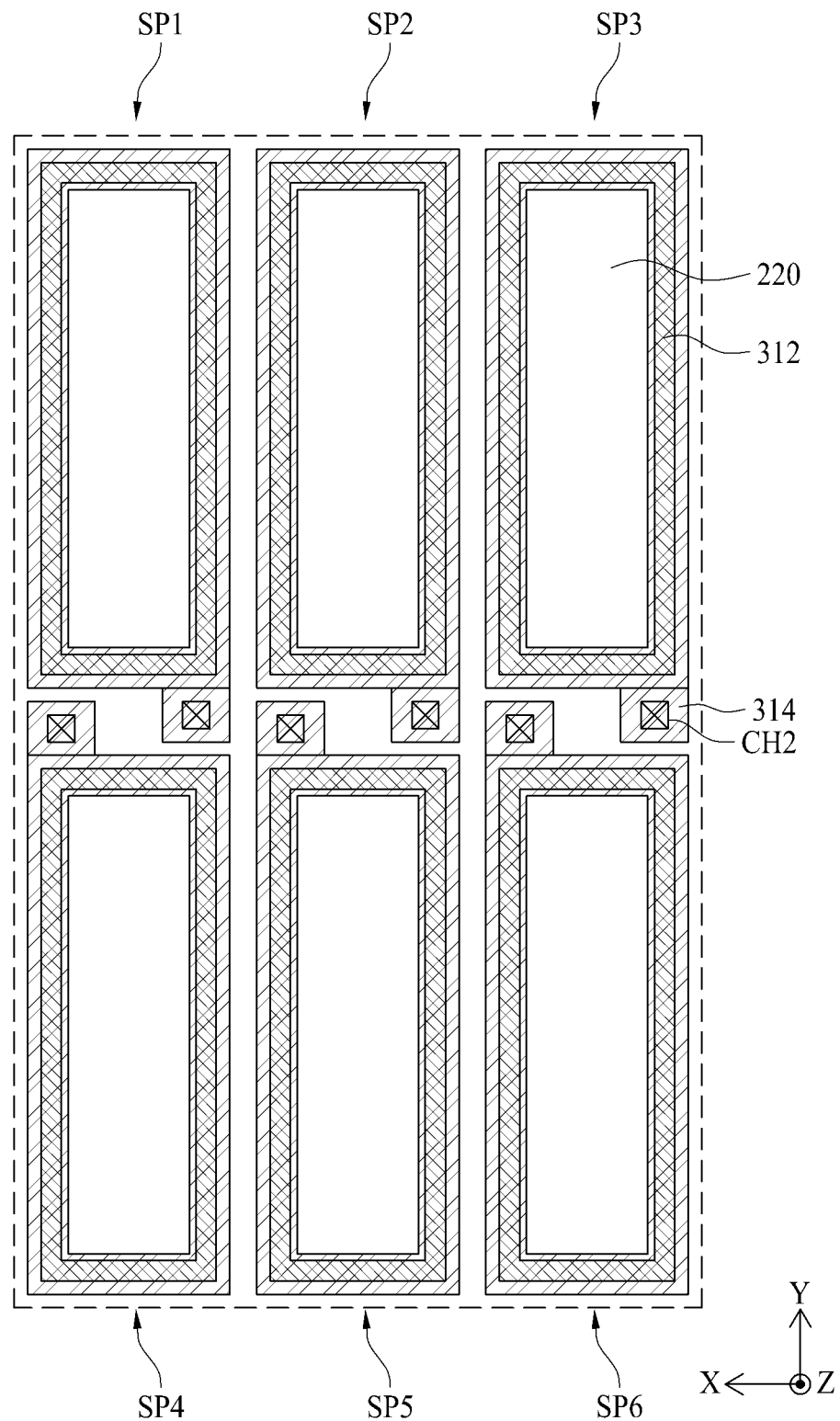
FIG. 8 is a plane view illustrating a first electrode, a first capacitor electrode, and a second capacitor electrode shown in FIG. 5 according to an embodiment of the present disclosure.

FIG. 5 is a cross sectional view illustrating a first embodiment of the display device having the sub pixel shown in FIG. 4. FIG. 6 is an expanded view illustrating one example of "A" area in FIG. 5. FIG. 7 is a perspective view illustrating a process of forming a first capacitor electrode shown in FIG. 5. FIG. 8 is a plane view illustrating a first electrode, a first capacitor electrode, and a second capacitor electrode shown in FIG. 5.

Referring to FIGS. 5 to 8, the display device 100 according to the first embodiment of the present disclosure includes a planarization film 210, a first electrode 220, an organic light emitting layer 230, a second electrode 240, an encapsulation film 250, a color filter layer 260, a first capacitor (C1), and a bank 225, which are provided on a first substrate 111.

On the first substrate 111, there are a first sub pixel (SP1) for emitting red (R) colored light, a second sub pixel (SP2) for emitting green (G) colored light, and a third sub pixel (SP3) for emitting blue (B) colored light, but not limited to this structure. In addition, a fourth sub pixel for emitting white (W) colored light can be additionally provided on the first substrate 111. Also, an arrangement order of the sub pixels (SP1, SP2, SP3, SP4) can be changed in various ways.

The first substrate 111 can be formed of glass or plastic, but not limited to these materials. The first substrate 111 can be formed of a semiconductor material, such as silicon wafer. The first substrate 111 can be formed of a transparent material or an opaque material.

The display device 100 according to the first embodiment of the present disclosure can be formed in a top emission type where emitted light advances upwardly, but not limited to this type. If the display device 100 is formed in the top emission type, the first substrate 111 can be formed of an opaque material as well as a transparent material. If the display device 111 is formed in a bottom emission type where emitted light advances downwardly, the first substrate 111 can be formed of a transparent material.

Hereinafter, for convenience of explanation, it is assumed that the display device 100 is formed in the top emission type, and the first substrate 111 is formed of the opaque material, such as silicon wafer, but not necessarily.

If the first substrate 111 is formed of the semiconductor material, such as silicon wafer, the driving transistor (T1) shown in FIG. 6 can be provided in the first substrate 111.

In more detail, the first substrate 111 includes a P-type substrate (PS), N-type doping areas (N), a gate electrode (GE), a source electrode (SE), a drain electrode (DE), a plurality of metal layers (M1, M2, M3, M4), and a plurality of insulating layers (I1, I2, I3, I4, I5, I6).

On the P-type substrate (PS), there are the N-type areas (N) which are doped with an N-type semiconductor material. And, the gate insulating layer (I1) can be formed on the P-type substrate (PS) with the N-type areas (N). The gate insulating layer (I1) can be formed of an inorganic film, for example, can be formed in a single-layered structure of a silicon oxide film or a silicon nitride film, or a multi-layered structure including above the silicon oxide film and the silicon nitride film.

The gate electrode (GE) can be provided on the gate insulating layer (I1). The gate electrode (GE) can be formed in a single-layered structure of any one material selected among molybdenum (Mo), aluminum (Al), chrome (Cr), aurum (Au), titanium (Ti), nickel (Ni), neodymium (Nd), copper (Cu) and their alloys, or can be formed in a multi-layered structure of materials selected among molybdenum (Mo), aluminum (Al), chrome (Cr), aurum (Au), titanium (Ti), nickel (Ni), neodymium (Nd), copper (Cu) and their alloys, but not limited to these materials.

The insulating interlayer (I2) can be provided on the gate electrode (GE). The insulating interlayer (I2) can be formed of an inorganic film, for example, can be formed in a single-layered structure of a silicon oxide film or a silicon nitride film, or a multi-layered structure including above the silicon oxide film and the silicon nitride film.

On the insulating interlayer (I2), the source electrode (SE), the drain electrode (DE), and the M1 metal layer (M1) can be provided thereon. The source electrode (SE) can be connected with one of the N-type area (N) via a third contact hole (CH) penetrating through the gate insulating layer (I1) and the insulating interlayer (I2). The drain electrode (DE) can be connected with another of the N-type area (N) via a fourth contact hole (CH4) penetrating through the gate insulating layer (I1) and the insulating interlayer (I2).

Each of the source electrode (SE) and the drain electrode (DE) can be formed in a single-layered structure of any one material selected among molybdenum (Mo), aluminum (Al), chrome (Cr), aurum (Au), titanium (Ti), nickel (Ni), neodymium (Nd), copper (Cu) and their alloys, or a multi-layered structure of materials selected among molybdenum (Mo), aluminum (Al), chrome (Cr), aurum (Au), titanium (Ti), nickel (Ni), neodymium (Nd), copper (Cu) and their alloys, but not limited to these materials.

In addition, the M1 metal layer (M1) is provided in the same layer as the source electrode (SE) and the drain electrode (DE), and the M1 metal layer (M1) can be connected with the gate electrode (GE) via a fifth contact hole (CH5) penetrating through the gate insulating layer (I1) and the insulating interlayer (I2).

The first insulating layer (I3) can be provided on the source electrode (SE), the drain electrode (DE), and the M1 metal layer (M1).

On the first insulating layer (I3), the M2 metal layer (M2), the M3 metal layer (M3), and the M4 metal layer (M4) can be provided thereon. The M2 metal layer (M2) can be provided with a plurality of metal patterns. One of the M2 metal patterns (M2) can be connected with the source electrode (SE) or the drain electrode (DE) via a contact hole penetrating through the first insulating layer (I3). Another of the M2 metal patterns (M2) can be connected with the M1 metal pattern (M1), which is electrically connected with the gate electrode (GE), via a contact hole penetrating through the first insulating layer (I3).

The M2 metal layer (M2) and the M3 metal layer (M3) can be insulated from each other by the use of second insulating layer (I4). The M3 metal layer (M3) can be provided with a plurality of metal patterns. One of the M3 metal patterns (M3) can be connected with the M2 metal pattern (M2), which is electrically connected with the source electrode (SE) or the drain electrode (DE), via a contact hole penetrating through the second insulating layer (I4). Another of the M3 metal patterns (M3) can be connected with the M2 metal pattern (M2), which is electrically connected with the gate electrode (GE), via a contact hole penetrating through the second insulating layer (I4).

The M3 metal layer (M3) and the M4 metal layer (M4) can be insulated from each other by the use of third insulating layer (I5). The M4 metal layer (M4) can be provided with a plurality of metal patterns. One of the M4 metal patterns (M4) can be connected with the M3 metal pattern (M3), which is electrically connected with the source electrode (SE) or the drain electrode (DE), via a contact hole penetrating through the third insulating layer (I5). Another of the M4 metal patterns (M4) can be connected with the M3 metal pattern (M3), which is electrically connected with the gate electrode (GE), via a contact hole penetrating through the third insulating layer (I5).

The fourth insulating layer (I6) can be provided on the M4 metal layer (M4). Each of the first insulating layer (I3), the second insulating layer (I4), the third insulating layer (I5), and the fourth insulating layer (I6) can be formed of an inorganic film, for example, can be formed in a single-layered structure of a silicon oxide film or a silicon nitride film, or a multi-layered structure including above the silicon oxide film and the silicon nitride film.

A first terminal 212 and a second terminal 214 can be provided on the first substrate 111. The first terminal 212 can be connected with the M4 metal pattern (M4), which is electrically connected with the source electrode (SE) or the drain electrode (DE), via a sixth contact hole (CH6) penetrating through the fourth insulating layer (I6). As a result, the first terminal 212 can be electrically connected with the source electrode (SE) or the drain electrode (DE).

The second terminal 214 can be connected with the M4 metal pattern (M4), which is electrically connected with the gate electrode (GE), via a seventh contact hole (CH7) penetrating through the fourth insulating layer (I6). As a result, the second terminal 214 can be electrically connected with the gate electrode (GE).

In FIG. 6, the M2 metal layer (M2), the M3 metal layer (M3), and the M4 metal layer (M4) are provided on the first insulating layer (I3), but not limited to this structure. According to the kind of product, it is possible to totally or partially remove the M2 metal layer (M2), the M3 metal layer (M3), and the M4 metal layer (M4) from the first substrate 111.

The planarization film 210 is provided on the first substrate 111, the first terminal 212, and the second terminal 214, to thereby planarize a step difference therein. The planarization film 210 can be formed of an organic material, for example, acryl resin, epoxy resin, phenolic resin, polyamide resin, polyimide resin, and etc.

The first electrode 220 can be patterned by each sub pixel (SP1, SP2, SP3) on the planarization film 210. One of the first electrode 220 is provided in the first sub pixel (SP1), another of the first electrode 220 is provided in the second sub pixel (SP2), and another of the first electrode 220 is provided in the third sub pixel (SP3).

The first electrode 220 is connected with the source electrode (SE) or the drain electrode (DE) of the driving transistor (T1) provided in the first substrate 111. In detail, the first electrode 220 can be connected with the first terminal 212 via a first contact hole (CH1) penetrating through the planarization film 220. According as the first terminal 212 is electrically connected with the source electrode (SE) or the drain electrode (DE) of the driving transistor (T1), the first terminal 220 can be electrically connected with the source electrode (SE) or the drain electrode (DE) of the driving transistor (T1) via the first terminal 212.

The first electrode 220 can be formed of a metal material with high reflectance, and more particularly, a deposition structure of aluminum and titanium (Ti/Al/Ti), a deposition structure of aluminum and Indium Tin Oxide (ITO/Al/ITO), an Ag alloy, and a deposition structure of Ag alloy and Indium Tin Oxide (ITO/Ag alloy/ITO). Herein, the Ag alloy is an alloy of argentums (Ag), palladium (Pd), and copper (Cu). The first electrode 220 can be an anode electrode.

The first capacitor (C1) is patterned by each sub pixel (SP1, SP2, SP3) on the first electrode 220. One of the first capacitor (C1) is provided in the first sub pixel (SP1), another of the first capacitor (C1) is provided in the second sub pixel (SP2), and another of the first capacitor (C1) is provided in the third sub pixel (SP3).

The first capacitor (C1) includes a first capacitor electrode 312, a second capacitor electrode 314, and a capacitor dielectric film 316.

The first capacitor electrode 312 is patterned by each sub pixel (SP1, SP2, SP3) on the first electrode 220. One of the first capacitor electrode 312 is provided in the first sub pixel (SP1), another of the first capacitor electrode 312 is provided in the second sub pixel (SP2), and another of the first capacitor electrode 312 is provided in the third sub pixel (SP3).

The first capacitor electrode 312 is electrically connected with the first electrode 220 while being disposed on the first electrode 220. As shown in FIG. 5, the first capacitor electrode 312 can be directly provided on the first electrode 220. Thus, the first capacitor electrode 312 can be in direct contact with the first electrode 220.

The first capacitor electrode 312 can be formed of a carbon nanotube. In detail, in order to form the first capacitor electrode 312, as shown in FIG. 7, a catalytic material 313, such as nickel (Ni) or iron (Fe), can be patterned on the first electrode 220. In this situation, the catalytic material 313 can be patterned in the periphery of the first electrode 220. And, a chemical vapor deposition (CVD) process is carried out by the use of gas, such as methane gas or ethylene gas, at a temperature of about 600~700° C. Accordingly, as shown in FIG. 7, a vertical aligned carbon nanotube (VACNT) having a first height (H1) is formed along the periphery of the first electrode 220, in which the catalytic material 313 is patterned in the periphery of the first electrode 220. In this situation, the vertical aligned carbon nanotube (VACNT) has conductivity, whereby the vertical aligned carbon nanotube (VACNT) can be used as the first capacitor electrode 312 of the first capacitor (C1).

Accordingly, the first capacitor electrode 312 having the first height (H1) can be formed along the periphery of the first electrode 220 (e.g., in a hollow rectangular type box shape or a hollow square type box shape). In this situation, the first height (H1) of the first capacitor electrode 312 is about 3.5 μm or more than 3.5 μm, which is relatively higher. According as the first capacitor electrode 312 has the relatively-high first height (H1), it can serve as a barrier.

Also, the first capacitor electrode 312 is patterned by each sub pixel (SP1, SP2, SP3) and is formed along the periphery of the first electrode 220, whereby the two of first capacitor electrodes 312 can be apart from each other between the two sub pixels. According as the two of first capacitor electrodes 312 have the relatively-high first height (H1), a groove portion (trench) whose depth corresponds to the first height (H1) can be formed between the two of first capacitor electrodes 312.

In addition, the first capacitor electrode 312 can be formed along all the peripheries of the first electrode 220 (e.g., first capacitor electrode 312 can extend along the perimeter of the first electrode). For example, the first electrode 220 can be formed in a rectangular shape. In this situation, the first electrode 220 can include a first side, a second side which is opposite to the first side, and third and fourth sides provided to connect the first and second sides with each other. The first capacitor electrode 312 can be formed in all the peripheries of the first, second, third, and fourth sides of the first electrode 220.

The capacitor dielectric film 316 is provided on the first capacitor electrode 312. The capacitor dielectric film 316 is provided between the first capacitor electrode 312 and the second capacitor electrode 314, whereby charges are stored therein.

The capacitor dielectric film 316 can be provided to cover the first capacitor electrode 312. In this situation, the capacitor dielectric film 316 can cover the first capacitor electrodes 312 provided in the neighboring sub pixels. One capacitor dielectric film 316 can cover the first capacitor electrode 312 provided in the first sub pixel (SP1), and the second capacitor electrode 312 provided in the second sub pixel (SP2). As a result, the capacitor dielectric film 316 can cover an end of the first electrode 200 so that it is possible to prevent a current from being concentrated on both ends of the first electrode 220 (e.g., the capacitor can serve multiple purposes, such as store capacitance, block leakage current, and block light mixing between adjacent sub pixels).

The capacitor dielectric film 316 can be formed of an inorganic film, for example, a silicon oxide film or a silicon nitride film.

The second capacitor electrode 314 can be patterned by each sub pixel (SP1, SP2, SP3) on the capacitor dielectric film 314. One of the second capacitor electrode 314 is provided in the first sub pixel (SP1), another of the second capacitor electrode 314 is provided in the second sub pixel (SP2), and another of the second capacitor electrode 314 is provided in the third sub pixel (SP3).

The second capacitor electrode 314 is connected with the gate electrode (GE) of the driving transistor (T1) provided in the first substrate 111. In detail, the second capacitor electrode 314 can be connected with the second terminal 214 via a second contact hole (CH2) penetrating through the capacitor dielectric film 316 and the planarization film 220. Accordingly, as the second terminal 214 is electrically connected with the gate electrode (GE) of the driving transistor (T1), the second capacitor electrode 314 can be electrically connected with the gate electrode (GE) of the driving transistor (T1) via the second terminal 214.

One of the second capacitor electrode 314 is connected with one of the second terminal 214 via one of the second contact hole (CH2). That is, the second capacitor electrode 314 is patterned by each sub pixel (SP1, SP2, SP3), and one of the second contact hole (CH2) is formed by each sub pixel (SP1, SP2, SP3). The second capacitor electrode 314 provided in each sub pixel (SP1, SP2, SP3) can protrude from one side as shown in FIG. 8 so that the second capacitor electrode 314 provided in each sub pixel (SP1, SP2, SP3) can be connected with the second terminal 214 via the second contact hole (CH2).

For example, the first sub pixel (SP1), the second sub pixel (SP2), and the third sub pixel (SP3) can be disposed adjacent to each other in a first direction (X-axis direction). The fourth sub pixel (SP4) can be disposed while being adjacent to the first sub pixel (SP1) in a second direction (Y-axis direction). The fourth sub pixel (SP4), a fifth sub pixel (SP5), and a sixth sub pixel (SP6) can be disposed adjacent to each other in the first direction (X-axis direction).

Between the first sub pixel (SP1) and the fourth sub pixel (SP4), there are the two of the second contact holes (CH2) spaced apart from each other, as shown in FIG. 8. The second capacitor electrode 314 provided in the first sub pixel (SP1) can protrude from one side (e.g., from the lower corner) facing toward the fourth sub pixel (SP4), and can be positioned above one of the second contact hole (CH2). Accordingly, the second capacitor electrode 314 provided in the first sub pixel (SP1) can be connected with one of the second terminal 214 via one of the second contact hole (CH2) in the protruding area. Also, the second capacitor electrode 314 provided in the fourth sub pixel (SP4) can protrude from one side facing toward the first sub pixel (SP1), and can be positioned above another of the second contact hole (CH2). Accordingly, the second capacitor electrode 314 provided in the fourth sub pixel (SP4) can be connected with another of the second terminal 214 via another of the second contact hole (CH2) in the protruding area.

In addition, the second capacitor electrode 314 confronts at least one surface of the first capacitor electrode 312 with the capacitor dielectric film 316 interposed in-between. In detail, the first capacitor electrode 312 includes a lower surface 312a being in contact with the first electrode 220, an upper surface 312b being opposite to the lower surface 312a, and a first lateral surface 312c and a second lateral surface 312d provided to connect the lower surface 312a and the upper surface 312b with each other. The second capacitor electrode 314 can confront the first lateral surface 312c and the second lateral surface 312d of the first capacitor electrode 312. Accordingly, in the first capacitor (C1), charges can be stored between the first lateral surface 312c of the first capacitor electrode 312 and the second capacitor electrode 314, and between the second lateral surface 312d of the first capacitor electrode 312 and the second capacitor electrode 314, at the same time. Furthermore, as shown in FIG. 5, the second capacitor electrode 314 can confront the upper surface 312b of the first capacitor electrode 312.

The second capacitor electrode 314 can be formed of a metal material with high reflectance, for example, aluminum (Al), argentums (Ag), and etc. In the display device 100 according to the first embodiment of the present disclosure, the second capacitor electrode 314 is formed of the metal material with high reflectance, whereby some of light emitted from the organic light emitting layer 230, which advances toward the neighboring sub pixel, can be reflected towards a front direction to the viewer's eyes. Accordingly, the display device 100 according to the first embodiment of the present disclosure is capable of preventing colors from being mixed in the neighboring sub pixels (SP1, SP2, SP3) without using a black matrix (e.g., the first capacitor (C1) can have a wall type structure between adjacent sub pixels to also prevent color mixing and improve luminance).

A bank 225 is provided on the first capacitor (C1) and is configured to cover the first capacitor (C1). The bank 225 defines an emission area (EA) in each sub pixel (SP1, SP2, SP3). That is, an exposed area for exposing the first electrode 220 in each sub pixel (SP1, SP2, SP3), in which the bank 225 is not provided, becomes the emission area (EA), and the remaining area of each sub pixel (SP1, SP2, SP3), in which the bank 225 is provided, becomes a non-emission area (NEA). The bank 225 can be formed of an inorganic insulating film having a relatively small thickness, but not limited to this structure. The bank 225 can be formed of an organic insulating film.

The organic light emitting layer 230 is provided on the first electrode 220 and the bank 225. The organic light emitting layer 230 can be a white light emission layer for emitting white colored light, but not limited to this type.

The organic light emitting layer 230 can be formed of a red light emission layer configured to emit red colored light, a green light emission layer configured to emit green colored light, or a blue light emission layer configured to emit blue colored light. In this situation, the organic light emitting layer 230 can be patterned in the area corresponding to the first electrode 220.

If the organic light emitting layer 230 is the white light emission layer, the organic light emitting layer 230 can be a common layer formed for the sub pixels (SP1, SP2, SP3) in common.

In order to emit the white colored light, the organic light emitting layer 230 can include a plurality of stacks for emitting different colored lights. Each stack can include a hole transporting layer, at least one light emitting layer, and an electron transporting layer.

Also, a charge generation layer can be provided between each of the stacks. The charge generation layer can include an n-type charge generation layer positioned adjacent to a lower stack, and a p-type charge generation layer provided on the n-type charge generation layer and positioned adjacent to an upper stack. The n-type charge generation layer injects an electron into the lower stack, and the p-type charge generation layer injects a hole into the upper stack. The n-type charge generation layer can be formed of an organic layer doped with alkali metal, such as Li, Na, K or Cs, or an organic layer doped with alkali earth metal, such as Mg, Sr, Ba or Ra. The p-type charge generation layer can be formed of an organic material having a hole transporting capacity doped with dopant.

The organic light emitting layer 230 can be formed by a deposition process or solution process. If the organic light emitting layer 230 is formed by the deposition process, an evaporation method can be used. If a film is formed by the evaporation method, the film has inferior step coverage. Thus, according as the organic light emitting layer 230 has inferior step coverage, a thickness of the organic light emitting layer 230 is not constant in the area having the step difference caused by the first capacitor (C1).

A thickness of the organic light emitting layer on the first capacitor (C1) can be smaller than a thickness of the organic light emitting layer on the first electrode 220. In more detail, the organic light emitting layer 230 can be provided on upper and lateral surfaces of the first capacitor (C1). As the first capacitor electrode 312 has the first height (H1), the first capacitor (C1) can have a height which is greater than the first height (H1) on the first electrode. Accordingly, when the organic light emitting layer 230 is provided on the first electrode 220 and the first capacitor (C1), the thickness of the organic light emitting layer 230 is not constant due to the step difference between the first electrode 220 and the first capacitor (C1). The thickness of the organic light emitting layer 230 on the upper and lateral surfaces of the first capacitor (C1) can be relatively smaller. Especially, the thickness of the organic light emitting layer 230 on the lateral surface of the first capacitor (C1) can be relatively smaller. As the height of the first capacitor (C1) is increased, the organic light emitting layer 230 can be disconnectedly provided in the lateral surface of the first capacitor (C1).

In the first embodiment of the present disclosure, the groove portion (trench) can be formed by the first capacitor (C1) provided in each of the neighboring sub pixels (SP). Thus, in comparison to a situation without the groove portion, a length of a current leakage path via the organic light emitting layer 230 between the neighboring sub pixels (SP) is increased relatively. Also, in the first embodiment of the present disclosure, the thickness of the organic light emitting layer on the first capacitor (C1) is relatively smaller than the thickness of the organic light emitting layer on the first electrode 220 so that it is possible to increase a resistance of the organic light emitting layer 230. Furthermore, in the first embodiment of the present disclosure, according as the first capacitor (C1) is increased in its height, the organic light emitting layer 230 can be disconnectedly provided in the lateral surface of the first capacitor (C1). In this situation, between the neighboring sub pixels (SP), a current may not flow in the organic light emitting layer 230. Thus, it is possible to minimize an influence on the neighboring sub pixels (SP) by a leakage current via the organic light emitting layer 230. Accordingly, the first capacitor (C1) can also block leakage current between adjacent sub pixels.

The second electrode 240 is provided on the organic light emitting layer 230. The second electrode 240 can be a common layer formed for the sub pixels (SP1, SP2, SP3) in common.

The second electrode 240 can be formed of a transparent metal material (TCO, transparent conductive material), such as Indium Tin Oxide (ITO) or Indium Zinc Oxide (IZO), or a semi-transmissive metal material (semi-transmissive conductive material), such as magnesium (Mg), argentums (Ag) or alloy of magnesium (Mg) and argentums (Ag). The second electrode 240 can be a cathode electrode.

The encapsulation film 250 is provided on the second electrode 240 and is configured to cover the second electrode 240. The encapsulation film 250 prevents oxygen or moisture from being permeated into the second electrode 240. To this end, the encapsulation film 250 can include at least one inorganic film.

In detail, the encapsulation film 250 can include a first inorganic film. According to one embodiment of the present disclosure, the encapsulation film 250 can further include at least one of an organic film and a second inorganic film.

The first inorganic film is provided to cover the second electrode 240. The organic film is provided on the first inorganic film. Preferably, the organic film has a length which is sufficient to prevent particles from being permeated into the organic light emitting layer 230 and the second electrode 240 through the first inorganic film. The second inorganic film is provided to cover the organic film.

Each of the first inorganic film and the second inorganic film can be formed in a single-layered structure of silicon nitride, aluminum nitride, zirconium nitride, titanium nitride, hafnium nitride, tantalum nitride, silicon oxide, aluminum oxide, titanium oxide or their alloys, or can be formed in a multi-layered structure of materials selected among silicon nitride, aluminum nitride, zirconium nitride, titanium nitride, hafnium nitride, tantalum nitride, silicon oxide, aluminum oxide, titanium oxide and their alloys. The first and second inorganic films can be deposited by a chemical vapor deposition (CVD) method or an atomic layer deposition (ALD) method, but not limited to these methods.

The organic film can be formed of acryl resin, epoxy resin, phenolic resin, polyamide resin, or polyimide resin. The organic film can be obtained by a vapor deposition method, a printing method, or a slit coating method, but not limited to these methods. The organic film can be obtained by an ink-jet method.

The color filter layer 260 is provided on the encapsulation film 250. The color filter layer 260 includes a first color filter (CF1), a second color filter (CF2), and a third color filter (CF3) which are provided for the respective sub pixels (SP1, SP2, SP3). The first color filter (CF1) can be a red color filter for transmitting red colored light therethrough, the second color filter (CF2) can be a green color filter for transmitting green colored light therethrough, and the third color filter (CF3) can be a blue color filter for transmitting blue colored light therethrough.

The display device 100 according to the first embodiment of the present disclosure is characterized in that the first capacitor (C1) is provided on the first electrode 220. In this situation, the first capacitor (C1) corresponding to the vertical aligned carbon nanotube (VACNT) can form the first capacitor electrode 312. The first capacitor electrode 312 having the first height (H1) in the vertical direction is formed along the periphery of the first electrode 220 so that it is possible to increase a total area of the first capacitor electrode 312. Accordingly, the first capacitor (C1) according to the first embodiment of the present disclosure can have a capacitance of 60 fF or more than 60 fF even in the situation of a high resolution.

For example, it is assumed that a capacitance of capacitor is 6.25 fF when the first capacitor electrode 312 has a width of 180 nm, a height of 3.5 μm, and a length of 1.0 μm. One of the first electrode 220 can be formed to be 1.2 μm in a first direction (X-axis direction), and 4.5 μm in a second direction (Y-axis direction). A width in one of the first capacitor electrode 312 can be 180 nm, and a height in one of the first capacitor electrode 312 can be 3.5 μm. In this situation, one of the first capacitor electrode 312 is formed along the periphery of the first electrode 220, whereby a length becomes 11.4 μm. Accordingly, a capacitance of one capacitor becomes 71.25 fF.

Furthermore, in the situation of a related art capacitor electrode formed horizontally, it has limitations regarding an increase of the area due to an arrangement relation between other wirings or electrodes. In addition, the first capacitor electrode 312 according to the first embodiment of the present disclosure is formed vertically so that it is possible to increase a formation area of the capacitor regardless of or without impacting an arrangement relation between other wirings or electrodes. That is, the display device 100 according to the first embodiment of the present disclosure facilitates to increase a capacitance of the first capacitor (C1) in accordance with a resolution (e.g., a bigger capacitor can be formed between sub pixels while minimizing space).

Second Embodiment

Figure 9:
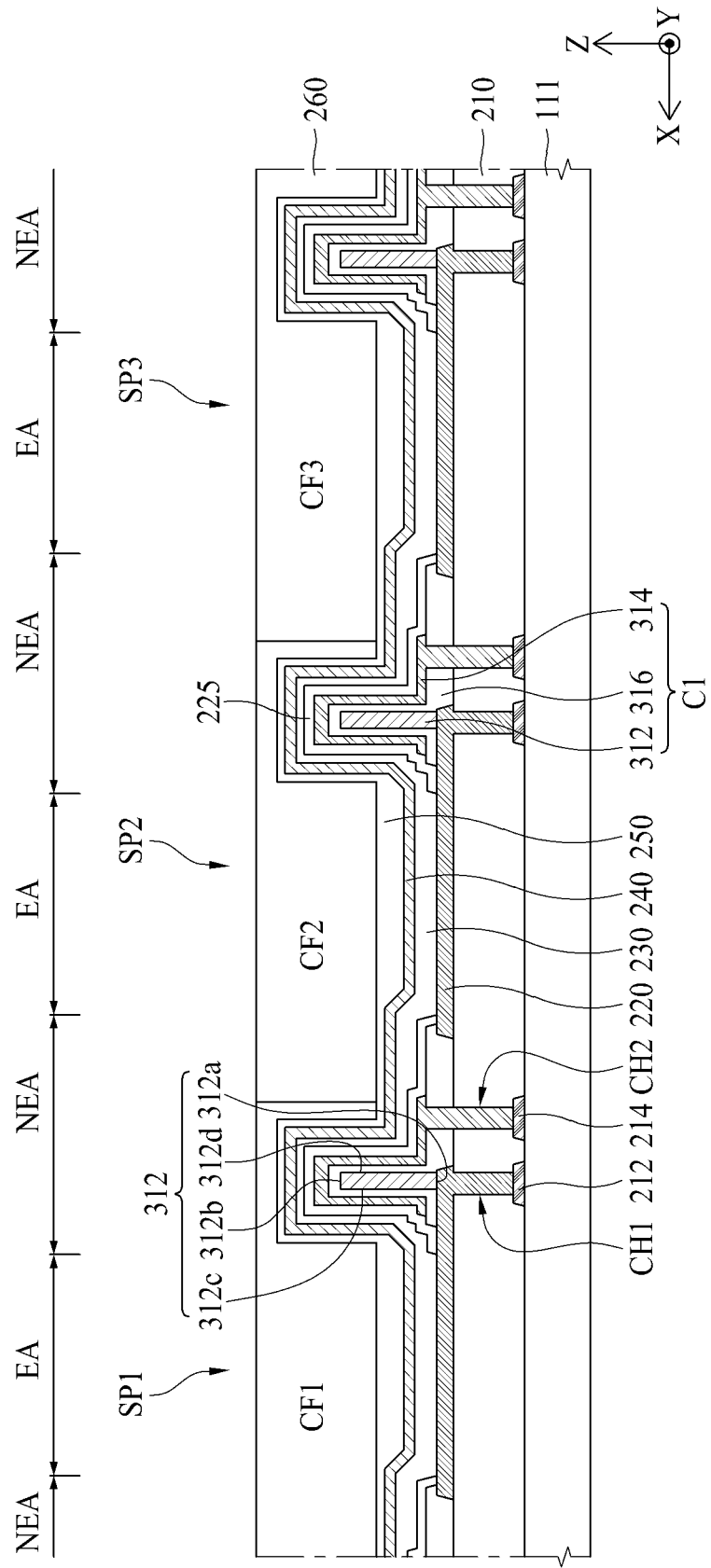
FIG. 9 is a cross sectional view illustrating another embodiment of a display device having a sub pixel shown in FIG. 4.
Figure 10:
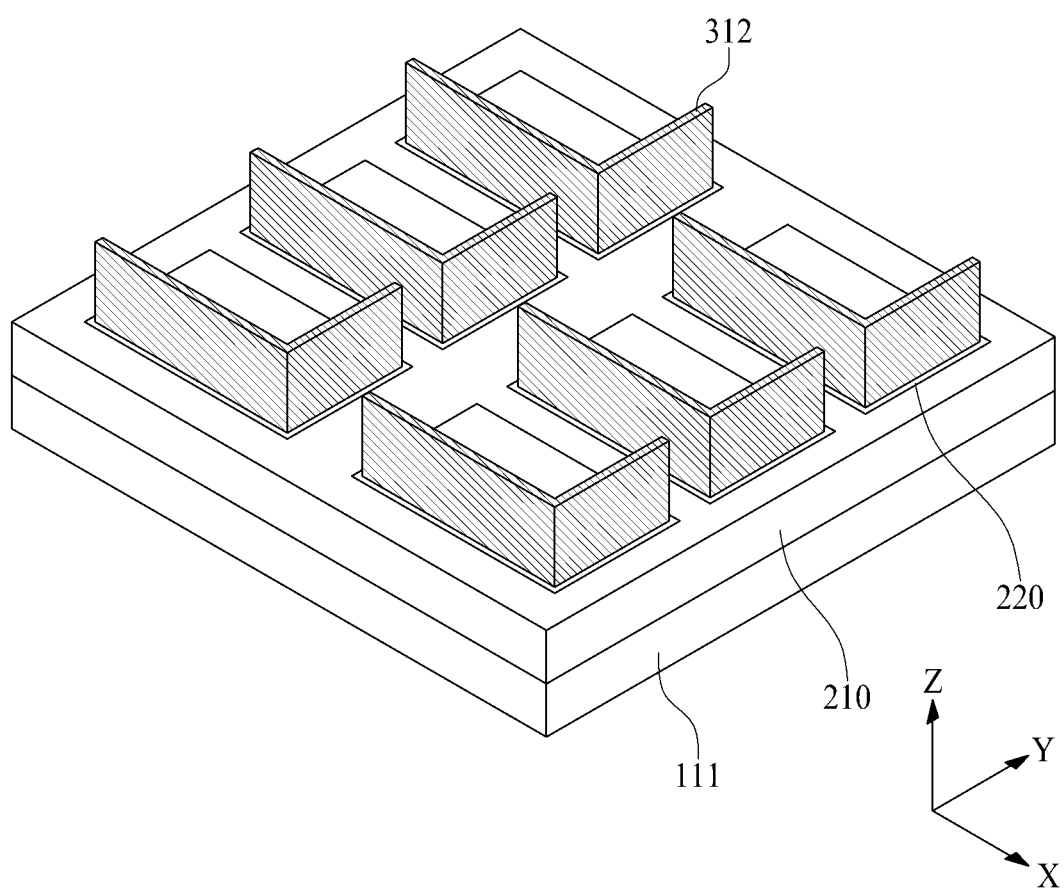
FIG. 10 is a perspective view illustrating one example of a first capacitor electrode shown in FIG. 9 according to an embodiment of the present disclosure.
Figure 11:
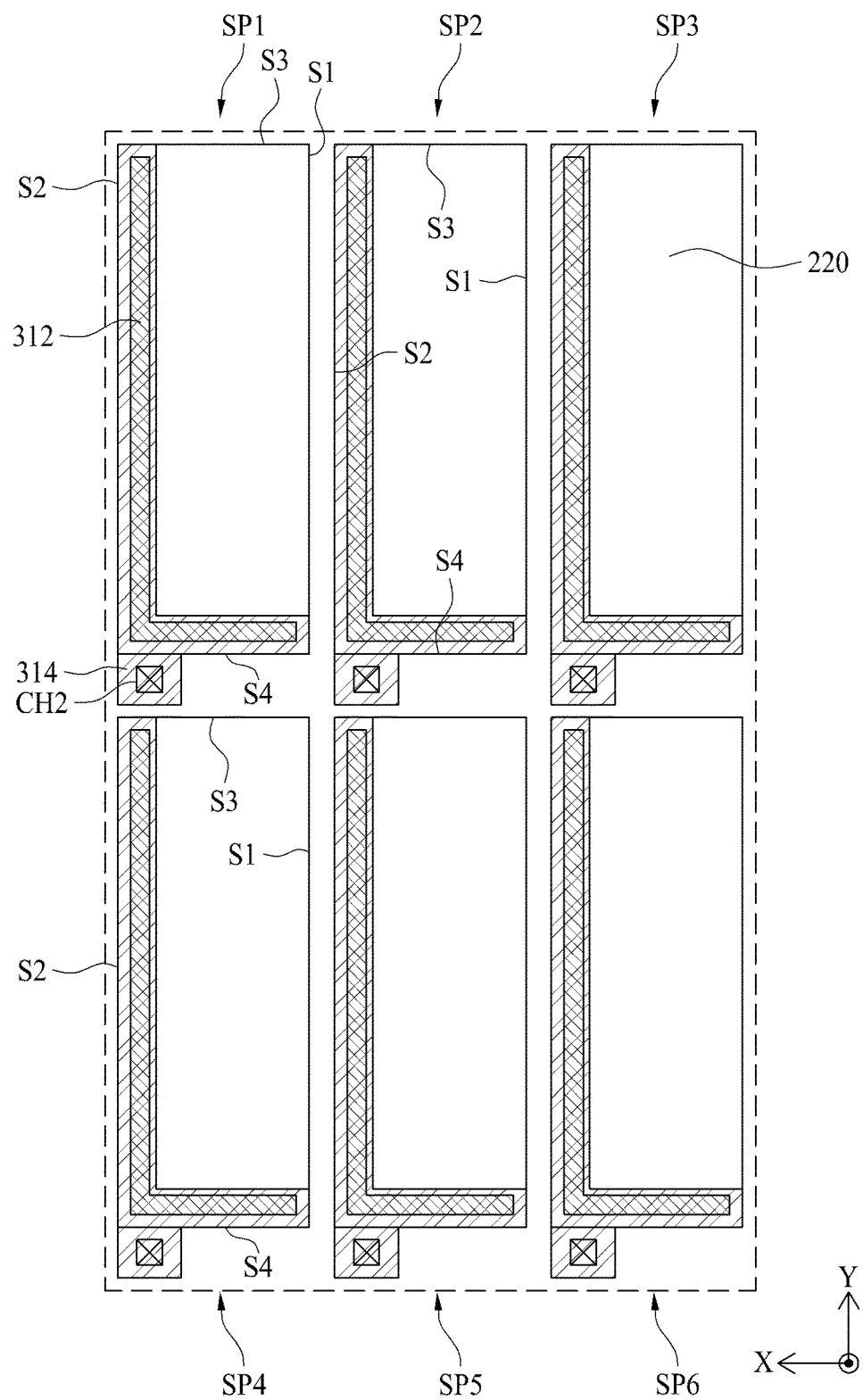
FIG. 11 is a plane view illustrating one example of a first electrode, a first capacitor electrode, and a second capacitor electrode shown in FIG. 9 according to an embodiment of the present disclosure.
Figure 12:
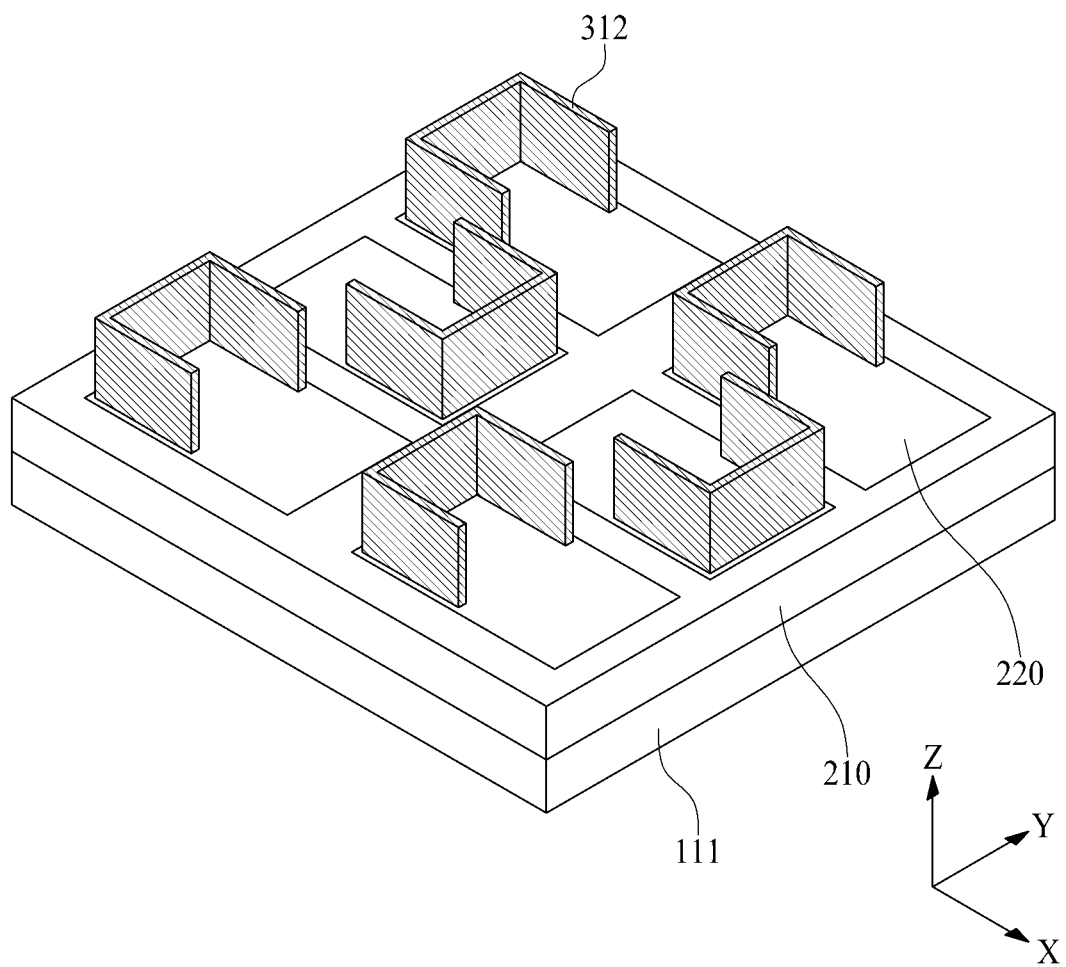
FIG. 12 is a perspective view illustrating another example of a first capacitor electrode shown in FIG. 9 according to an embodiment of the present disclosure.
Figure 13:
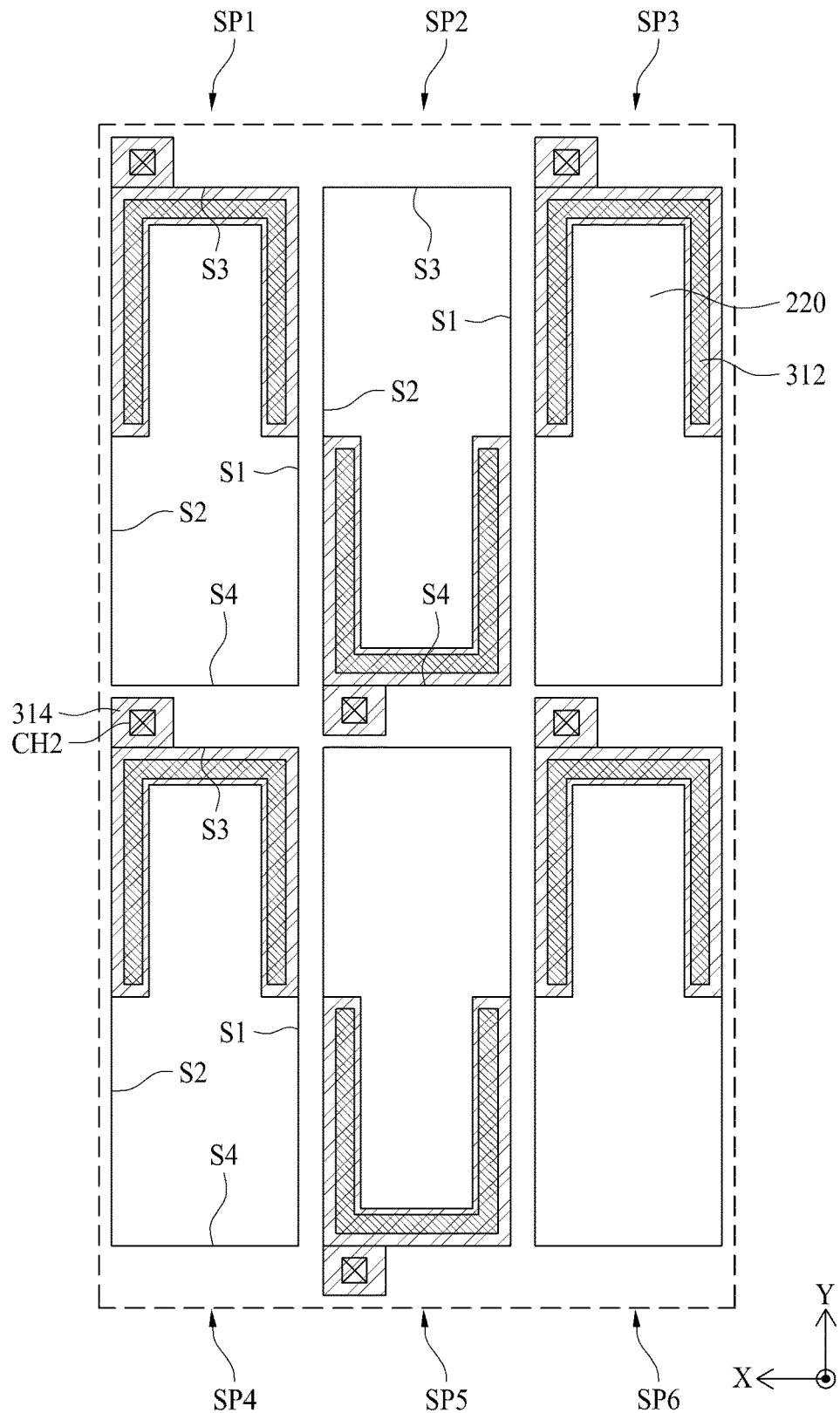
FIG. 13 is a plane view illustrating another example of a first electrode, a first capacitor electrode, and a second capacitor electrode shown in FIG. 9 according to an embodiment of the present disclosure.
Figure 14:
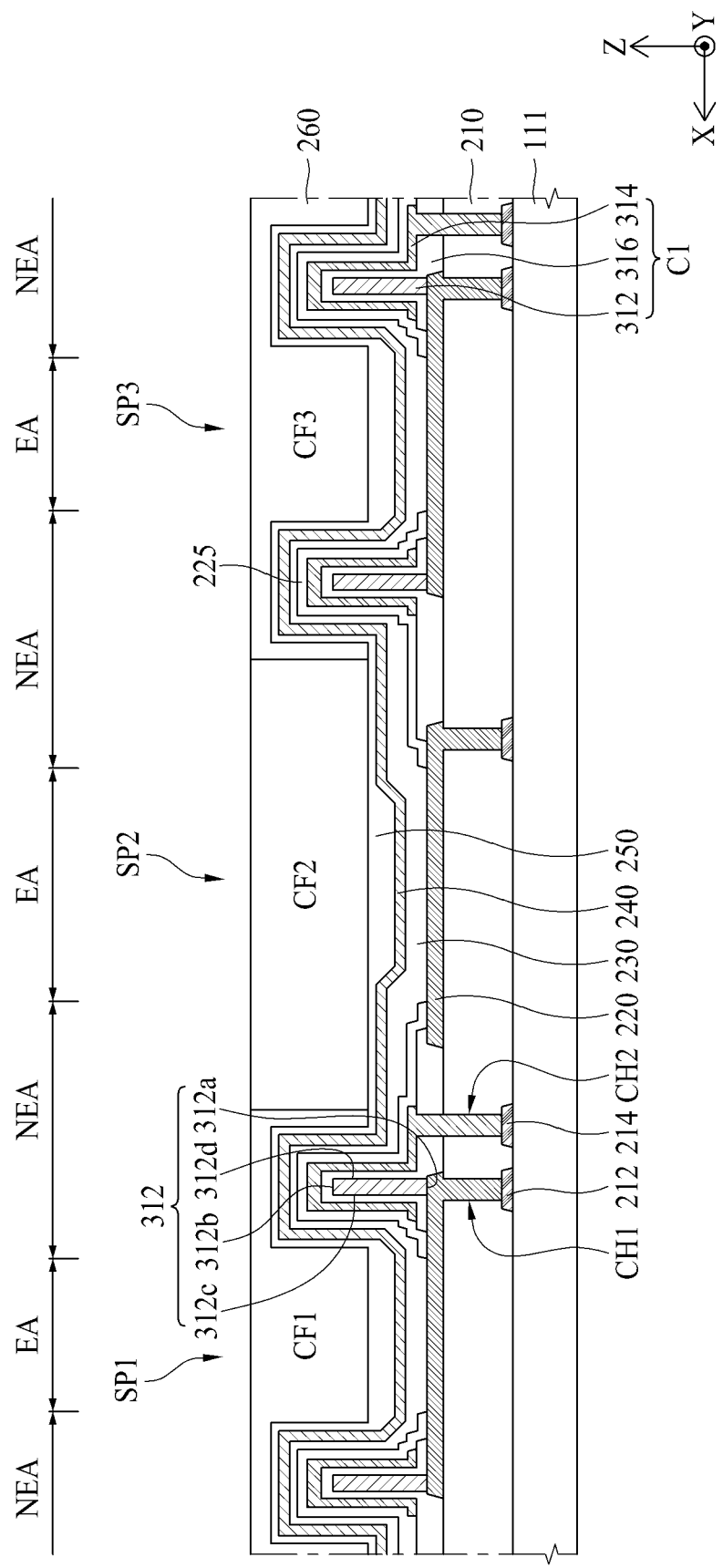
FIG. 14 is a cross sectional view illustrating a modified embodiment of FIG. 9.
Figure 15:
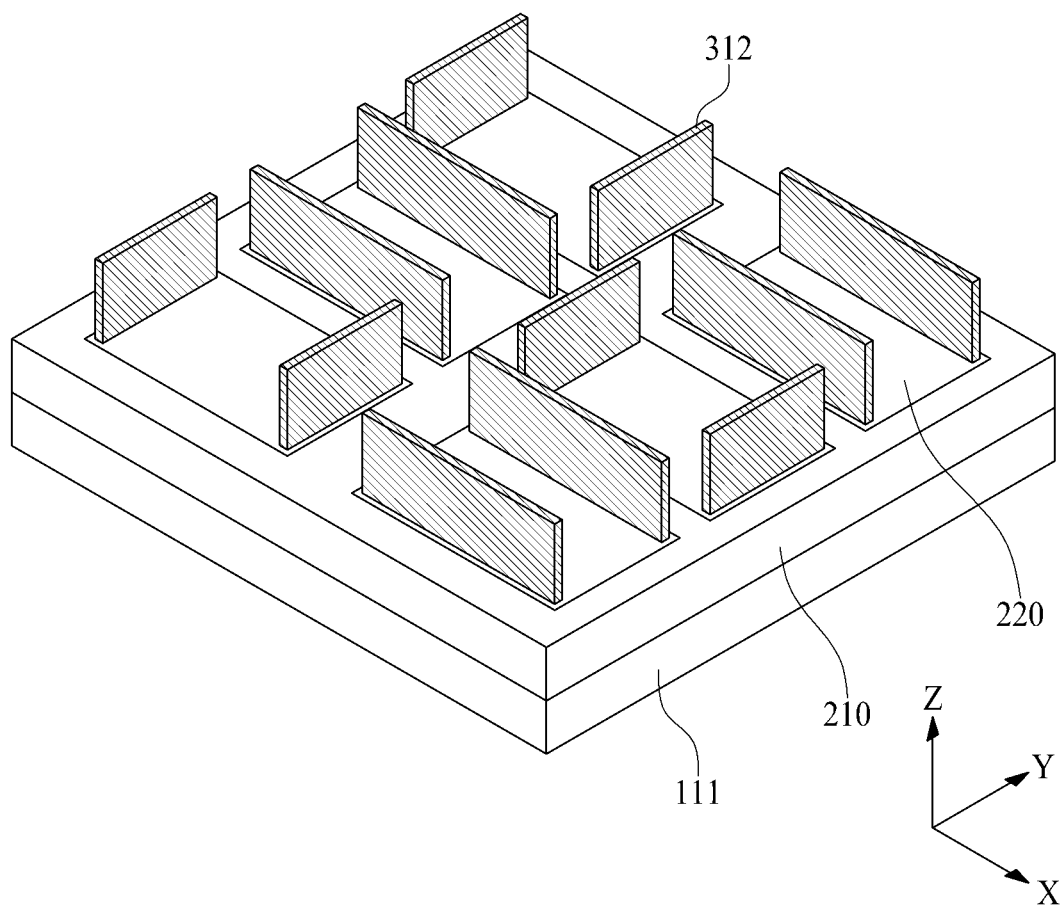
FIG. 15 is a perspective view illustrating one example of a first capacitor electrode shown in FIG. 14 according to an embodiment of the present disclosure.
Figure 16:
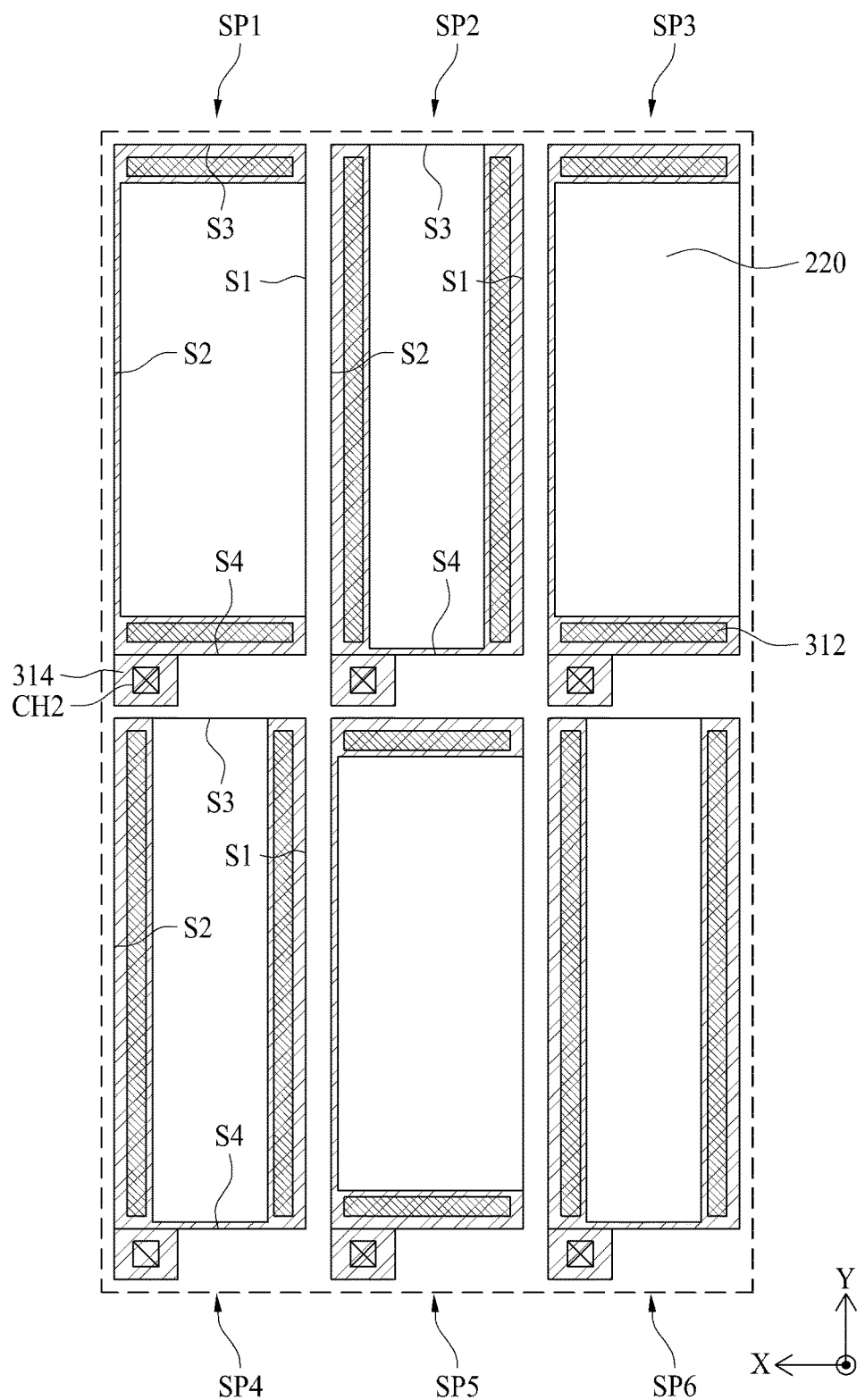
FIG. 16 is a plane view illustrating one example of a first electrode, a first capacitor electrode, and a second capacitor electrode shown in FIG. 14 according to an embodiment of the present disclosure.

FIG. 9 is a cross sectional view illustrating a second embodiment of a display device having a sub pixel shown in FIG. 4. FIG. 10 is a perspective view illustrating one example of a first capacitor electrode shown in FIG. 9. FIG. 11 is a plane view illustrating one example of a first electrode, a first capacitor electrode, and a second capacitor electrode shown in FIG. 9. FIG. 12 is a perspective view illustrating another example of a first capacitor electrode shown in FIG. 9. FIG. 13 is a plane view illustrating another example of a first electrode, a first capacitor electrode, and a second capacitor electrode shown in FIG. 9. FIG. 14 is a cross sectional view illustrating a modified embodiment of FIG. 9. FIG. 15 is a perspective view illustrating one example of a first capacitor electrode shown in FIG. 14. FIG. 16 is a plane view illustrating one example of a first electrode, a first capacitor electrode, and a second capacitor electrode shown in FIG. 14.

Referring to FIGS. 9 to 16, the display device 100 according to the second embodiment of the present disclosure includes a planarization film 210, a first electrode 220, an organic light emitting layer 230, a second electrode 240, an encapsulation film 250, a color filter layer 260, a first capacitor (C1), and a bank 225, which are provided on a first substrate 111.

The first substrate 111, the planarization layer 210, the first electrode 220, the organic light emitting layer 230, the second electrode 240, the encapsulation film 250, the color filter layer 260 and the bank 225 included in the display device 100 according to the second embodiment of the present disclosure are identical in structure to those of the display device 100 according to the first embodiment of the present disclosure shown in FIGS. 5 to 8, whereby a detailed description for the first substrate 111, the planarization layer 210, the first electrode 220, the organic light emitting layer 230, the second electrode 240, the encapsulation film 250, the color filter layer 260 and the bank 225 included in the display device 100 according to the second embodiment of the present disclosure will be omitted.

In situation of the display device 100 according to the second embodiment of the present disclosure, the first capacitor (C1) is provided in some portions of a peripheral area of the first substrate 220 while being disposed on the first substrate 220. In this respect, the display device 100 according to the second embodiment of the present disclosure is different from the display device 100 according to the first embodiment of the present disclosure. Hereinafter, the structural difference between the display device 100 according to the second embodiment of the present disclosure and the display device 100 according to the first embodiment of the present disclosure will be described mainly.

The first capacitor (C1) is patterned by each sub pixel (SP1, SP2, SP3) on the first electrode 220. One of the first capacitor (C1) is provided in the first sub pixel (SP1), another of the first capacitor (C1) is provided in the second sub pixel (SP2), and another of the capacitor (C1) is provided in the third sub pixel (SP3).

The first capacitor (C1) includes a first capacitor electrode 312, a second capacitor electrode 314, and a capacitor dielectric film 316.

The first capacitor electrode 312 is patterned by each sub pixel (SP1, SP2, SP3) on the first electrode 220. One of the first capacitor electrode 312 is provided in the first sub pixel (SP1), another of the first capacitor electrode 312 is provided in the second sub pixel (SP2), and another of the first capacitor electrode 312 is provided in the third sub pixel (SP3).

The first capacitor electrode 312 is electrically connected with the first electrode 220 while being disposed on the first electrode 220. As shown in FIG. 9, the first capacitor electrode 312 can be directly provided on the first electrode 220. Thus, the first capacitor electrode 312 can be in direct contact with the first electrode 220.

The first capacitor electrode 312 can be formed of a carbon nanotube. In detail, in order to form the first capacitor electrode 312, a catalytic material, such as nickel (Ni) or iron (Fe), can be patterned on the first electrode 220. In this situation, the catalytic material 313 can be patterned in the periphery of the first electrode 220. And, a chemical vapor deposition (CVD) process is carried out by the use of gas such as methane gas or ethylene gas at a temperature of about 600~700° C. Accordingly, a vertical aligned carbon nanotube (VACNT) having a first height (H1) is formed in some areas of the periphery of the first electrode 220 patterned with the catalytic material. In this situation, the vertical aligned carbon nanotube (VACNT) has conductivity, whereby the vertical aligned carbon nanotube (VACNT) can be used as the first capacitor electrode 312 of the first capacitor (C1).

Accordingly, the first capacitor electrode 312 having the first height (H1) can be formed along some portions of the periphery of the first electrode 220. In this situation, the first height (H1) of the first capacitor electrode 312 is about 3.5 μm or more than 3.5 μm, which is relatively higher. According as the first capacitor electrode 312 has the relatively-high first height (H1), it can serve as a barrier.

In addition, the first capacitor electrode 312 according to the second embodiment of the present disclosure can be formed in some portions of the periphery of the first electrode 220.

The first capacitor electrode 312 can be configured to have the first height in all the peripheries of the first, second, third, and fourth sides (S1, S2, S3, S4) of the first electrode 220 provided in the first sub pixel (SP1). Also, the first capacitor electrode 312 can be configured to have the first height in all the peripheries of the first, second, third, and fourth sides (S1, S2, S3, S4) of the first electrode 220 provided in the second sub pixel (SP2) which is disposed adjacent to the first sub pixel (SP1).

The first side (S1) of the first electrode 220 provided in the first sub pixel (SP1) confronts the second side (S2) of the first electrode 220 provided in the second sub pixel (SP2) under the circumstances that the first side (S1) of the first electrode 220 provided in the first sub pixel (SP1) is spaced apart from the second side (S2) of the first electrode 220 provided in the second sub pixel (SP2). Also, one surface of the first capacitor electrode 312 provided in the peripheral area of the first side (S1) of the first electrode 220 provided in the first sub pixel (SP1) confronts one surface of the first capacitor electrode 312 provided in the peripheral area of the second side (S2) of the first electrode 220 provided in the second sub pixel (SP2). In this situation, a parasitic capacitance may be formed between the two of first capacitor electrodes 312, whereby the first capacitor (C1) may be not driven normally. As an interval between the sub pixels (SP1, SP2, SP3) becomes smaller, the parasitic capacitance may be increased between the first capacitor electrodes 312 disposed in the neighboring sub pixels.

In the display device 100 according to the second embodiment of the present disclosure, the first capacitor electrode 312 is formed only in the some portions (e.g., only along two sides of each sub pixel area, or on alternating halves of the sub pixel areas) of the peripheral area among the first, second, third and fourth sides (S1, S2, S3, S4) of the first electrode 220 so that it is possible to minimize or prevent the parasitic capacitance between the first capacitor electrodes 312 disposed in the neighboring sub pixels (e.g., adjacent capacitors can be spaced farther apart from each other).

In order to minimize or prevent the parasitic capacitance, the first capacitor electrode 312 provided in each of the neighboring two sub pixels can be provided only in any one peripheral area of the two confronting sides of the first electrodes 220 provided in each of the two sub pixels. For example, the first electrode 220 provided in the first sub pixel (SP1) can confront the second side (S2) of the first electrode 220 provided in the second sub pixel (SP2). The first capacitor electrode 312 can be provided in any one peripheral area of the first side (S1) of the first electrode 220 provided in the first sub pixel (SP1) and the second side (S2) of the first electrode 220 provided in the second sub pixel (SP2).

According to one embodiment of the present disclosure, the first capacitor electrode 312 can be provided in the peripheral areas of the two sides, which are not opposite to each other, among the first, second, third and fourth sides (S1, S2, S3, S4) of the first electrode 220, as shown in FIGS. 10 and 11 (e.g., providing an "L" shaped capacitor).

For example, the first electrode 220 can be formed in a rectangular shape. In this situation, the first electrode 220 can include a first side (S1), a second side (S2) which is opposite to the first side (S1), and third and fourth sides (S3, S4) provided to connect the first and second sides (S1, S2) with each other. The first capacitor electrode 312 can be formed only in the second and fourth sides (S2, S4), which are not opposite to each other, in each of the plurality of sub pixels (SP1, SP2, SP3).

The first capacitor electrode 312 is provided in the peripheral area of the second side (S2) of the first electrode 220 provided in the second sub pixel (SP2), however, the first capacitor electrode 312 is not provided in the peripheral area of the first side (S1) of the first electrode 220 provided in the first sub pixel (SP1). Thus, one surface of the first capacitor electrode 312 provided in the peripheral area of the second side (S2) of the first electrode 220 provided in the second sub pixel (SP2) confronts one surface of the first capacitor electrode 312 provided in the peripheral area of the second side (S2) of the first electrode 220 provided in the first sub pixel (SP1). Since an interval between the confronting two of the first capacitor electrodes 312 is large, it is possible to prevent the parasitic capacitance between the two of the first capacitor electrodes 312.

Also, the fourth side (S4) of the first electrode 220 provided in the first sub pixel (SP1) confronts the third side (S3) of the first electrode 220 provided in the fourth sub pixel (SP4) under the circumstances that the fourth side (S4) of the first electrode 220 provided in the first sub pixel (SP1) is spaced apart from the third side (S3) of the first electrode 220 provided in the fourth sub pixel (SP4). The first capacitor electrode 312 is provided in the peripheral area of the fourth side (S4) of the first electrode 220 provided in the first sub pixel (SP1), however, the first capacitor electrode 312 is not provided in the peripheral area of the third side (S3) of the first electrode 220 provided in the fourth sub pixel (SP4). Accordingly, one surface of the first capacitor electrode 312 provided in the peripheral area of the fourth side (S4) of the first electrode 220 provided in the first sub pixel (SP1) confronts one surface of the first capacitor electrode 312 provided in the peripheral area of the fourth side (S4) of the first electrode 220 provided in the fourth sub pixel (SP4). Since an interval between or the space between the confronting two of the first capacitor electrodes 312 is large, it is possible to prevent the parasitic capacitance between the two of the first capacitor electrodes 312.

In addition, if the first capacitor electrode 312 is formed in the peripheral areas of the two sides, which are not opposite to each other, among the first, second, third and fourth sides (S1, S2, S3, S4) of the first electrode 220, as shown in FIGS. 10 and 11, the first capacitor (C1) can be provided in the peripheral areas of the two sides, which are not opposite to each other, among the first, second, third and fourth sides (S1, S2, S3, S4) of the first electrode 220.

According to another embodiment of the present disclosure, the first capacitor electrode 312 is formed in the peripheral areas of the three sides among the first, second, third and fourth sides (S1, S2, S3, S4) of the first electrode 220, as shown in FIGS. 12 and 13 (e.g., a capacitor can be arranged in each sub pixel area such that the capacitors provide alternating "C" shapes).

For example, the first capacitor electrode 312 can be provided only in the peripheral area of the first, second and third sides (S1, S2, S3) in each of the plurality of sub pixels (SP1, SP2, SP3), or can be provided only in the peripheral area of the first, second and fourth sides (S1, S2, S4) in each of the plurality of sub pixels (SP1, SP2, SP3).

In this situation, the first capacitor electrodes 312 provided in the neighboring sub pixels can be disposed while being not confronting each other. For example, the first capacitor electrode 312 can be provided in the peripheral area of the first, second and third sides (S1, S2, S3) of the first electrode 220 in the first sub pixel (SP1). In detail, the first capacitor electrode 312 provided in the first sub pixel (SP1) can be provided along the peripheral area of the third side (S3) of the first electrode 220. The first capacitor electrode 312 provided in the first sub pixel (SP1) can extend from the peripheral area of the third side (S3) of the first electrode 220 to the peripheral area of the first side (S1) of the first electrode 220. Also, the first capacitor electrode 312 provided in the first sub pixel (SP1) can extend from the peripheral area of the third side (S3) of the first electrode 220 to the peripheral area of the second side (S2) of the first electrode 220. In this situation, the first capacitor electrode 312 provided in each of the first and second sides (S1, S2) of the first electrode 220 can be provided only in some portions without being extended to the peripheral area of the fourth side (S4). The first capacitor electrode 312 provided in the first sub pixel (SP1) can be disposed while being not confronting the first capacitor electrode 312 provided in the second sub pixel (SP2).

In the second sub pixel (SP2), the first capacitor electrode 312 can be provided in the peripheral area of the first, second and fourth sides (S1, S2, S4) of the first electrode 220. In detail, the first capacitor electrode 312 provided in the second sub pixel (SP2) can be provided along the peripheral area of the fourth side (S4) of the first electrode 220. The first capacitor electrode 312 provided in the second sub pixel (SP2) can extend from the peripheral area of the fourth side (S4) of the first electrode 220 to the peripheral area of the first side (S1) of the first electrode 220. Also, the first capacitor electrode 312 provided in the second sub pixel (SP2) can extend from the peripheral area of the third side (S3) of the first electrode 220 to the peripheral area of the second side (S2) of the first electrode 220. In this situation, the first capacitor electrode 312 provided in each of the first and second sides (S1, S2) of the first electrode 220 can be provided only in some portions without being extended to the peripheral area of the third side (S3). The first capacitor electrode 312 provided in the second sub pixel (SP2) can be disposed while being not confronting the first capacitor electrode 312 provided in the first sub pixel (SP1).

Accordingly, the parasitic capacitance is not formed between the first capacitor electrode 312 provided in the first sub pixel (SP1) and the first capacitor electrode 312 provided in the second sub pixel (SP2) (e.g., "C" shaped capacitors can be arranged on opposite halves of two adjacent sub pixel areas, in order to space the capacitors far away from each other).

The first capacitor electrode 312 shown in FIGS. 9 to 11 is formed in the peripheral area of the two sides which are not opposite to each other on the first electrode 220.

In another embodiment of the present disclosure, the first capacitor electrode 312 can be provided in the peripheral area of the two non-confronting sides (S3, S4) among the first, second, third and fourth sides (S1, S2, S3, S4) of the first electrode 220, as shown in FIGS. 14 to 16.

For example, the first capacitor electrode 312 can be formed only in the peripheral area of the first and second sides (S1, S2) which are opposite to each other in each of the plurality of sub pixels (SP1, SP2, SP3), or can be formed only in the peripheral area of the third and fourth sides (S3, S4) which are opposite to each other in each of the plurality of sub pixels (SP1, SP2, SP3).

In this situation, the first capacitor electrodes 312 provided in the neighboring sub pixels can be disposed while being not confronting each other (e.g., first capacitor electrode plates that are spaced apart from each other). In more detail, the first capacitor electrode 312 can be provided only in the peripheral area of the third and fourth sides (S3, S4) of the first electrode 220 provided in the first sub pixel (SP1). The first capacitor electrode 312 can be provided only in the peripheral area of the first and second sides (S1, S2) of the first electrode 220 provided in each of the second and fourth sub pixels (SP2, SP4) which are adjacent to the first sub pixel (SP1).

The first capacitor electrode 312 is provided in the peripheral area of the second side (S2) of the first electrode 220 provided in the second sub pixel (SP2), however, the first capacitor electrode 312 is not formed in the peripheral area of the first side (S1) of the first electrode 220 provided in the first sub pixel (SP1). The first capacitor electrode 312 provided in the first sub pixel (SP1) does not confront the first capacitor electrode 312 provided in the peripheral area of the second side (S2) of the first electrode 220 provided in the second sub pixel (SP2). Accordingly, the parasitic capacitance is not formed between the first capacitor electrode 312 provided in the first sub pixel (SP1) and the first capacitor electrode 312 provided in the second sub pixel (SP2) because the capacitors in adjacent sub pixel areas as spaced far apart from each other.

Also, the first capacitor electrode 312 is provided in the peripheral area of the fourth side (S4) of the first electrode 220 provided in the first sub pixel (SP1), however, the first capacitor electrode 312 is not formed in the peripheral area of the third side (S3) of the first electrode 220 provided in the fourth sub pixel (SP4). The first capacitor electrode 312 provided in the first sub pixel (SP1) does not confront the first capacitor electrode 312 provided in the peripheral area of the third side (S3) of the first electrode 220 provided in the fourth sub pixel (SP4). Accordingly, the parasitic capacitance is not formed between the first capacitor electrode 312 provided in the first sub pixel (SP1) and the first capacitor electrode 312 provided in the fourth sub pixel (SP4).

In addition, if the first capacitor electrode 312 is formed in the peripheral areas of the two non-confronting sides (e.g., opposite sides) among the first, second, third and fourth sides (S1, S2, S3, S4) of the first electrode 220, as shown in FIGS. 14 and 16, the first capacitor (C1) can be provided in the peripheral areas of the two non-confronting sides among the first, second, third and fourth sides (S1, S2, S3, S4) of the first electrode 220.

As described above, the first capacitor electrode 312 formed in some peripheral areas of the first, second, third and fourth sides of the first electrode 220 is in contact with the first electrode 220, whereby they can be electrically connected with each other through the first electrode 220 without the direct connection.

The capacitor dielectric film 316 is provided on the first capacitor electrode 312. The capacitor dielectric film 316 is provided between the first capacitor electrode 312 and the second capacitor electrode 314, whereby charges are stored therein.

The capacitor dielectric film 316 can be provided to cover the first capacitor electrode 312. In this situation, the capacitor dielectric film 316 can cover the end of the first electrode 220 provided in the neighboring sub pixels. For example, as shown in FIG. 9, at one end of the capacitor dielectric film 316, the capacitor dielectric film 316 can cover the first capacitor electrode 312 provided in the first sub pixel (SP1). Also, at the other end of the capacitor dielectric film 316, the capacitor dielectric film 316 can cover one end of the first electrode 220 provided in the second sub pixel (SP2). As a result, the capacitor dielectric film 316 can cover the end of the first electrode 200 so that it is possible to prevent a current from being concentrated on both ends of the first electrode 220.

The capacitor dielectric film 316 can be formed of an inorganic film, for example, a silicon oxide film or a silicon nitride film.

The second capacitor electrode 314 can be patterned by each sub pixel (SP1, SP2, SP3) on the capacitor dielectric film 316. One of the second capacitor electrode 314 is provided in the first sub pixel (SP1), another of the second capacitor electrode 314 is provided in the second sub pixel (SP2), and another of the second capacitor electrode 314 is provided in the third sub pixel (SP3).

The second capacitor electrode 314 is connected with the gate electrode (GE) of the driving transistor (T1) provided in the first substrate 111. In detail, the second capacitor electrode 314 can be connected with a second terminal 214 via a second contact hole (CH2) penetrating through the capacitor dielectric film 316 and the planarization film 220. According as the second terminal 214 is electrically connected with the gate electrode (GE) of the driving transistor (T1), the second capacitor electrode 314 can be electrically connected with the gate electrode (GE) of the driving transistor (T1) via the second terminal 214.

One of the second capacitor electrode 314 is connected with one of the second terminal 214 via one of the second contact hole (CH2). That is, the second capacitor electrode 314 is patterned by each sub pixel (SP1, SP2, SP3), and one of the second contact hole (CH2) is formed by each sub pixel (SP1, SP2, SP3). The second capacitor electrode 314 provided in each sub pixel (SP1, SP2, SP3) can protrude from one side as shown in FIG. 8 so that the second capacitor electrode 314 provided in each sub pixel (SP1, SP2, SP3) can be connected with the second terminal 214 via the second contact hole (CH2).

For example, the first sub pixel (SP1), the second sub pixel (SP2), and the third sub pixel (SP3) can be disposed adjacent to each other in a first direction (X-axis direction). The fourth sub pixel (SP4) can be disposed while being adjacent to the first sub pixel (SP1) in a second direction (Y-axis direction). The fourth sub pixel (SP4), a fifth sub pixel (SP5), and a sixth sub pixel (SP6) can be disposed adjacent to each other in the first direction (X-axis direction).

As shown in FIGS. 11, 13 and 16, the second contact hole (CH2) can be provided at one side of each sub pixel. The second capacitor electrode 314 provided in the first sub pixel (SP1) can be protruding from the fourth side (S4) confronting the fourth sub pixel (SP4) on one of the second contact hole (CH2), as shown in FIGS. 11 and 13. Accordingly, the second capacitor electrode 314 provided in the first sub pixel (SP1) can be connected with one of the second terminal 214 through one of the second contact hole (CH2) in the protruding area.

In another way, the second capacitor electrode 314 provided in the first sub pixel (SP1) can be protruding from the third side (S3) on one of the second contact hole (CH2), as shown in FIGS. 11 and 16. Accordingly, the second capacitor electrode 314 provided in the first sub pixel (SP1) can be connected with one of the second terminal 214 through one of the second contact hole (CH2) in the protruding area.

In addition, the second capacitor electrode 314 provided in each sub pixel can be connected with one of the second terminal 214 through one of the second contact hole (CH2), as shown in FIGS. 11, 13 and 16, but not limited to this structure.

As shown in FIGS. 11 and 13, if the first capacitor electrode 312 provided in each sub pixel is formed as one connected pattern, the second capacitor electrode 314 provided in each sub pixel can be formed as one connected pattern. In this situation, the second capacitor electrode 314 provided in each sub pixel can be connected with one of the second terminal 214 through one of the second contact hole (CH2).

As shown in FIG. 16, if the first capacitor electrode 312 provided in each sub pixel is formed of two separate patterns disconnected from each other, the second capacitor electrode 314 provided in each sub pixel can be formed as one connected pattern, or can be formed of two patterns disconnected from each other. For example, in the first sub pixel (SP1), the first capacitor electrode 312 can be formed in each of the third and fourth sides (S3, S4) of the first electrode 220. The second capacitor electrode 314 can be formed on the two disconnected patterns of the first capacitor electrodes 312, and also can be formed in the peripheral area of the second side (S2) of the first electrode 220, as shown in FIG. 16, whereby the disconnected patterns can be connected with each other. As a result, the second capacitor electrode 314 can be formed as one connected pattern. In this situation, the second capacitor electrode 314 can be connected with one of the second terminal 214 through one of the second contact hole (CH2).

In another example, the second capacitor electrode 3134 can be formed only on the two patterns of the first capacitor electrodes 312. In this situation, the second capacitor electrode 314 can be formed of the two disconnected patterns. Each of the two disconnected patterns can be connected with the additional two of the second terminals 214 through the additional two of the second contact holes (CH2).

As described above, the second capacitor electrode 314 confronts at least one surface of the first capacitor electrode 312 with the capacitor dielectric film 316 interposed in-between. In detail, the first capacitor electrode 312 includes a lower surface 312a being in contact with the first electrode 220, an upper surface 312b being opposite to the lower surface 312a, and a first lateral surface 312c and a second lateral surface 312d provided to connect the lower surface 312a and the upper surface 312b with each other. The second capacitor electrode 314 can confront the first lateral surface 312c and the second lateral surface 312d of the first capacitor electrode 312. Accordingly, in the first capacitor (C1), charges can be stored between the first lateral surface 312c of the first capacitor electrode 312 and the second capacitor electrode 314, and between the second lateral surface 312d of the first capacitor electrode 312 and the second capacitor electrode 314, at the same time. Furthermore, as shown in FIG. 9, the second capacitor electrode 314 can confront the upper surface 312b of the first capacitor electrode 312.

The second capacitor electrode 314 can be formed of a metal material with high reflectance, for example, aluminum (Al), argentums (Ag), and etc. In the display device 100 according to the second embodiment of the present disclosure, the second capacitor electrode 314 is formed of the metal material with high reflectance, whereby some of light emitted from the organic light emitting layer 230, which advance toward the neighboring sub pixel, can be reflected to a front direction. Accordingly, the display device 100 according to the second embodiment of the present disclosure is capable of preventing colors from being mixed in the neighboring sub pixels (SP1, SP2, SP3) without using a black matrix.

The display device 100 according to the second embodiment of the present disclosure is characterized in that the first capacitor (C1) is provided on the first electrode 220. In this situation, the first capacitor (C1) corresponding to the vertical aligned carbon nanotube (VACNT) can form the first capacitor electrode 312. The first capacitor electrode 312 having the first height (H1) in the vertical direction is formed along the periphery of the first electrode 220 so that it is possible to increase a total area of the first capacitor electrode 312. Accordingly, the first capacitor (C1) according to the second embodiment of the present disclosure can secure a high capacitance even in the situation of a high resolution.

For example, it is assumed that a capacitance of the first capacitor electrode 312 is 6.25 fF when the first capacitor electrode 312 has a width of 180 nm, a height of 3.5 um, and a length of 1.0 nm. One of the first electrode 220 can be formed to be 1.2 um in the first direction (X-axis direction) and 4.5 um in the second direction (Y-axis direction). One of the first capacitor electrode 312 can be formed to have a width of 180 nm and a height of 3.5 um. In this situation, one of the first capacitor electrode 312 is formed along some portions of the peripheral area of the first electrode 220, whereby its length can be 5.7 um. Accordingly, a capacitance of one capacitor can be 35.63 fF.

Furthermore, in a related art capacitor electrode formed horizontally, it has limitations on the increase of size due to an arrangement relation between other wirings or electrodes. In addition, the first capacitor electrode 312 according to the second embodiment of the present disclosure is formed vertically so that it is possible to increase a formation area regardless of an arrangement relation between other wirings or electrodes. That is, the display device 100 according to the second embodiment of the present disclosure facilitates to increase a capacitance of the first capacitor (C1) in accordance with a resolution.

Also, in the display device 100 according to the second embodiment of the present disclosure, the first capacitors (C1) are provided in such a manner that an interval between the first capacitors (C1) disposed in the neighboring sub pixels, and more particularly, an interval between the first capacitor electrodes 312 is more than a predetermined value. Accordingly, it is possible to minimize or prevent the parasitic capacitance between the first capacitors (C1) disposed in the neighboring sub pixels of the display device 100 according to the second embodiment of the present disclosure.

In addition, the area provided with the first capacitor (C1) becomes a non-emission area (NEA). In the display device 100 according to the second embodiment of the present disclosure, the first capacitor (C1) is formed only in some portions of the peripheral area of the sides of the first electrode 220, instead of the peripheral area in all the sides of the first electrode 220, so that it is possible to minimize the increase in size of the non-emission area (NEA). In comparison to the display device 100 according to the first embodiment of the present disclosure, the display device 100 according to the second embodiment of the present disclosure can have a relatively small size of the non-emission area (NEA). That is, in comparison to the display device 100 according to the first embodiment of the present disclosure, the display device 100 according to the second embodiment of the present disclosure can have a relatively large size of an emission area (EA).

Third Embodiment

Figure 17:
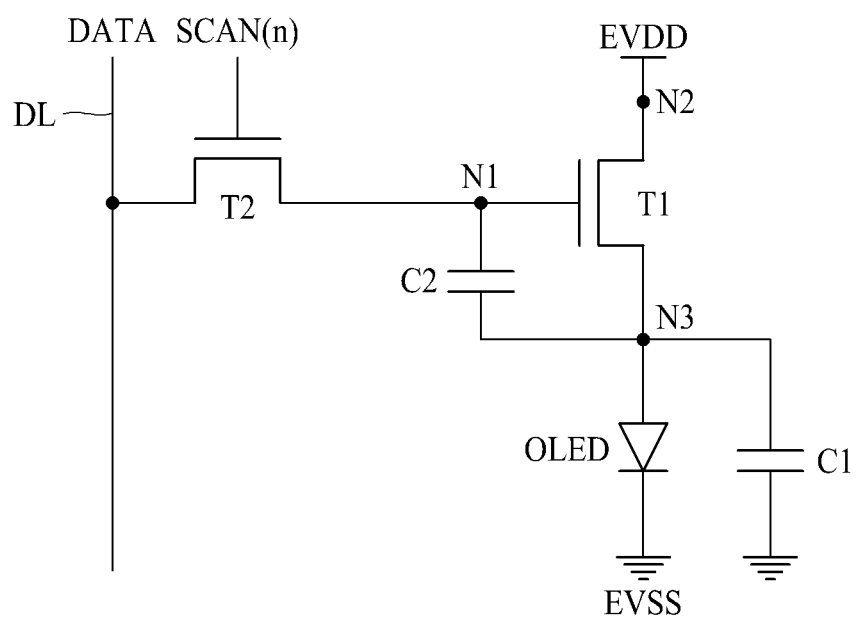
FIG. 17 is a circuit diagram illustrating another example of a sub pixel according to an embodiment of the present disclosure.

FIG. 17 is a circuit diagram illustrating another example of a sub pixel.

Referring to FIG. 17, each sub pixel (SP) can have 2T(Transistor)2C(Capacitor) structure including two transistors (T1, T2) and two capacitors (C1, C2).

In each sub pixel (SP), the first transistor (T1) is connected between a first electrode of an organic light emitting diode (OLED) and a driving voltage line for supplying a driving voltage (EVDD), or between the first electrode of the organic light emitting diode (OLED) and a connection line connected with the driving voltage line. In this situation, the driving voltage (EVDD) is applied to a second node (N2) of the first transistor (T1).

The first transistor (T1) corresponds to a driving transistor for driving the organic light emitting diode (OLED). The first transistor (T1) is controlled by a voltage of the first node (N1), and the first transistor (T1) supplies a current to the organic light emitting diode (OLED). Accordingly, the organic light emitting diode (OLED) is driven.

In each sub pixel (SP), the second transistor (T2) is controlled by a scan signal (SCAN) supplied from a scan line (S1~Sn), and the second transistor (T2) is connected between the first node (N1) of the first transistor (T1) and a data line (DL).

The second transistor (T2) corresponds to a switching transistor. The second transistor (T2) is controlled by the scan signal (SCAN(n)), and the second transistor (T2) supplies a data voltage (Data) supplied from the data line (DL) to the first node (N1) of the first transistor (T1). Accordingly, it is possible to control a turning-on/off state of the first transistor (T1).

In each sub pixel (SP), the second capacitor (C2) is connected between the first node (N1) of the first transistor (T1) and a third node (N3) of the first transistor (T1).

The second capacitor (C2) maintains a potential difference between the first node (N1) of the first transistor (T1) and the third node (N3) of the first transistor (T1) for one frame. The second capacitor (C2) corresponds to a storage capacitor.

In each sub pixel (SP), one end of the first capacitor (C1) is connected with the third node (N3) of the first transistor (T1), and the other end of the first capacitor (C1) is connected with the ground.

Figure 18:
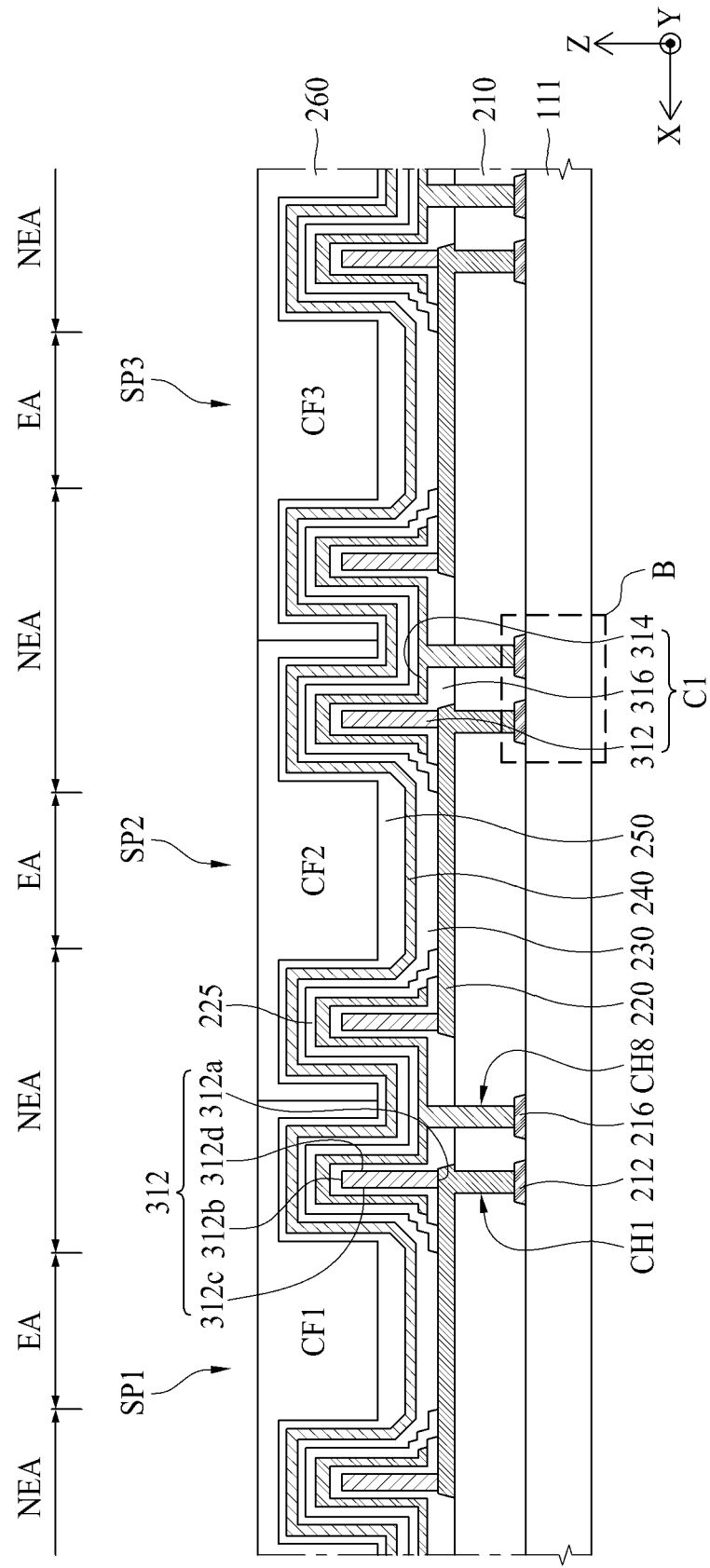
FIG. 18 is a cross sectional view illustrating a another embodiment of a display device having a sub pixel shown in FIG. 17.
Figure 19:
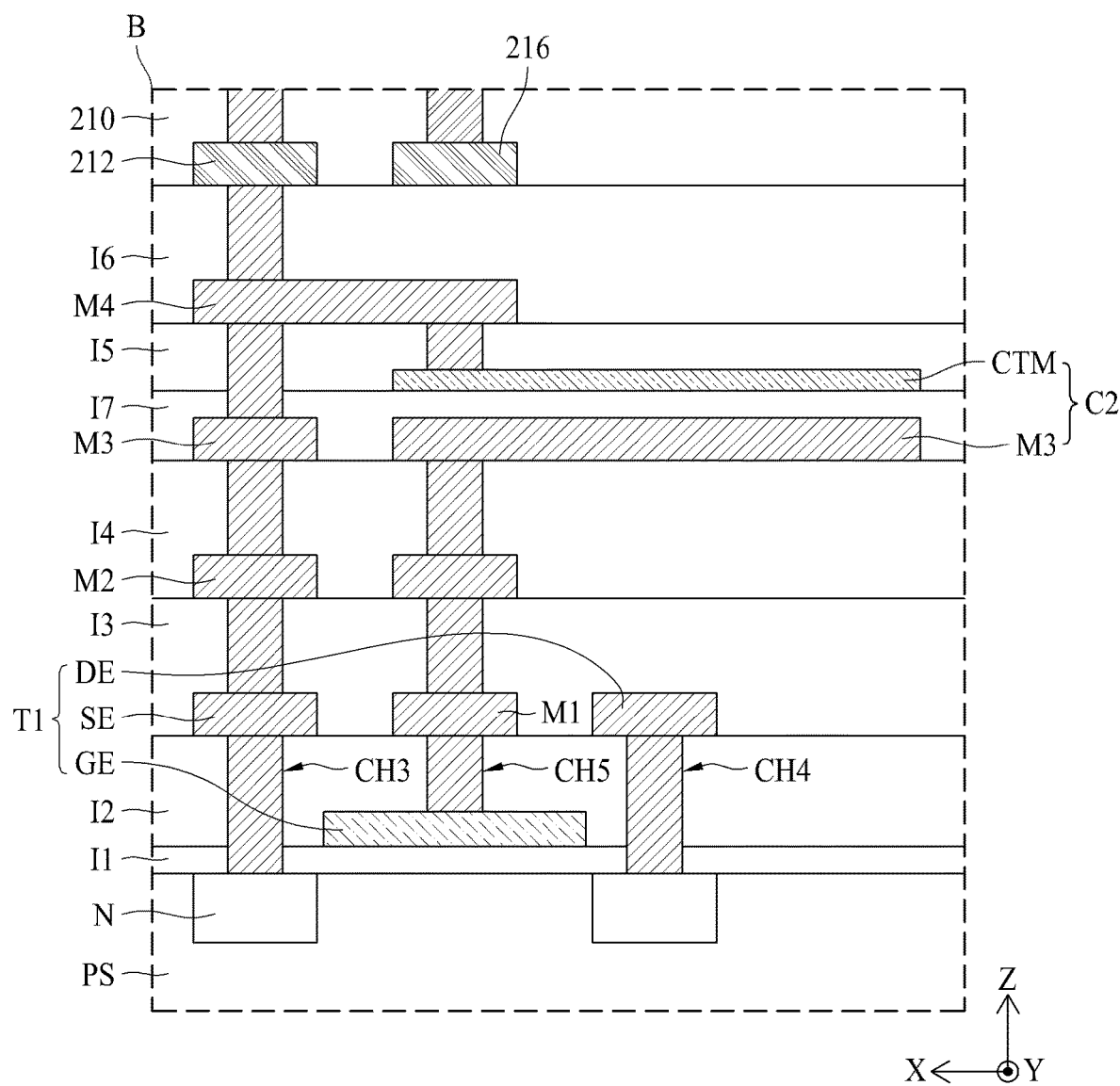
FIG. 19 is an expanded view illustrating one example of "B" area in FIG. 18 according to an embodiment of the present disclosure.
Figure 20:
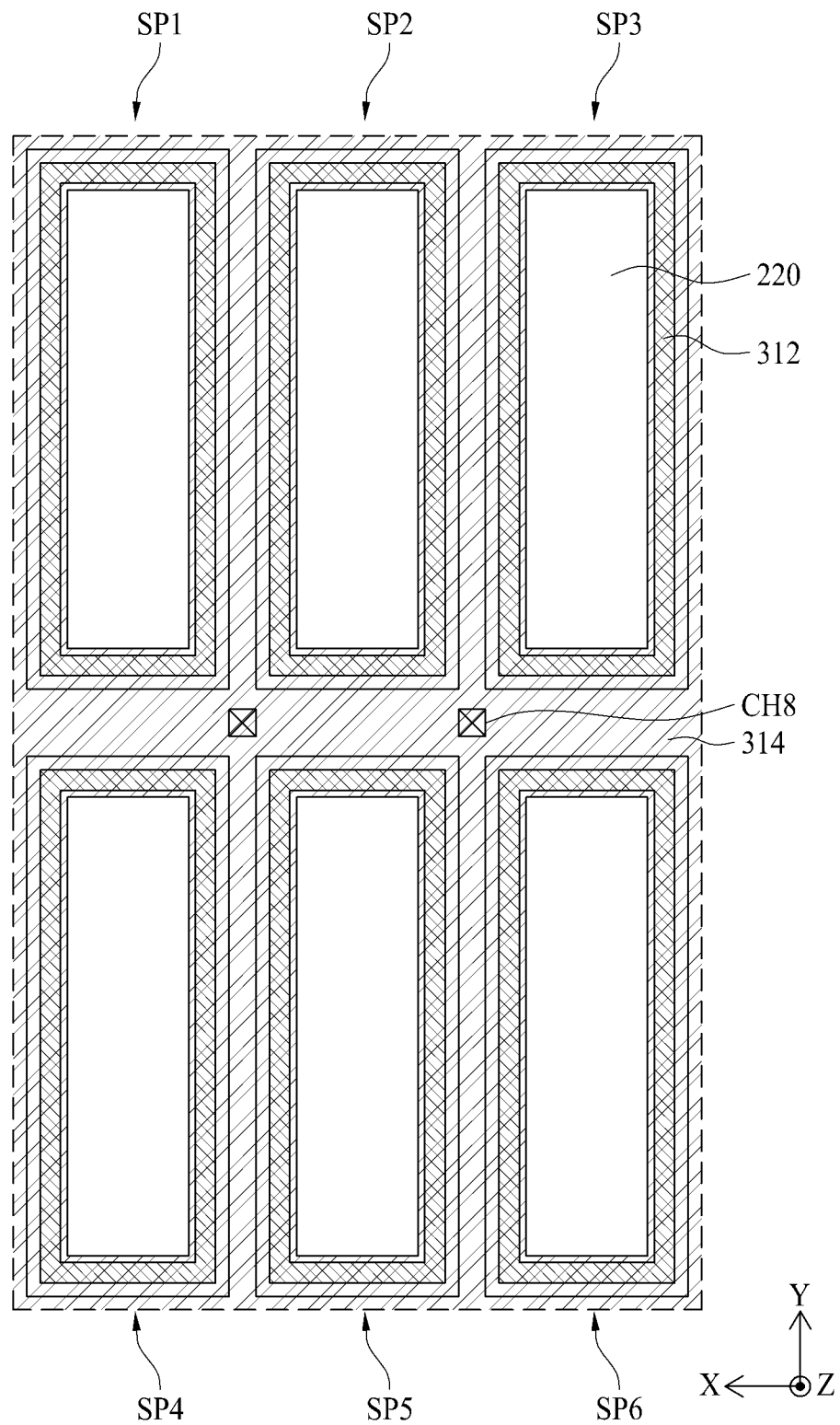
FIG. 20 is a plane view illustrating a first electrode, a first capacitor electrode, and a second capacitor electrode shown in FIG. 18 according to an embodiment of the present disclosure.

FIG. 18 is a cross sectional view illustrating a third embodiment of a display device having a sub pixel shown in FIG. 17. FIG. 19 is an expanded view illustrating one example of "B" area in FIG. 18. FIG. 20 is a plane view illustrating a first electrode, a first capacitor electrode, and a second capacitor electrode shown in FIG. 18.

Referring to FIGS. 18 to 20, the display device 100 according to the third embodiment of the present disclosure includes a planarization film 210, a first electrode 220, an organic light emitting layer 230, a second electrode 240, an encapsulation film 250, a color filter layer 260, a first capacitor (C1), a second capacitor (C2), and a bank 225, which are provided on a first substrate 111.

On the first substrate 111, there are a first sub pixel (SP1) for emitting red (R) colored light, a second sub pixel (SP2) for emitting green (G) colored light, and a third sub pixel (SP3) for emitting blue (B) colored light, but not limited to this structure. In addition, a fourth sub pixel for emitting white (W) colored light can be additionally provided on the first substrate 111. Also, an arrangement order of the sub pixels (SP1, SP2, SP3, SP4) can be changed in various ways.

The first substrate 111 can be formed of glass or plastic, but not limited to these materials. The first substrate 111 can be formed of a semiconductor material, such as silicon wafer. The first substrate 111 can be formed of a transparent material or an opaque material.

The display device 100 according to the third embodiment of the present disclosure can be formed in a top emission type where emitted light advances upwardly, but not limited to this type. If the display device 100 is formed in the top emission type, the first substrate 111 can be formed of an opaque material as well as a transparent material. If the display device 100 is formed in a bottom emission type where emitted light advances downwardly, the first substrate 111 can be formed of a transparent material.

Hereinafter, for convenience of explanation, it is assumed that the display device 100 is formed in the top emission type, and the first substrate 111 is formed of the opaque material, such as silicon wafer, but not necessarily.

If the first substrate 111 is formed of the semiconductor material, such as silicon wafer, the driving transistor (T1) shown in FIG. 19 can be provided on the first substrate 111.

In more detail, the first substrate 111 includes a P-type substrate (PS), N-type doping areas (N), a gate electrode (GE), a source electrode (SE), a drain electrode (DE), a second capacitor (C2), a plurality of metal layers (M1, M2, M3, M4), and a plurality of insulating layers (I1, I2, I3, I4, I5, I6, I7).

On the P-type substrate (PS), there are the N-type areas (N) which are doped with an N-type semiconductor material. And, the gate insulating layer (I1) can be formed on the P-type substrate (PS) with the N-type areas (N). The gate insulating layer (I1) can be formed of an inorganic film, for example, can be formed in a single-layered structure of a silicon oxide film or a silicon nitride film, or a multi-layered structure including above the silicon oxide film and the silicon nitride film.

The gate electrode (GE) can be provided on the gate insulating layer (I1). The gate electrode (GE) can be formed in a single-layered structure or a multi-layered structure of materials selected among molybdenum (Mo), aluminum (Al), chrome (Cr), aurum (Au), titanium (Ti), nickel (Ni), neodymium (Nd), copper (Cu) and their alloys, but not limited to these materials.

The insulating interlayer (I2) can be provided on the gate electrode (GE). The insulating interlayer (I2) can be formed of an inorganic film, for example, can be formed in a single-layered structure of a silicon oxide film or a silicon nitride film, or a multi-layered structure including above the silicon oxide film and the silicon nitride film.

On the insulating interlayer (I2), the source electrode (SE), the drain electrode (DE), and the M1 metal layer (M1) can be provided thereon. The source electrode (SE) can be connected with one of the N-type area (N) via a second contact hole (CH3) penetrating through the gate insulating layer (I1) and the insulating interlayer (I2). The drain electrode (DE) can be connected with another of the N-type area (N) via a third contact hole (CH4) penetrating through the gate insulating layer (I1) and the insulating interlayer (I2).

Each of the source electrode (SE) and the drain electrode (DE) can be formed in a single-layered structure of any one material selected among molybdenum (Mo), aluminum (Al), chrome (Cr), aurum (Au), titanium (Ti), nickel (Ni), neodymium (Nd), copper (Cu) and their alloys, or a multi-layered structure of materials selected among molybdenum (Mo), aluminum (Al), chrome (Cr), aurum (Au), titanium (Ti), nickel (Ni), neodymium (Nd), copper (Cu) and their alloys, but not limited to these materials.

In addition, the M1 metal layer (M1) is formed in the same layer as the source electrode (SE) and the drain electrode (DE), and the M1 metal layer (M1) can be connected with the gate electrode (GE) via a fourth contact hole (CH5) penetrating through the gate insulating layer (I1) and the insulating interlayer (I2).

The first insulating layer (I3) can be provided on the source electrode (SE), the drain electrode (DE), and the M1 metal layer (M1).

On the first insulating layer (I3), the M2 metal layer (M2), the M3 metal layer (M3), the second capacitor (C2), and the M4 metal layer (M4) can be provided thereon. The M2 metal layer (M2) can be provided with a plurality of metal patterns. One of the M2 metal patterns (M2) can be connected with the source electrode (SE) or the drain electrode (DE) via a contact hole penetrating through the first insulating layer (I3). Another of the M2 metal patterns (M2) can be connected with the M1 metal pattern (M1), which is electrically connected with the gate electrode (GE), via a contact hole penetrating through the first insulating layer (I3).

The M2 metal layer (M2) and the M3 metal layer (M3) can be insulated from each other by the use of second insulating layer (I4). The M3 metal layer (M3) can be provided with a plurality of metal patterns. One of the M3 metal patterns (M3) can be connected with the M2 metal pattern (M2), which is electrically connected with the source electrode (SE) or the drain electrode (DE), via a contact hole penetrating through the second insulating layer (I4). Another of the M3 metal patterns (M3) can be connected with the M2 metal pattern (M2), which is electrically connected with the gate electrode (GE), via a contact hole penetrating through the second insulating layer (I4).

The M3 metal layer (M3) and CTM metal layer (CTM) can be insulated from each other by the use of fifth insulating layer (I7). The CTM metal layer (CTM) can confront the M3 metal pattern (M3) electrically connected with the gate electrode (GE). In this situation, the CTM metal layer (CTM), the M3 metal pattern (M3) electrically connected with the gate electrode (GE), and the fifth insulating layer (I7) constitute the second capacitor (C2).

The CTM metal layer (CTM) and the M4 metal layer (M4) can be insulated from each other by the use of third insulating layer (I5). The M4 metal layer (M4) can be connected with the CTM metal layer (CTM) via a contact hole penetrating through the third insulating layer (I5). Also, the M4 metal layer (M4) can be connected with the M3 metal pattern (M3), which is electrically connected with the source electrode (SE) or the drain electrode (DE), via a contact hole penetrating through the third insulating layer (I5) and the fifth insulating layer (I7).

The fourth insulating layer (I6) can be provided on the M4 metal layer (M4). Each of the first insulating layer (I3), the second insulating layer (I4), the third insulating layer (I5), and the fourth insulating layer (I6) can be formed of an inorganic film, for example, can be formed in a single-layered structure of a silicon oxide film or a silicon nitride film, or a multi-layered structure including above the silicon oxide film and the silicon nitride film.

A first terminal 212 and a third terminal 216 can be provided on the first substrate 111. The first terminal 212 can be connected with the M4 metal pattern (M4), which is electrically connected with the source electrode (SE) or the drain electrode (DE), via a fifth contact hole (CH6) penetrating through the fourth insulating layer (I6). As a result, the first terminal 212 can be electrically connected with the source electrode (SE) or the drain electrode (DE). In addition, the third terminal 216 can be connected with the ground.

In FIG. 19, the M2 metal layer (M2), the M3 metal layer (M3), and the M4 metal layer (M4) are provided on the first insulating layer (I3), but not limited to this structure. According to the kind of product, it is possible to totally or partially remove the M2 metal layer (M2), the M3 metal layer (M3), and the M4 metal layer (M4) from the first substrate 111.

The planarization film 210 is provided on the first substrate 111, the first terminal 212, and the second terminal 214, to thereby planarize a step difference therein. The planarization film 210 can be formed of an organic film, for example, acryl resin, epoxy resin, phenolic resin, polyamide resin, polyimide resin, and etc.

The first electrode 220 can be patterned by each sub pixel (SP1, SP2, SP3) on the planarization film 210. One of the first electrode 220 is provided in the first sub pixel (SP1), another of the first electrode 220 is provided in the second sub pixel (SP2), and another of the first electrode 220 is provided in the third sub pixel (SP3).

The first electrode 220 is connected with the source electrode (SE) or the drain electrode (DE) of the driving transistor (T1) provided in the first substrate 111. In detail, the first electrode 220 can be connected with the first terminal 212 via a first contact hole (CH1) penetrating through the planarization film 220. According as the first terminal 212 is electrically connected with the source electrode (SE) or the drain electrode (DE) of the driving transistor (T1), the first terminal 220 can be electrically connected with the source electrode (SE) or the drain electrode (DE) of the driving transistor (T1) via the first terminal 212.

The first electrode 220 can be formed of a metal material with high reflectance, and more particularly, a deposition structure of aluminum and titanium (Ti/Al/Ti), a deposition structure of aluminum and Indium Tin Oxide (ITO/Al/ITO), an Ag alloy, and a deposition structure of Ag alloy and Indium Tin Oxide (ITO/Ag alloy/ITO). Herein, the Ag alloy is an alloy of argentums (Ag), palladium (Pd), and copper (Cu). The first electrode 220 can be an anode electrode.

The first capacitor (C1) is patterned by each sub pixel (SP1, SP2, SP3) on the first electrode 220. One of the first capacitor (C1) is provided in the first sub pixel (SP1), another of the first capacitor (C1) is provided in the second sub pixel (SP2), and another of the first capacitor (C1) is provided in the third sub pixel (SP3).

The first capacitor (C1) includes a first capacitor electrode 312, a second capacitor electrode 314, and a capacitor dielectric film 316.

The first capacitor electrode 312 is patterned by each sub pixel (SP1, SP2, SP3) on the first electrode 220. One of the first capacitor electrode 312 is provided in the first sub pixel (SP1), another of the first capacitor electrode 312 is provided in the second sub pixel (SP2), and another of the first capacitor electrode 312 is provided in the third sub pixel (SP3).

The first capacitor electrode 312 is electrically connected with the first electrode 220 while being disposed on the first electrode 220. As shown in FIG. 17, the first capacitor electrode 312 can be directly provided on the first electrode 220. Thus, the first capacitor electrode 312 can be in direct contact with the first electrode 220.

The first capacitor electrode 312 can be formed of a carbon nanotube. In detail, in order to form the first capacitor electrode 312, a catalytic material 313, such as nickel (Ni) or iron (Fe), can be patterned on the first electrode 220. In this situation, the catalytic material 313 can be patterned in the periphery of the first electrode 220. And, a chemical vapor deposition (CVD) process is carried out by the use of gas, such as methane gas or ethylene gas, at a temperature of about 600~700° C. Accordingly, a vertical aligned carbon nanotube (VACNT) having a first height (H1) is formed along the periphery of the first electrode 220, in which the catalytic material 313 is patterned in the periphery of the first electrode 220. In this situation, the vertical aligned carbon nanotube (VACNT) has conductivity, whereby the vertical aligned carbon nanotube (VACNT) can be used as the first capacitor electrode 312 of the first capacitor (C1).

Accordingly, the first capacitor electrode 312 having the first height (H1) can be formed along the periphery of the first electrode 220. In this situation, the first height (H1) of the first capacitor electrode 312 is about 3.5 μm or more than 3.5 μm, which is relatively higher.

According as the first capacitor electrode 312 has the relatively-high first height (H1), it can serve as a barrier.

Also, the first capacitor electrode 312 is patterned by each sub pixel (SP1, SP2, SP3) and is formed along the periphery of the first electrode 220, whereby the two of first capacitor electrodes 312 can be apart from each other between the two sub pixels. According as the two of first capacitor electrodes 312 have the relatively-high first height (H1), a groove portion (trench) whose depth corresponds to the first height (H1) can be formed between the two of first capacitor electrodes 312.

In addition, the first capacitor electrode 312 can be formed along all the peripheries of the first electrode 220. For example, the first electrode 220 can be formed in a rectangular shape. In this situation, the first electrode 220 can include a first side, a second side which is opposite to the first side, and third and fourth sides provided to connect the first and second sides with each other. The first capacitor electrode 312 can be formed in all the peripheries of the first, second, third, and fourth sides of the first electrode 220.

The capacitor dielectric film 316 is provided on the first capacitor electrode 312. The capacitor dielectric film 316 is provided between the first capacitor electrode 312 and the second capacitor electrode 314, whereby charges are stored therein.

The capacitor dielectric film 316 can be provided to cover the first capacitor electrode 312. In this situation, the capacitor dielectric film 316 can cover the first capacitor electrodes 312 provided in the neighboring sub pixels. One capacitor dielectric film 316 can cover the first capacitor electrode 312 provided in the first sub pixel (SP1), and the second capacitor electrode 312 provided in the second sub pixel (SP2). As a result, the capacitor dielectric film 316 can cover an end of the first electrode 200 so that it is possible to prevent a current from being concentrated on both ends of the first electrode 220.

The capacitor dielectric film 316 can be formed of an inorganic film, for example, a silicon oxide film or a silicon nitride film.

The second capacitor electrode 314 is provided on the capacitor dielectric film 316. The second capacitor electrodes 314 can be connectedly provided in the sub pixels (SP1, SP2, SP3). That is, the second capacitor electrode 314 is not patterned by each sub pixel (SP1, SP2, SP3), but provided in one pattern for the sub pixels (SP1, SP2, SP3) while being formed in the periphery of each sub pixel (SP1, SP2, SP3) and formed in the area between the neighboring sub pixels (SP1, SP2, SP3).

Unlike the first embodiment of the present disclosure, the second capacitor electrode 314 according to the third embodiment of the present disclosure can be connected with the ground. In detail, the second capacitor electrode 314 can be connected with the third terminal 216 via the second contact hole (CH2) penetrating through the capacitor dielectric film 316 and the planarization film 220. The third terminal 216 can be connected with the ground, whereby the second capacitor electrode 314 can be connected with the ground through the third terminal 216.

The second capacitor electrode 314 according to the third embodiment of the present disclosure is formed in one pattern, and can be connected with the third terminal 216 through at least one of the eighth contact hole (CH8).

For example, the first sub pixel (SP1), the second sub pixel (SP2), and the third sub pixel (SP3) can be disposed adjacent to each other in a first direction (X-axis direction). The fourth sub pixel (SP4) can be disposed while being adjacent to the first sub pixel (SP1) in a second direction (Y-axis direction). The fourth sub pixel (SP4), a fifth sub pixel (SP5), and a sixth sub pixel (SP6) can be disposed adjacent to each other in the first direction (X-axis direction).

The second capacitor electrode 314 can be formed in the periphery of each of the first sub pixel (SP1), the second sub pixel (SP2), the third sub pixel (SP3), the fourth sub pixel (SP4), the fifth sub pixel (SP5), and the sixth sub pixel (SP6), and formed in the area between the neighboring sub pixels (SP1, SP2, SP3, SP4, SP5, SP6). For example, the second capacitor electrode 314 can be formed in one pattern throughout the areas between the sub pixels (see FIG. 20).

In addition, at least one of the eighth contact holes (CH8), for example, two of the eighth contact holes (CH8) can be formed in the area between the neighboring sub pixels (SP1, SP2, SP3, SP4, SP5, SP6). The second capacitor electrode 314 can be connected with one of the third terminal 216 via one of the eighth contact hole (CH8). Also, the second capacitor electrode 314 can be connected with another of the second terminal 214 via another of the eighth contact hole (CH8).

In addition, the second capacitor electrode 314 confronts at least one surface of the first capacitor electrode 312 with the capacitor dielectric film 316 interposed in-between. In detail, the first capacitor electrode 312 includes a lower surface 312a being in contact with the first electrode 220, an upper surface 312b being opposite to the lower surface 312a, and a first lateral surface 312c and a second lateral surface 312d provided to connect the lower surface 312a and the upper surface 312b with each other. The second capacitor electrode 314 can confront the first lateral surface 312c and the second lateral surface 312d of the first capacitor electrode 312. Accordingly, in the first capacitor (C1), charges can be stored between the first lateral surface 312c of the first capacitor electrode 312 and the second capacitor electrode 314, and between the second lateral surface 312d of the first capacitor electrode 312 and the second capacitor electrode 314, at the same time. Furthermore, as shown in FIG. 18, the second capacitor electrode 314 can confront the upper surface 312b of the first capacitor electrode 312.

The second capacitor electrode 314 can be formed of a metal material with high reflectance, for example, aluminum (Al), argentums (Ag), and etc. In the display device 100 according to the third embodiment of the present disclosure, the second capacitor electrode 314 is formed of the metal material with high reflectance, whereby some of light emitted from the organic light emitting layer 230, which advance toward the neighboring sub pixel, can be reflected to a front direction. Accordingly, the display device 100 according to the second embodiment of the present disclosure is capable of preventing colors from being mixed in the neighboring sub pixels (SP1, SP2, SP3) without using a black matrix.

A bank 225 is provided on the first capacitor (C1) and is configured to cover the first capacitor (C1). The bank 225 defines an emission area (EA) in each sub pixel (SP1, SP2, SP3). That is, an exposed area for exposing the first electrode 220 in each sub pixel (SP1, SP2, SP3), in which the bank 225 is not provided, becomes the emission area (EA), and the remaining area of each sub pixel (SP1, SP2, SP3), in which the bank 225 is provided, becomes a non-emission area (NEA). The bank 225 can be formed of an inorganic insulating film having a relatively small thickness, but not limited to this structure. The bank 225 can be formed of an organic insulating film.

The organic light emitting layer 230 is provided on the first electrode 220 and the bank 225. The organic light emitting layer 230 can be a white light emission layer for emitting white colored light, but not limited to this structure. The organic light emitting layer 230 can be formed of a red emission layer configured to emit red colored light, a green emission layer configured to emit green colored light, or a blue emission layer configured to emit blue colored light. In this situation, the organic light emitting layer 230 can be patterned in the area corresponding to the first electrode 220.

If the organic light emitting layer 230 is the white light emission layer, the organic light emitting layer 230 can be a common layer formed for the sub pixels (SP1, SP2, SP3) in common.

In order to emit the white colored light, the organic light emitting layer 230 can include a plurality of stacks for emitting different colored lights. Each stack can include a hole transporting layer, at least one light emitting layer, and an electron transporting layer.

Also, a charge generation layer can be formed between each of the stacks. The charge generation layer can include an n-type charge generation layer positioned adjacent to a lower stack, and a p-type charge generation layer provided on the n-type charge generation layer and positioned adjacent to an upper stack. The n-type charge generation layer injects an electron into the lower stack, and the p-type charge generation layer injects a hole into the upper stack. The n-type charge generation layer can be formed of an organic layer doped with alkali metal, such as Li, Na, K or Cs, or an organic layer doped with alkali earth metal, such as Mg, Sr, Ba or Ra. The p-type charge generation layer can be formed of an organic material having a hole transporting capacity doped with dopant.

The organic light emitting layer 230 can be formed by a deposition process or solution process. If the organic light emitting layer 230 is formed by the deposition process, an evaporation method can be used. If a film is formed by the evaporation method, the film has inferior step coverage. Thus, according as the organic light emitting layer 230 has inferior step coverage, a thickness of the organic light emitting layer 230 is not constant in the area having the step difference caused by the first capacitor (C1).

In the organic light emitting layer 230, a thickness of the organic light emitting layer on the first capacitor (C1) is relatively smaller than a thickness of the organic light emitting layer on the first electrode 220. In more detail, the organic light emitting layer 230 can be provided on upper and lateral surfaces of the first capacitor (C1). According as the first capacitor electrode 312 has the first height (H1), the first capacitor (C1) can have the height which is greater than the first height (H1) on the first electrode 220. Accordingly, when the organic light emitting layer 230 is provided on the first electrode 220 and the first capacitor (C1), the thickness of the organic light emitting layer 230 is not constant due to the step difference between the first electrode 220 and the first capacitor (C1). The organic light emitting layer 230 can be thinly provided on the upper and lateral surfaces of the first capacitor (C1). Especially, the organic light emitting layer 230 can be more thinly provided on the lateral surface of the first capacitor (C1). The organic light emitting layer 230 can be disconnectedly provided on the lateral surface of the first capacitor (C1) according as the height of the first capacitor (C1) is increased.

In the third embodiment of the present disclosure, the trench is formed in the groove shape by the first capacitor (C1) provided in each of the neighboring sub pixels (SP). Thus, in comparison to a situation without the trench of the groove shape, a length of a current leakage path via the organic light emitting layer 230 between the neighboring sub pixels (SP) is increased relatively in the third embodiment of the present disclosure. Also, in the third embodiment of the present disclosure, the thickness of the organic light emitting layer on the first capacitor (C1) is relatively smaller than the thickness of the organic light emitting layer on the first electrode 220 so that it is possible to increase a resistance of the organic light emitting layer 230. Furthermore, in the third embodiment of the present disclosure, if the height of the first capacitor (C1) is increased, the organic light emitting layer 230 can be disconnectedly provided at the lateral surface of the first capacitor (C1). In this situation, the current may not flow in the organic light emitting layer 230 between the neighboring sub pixels (SP). Thus, it is possible to minimize an influence on the neighboring sub pixels (SP) by a leakage current via the organic light emitting layer 230.

The second electrode 240 is provided on the organic light emitting layer 230. The second electrode 240 can be a common layer formed for the sub pixels (SP1, SP2, SP3) in common.

The second electrode 240 can be formed of a transparent metal material (TCO, transparent conductive material), such as Indium Tin Oxide (ITO) or Indium Zinc Oxide (IZO), or a semi-transmissive metal material (semi-transmissive conductive material), such as magnesium (Mg), argentums (Ag), or alloy of magnesium (Mg) and argentums (Ag). The second electrode 240 can be a cathode electrode.

The encapsulation film 250 is provided on the second electrode 240 and is configured to cover the second electrode 240. The encapsulation film 250 prevents oxygen or moisture from being permeated into the second electrode 240. To this end, the encapsulation film 250 can include at least one inorganic film.

In detail, the encapsulation film 250 can include a first inorganic film. According to one embodiment of the present disclosure, the encapsulation film 250 can further include at least one of an organic film and a second inorganic film.

The first inorganic film is provided to cover the second electrode 240. The organic film is provided on the first inorganic film. Preferably, the organic film has a length which is sufficient to prevent particles from being permeated into the organic light emitting layer 230 and the second electrode 240 through the first inorganic film. The second inorganic film is provided to cover the organic film.

Each of the first inorganic film and the second inorganic film can be formed in a single-layered structure of silicon nitride, aluminum nitride, zirconium nitride, titanium nitride, hafnium nitride, tantalum nitride, silicon oxide, aluminum oxide, or titanium oxide, or can be formed in a multi-layered structure of materials selected among silicon nitride, aluminum nitride, zirconium nitride, titanium nitride, hafnium nitride, tantalum nitride, silicon oxide, aluminum oxide, and titanium oxide. The first and second inorganic films can be deposited by a chemical vapor deposition (CVD) method or an atomic layer deposition (ALD) method, but not limited to these methods.

The organic film can be formed of acryl resin, epoxy resin, phenolic resin, polyamide resin, or polyimide resin. The organic film can be obtained by a vapor deposition method, a printing method, or a slit coating method, but not limited to these methods. The organic film can be obtained by an ink-jet method.

The color filter layer 260 is provided on the encapsulation film 250. The color filter layer 260 includes a first color filter (CF1), a second color filter (CF2), and a third color filter (CF3) which are provided for the respective sub pixels (SP1, SP2, SP3). The first color filter (CF1) can be a red color filter for transmitting red colored light therethrough, the second color filter (CF2) can be a green color filter for transmitting green colored light therethrough, and the third color filter (CF3) can be a blue color filter for transmitting blue colored light therethrough.

The display device 100 according to the third embodiment of the present disclosure is characterized in that the first capacitor (C1) is provided on the first electrode 220. In this situation, the first capacitor (C1) corresponding to the vertical aligned carbon nanotube (VACNT) can form the first capacitor electrode 312. The first capacitor electrode 312 having the first height (H1) in the vertical direction is formed along the periphery of the first electrode 220 so that it is possible to increase a total area of the first capacitor electrode 312. Accordingly, the first capacitor (C1) according to the second embodiment of the present disclosure can have a capacitance of 60 fF or more than 60 fF even in the situation of a high resolution.

Furthermore, in a related art capacitor electrode formed horizontally, it has limitations on the increase of size due to an arrangement relation between other wirings or electrodes. In addition, the first capacitor electrode 312 according to the third embodiment of the present disclosure is formed vertically so that it is possible to increase a formation area regardless of an arrangement relation between other wirings or electrodes. That is, the display device 100 according to the third embodiment of the present disclosure facilitates to increase a capacitance of the first capacitor (C1) in accordance with a resolution.

Fourth Embodiment

Figure 21:
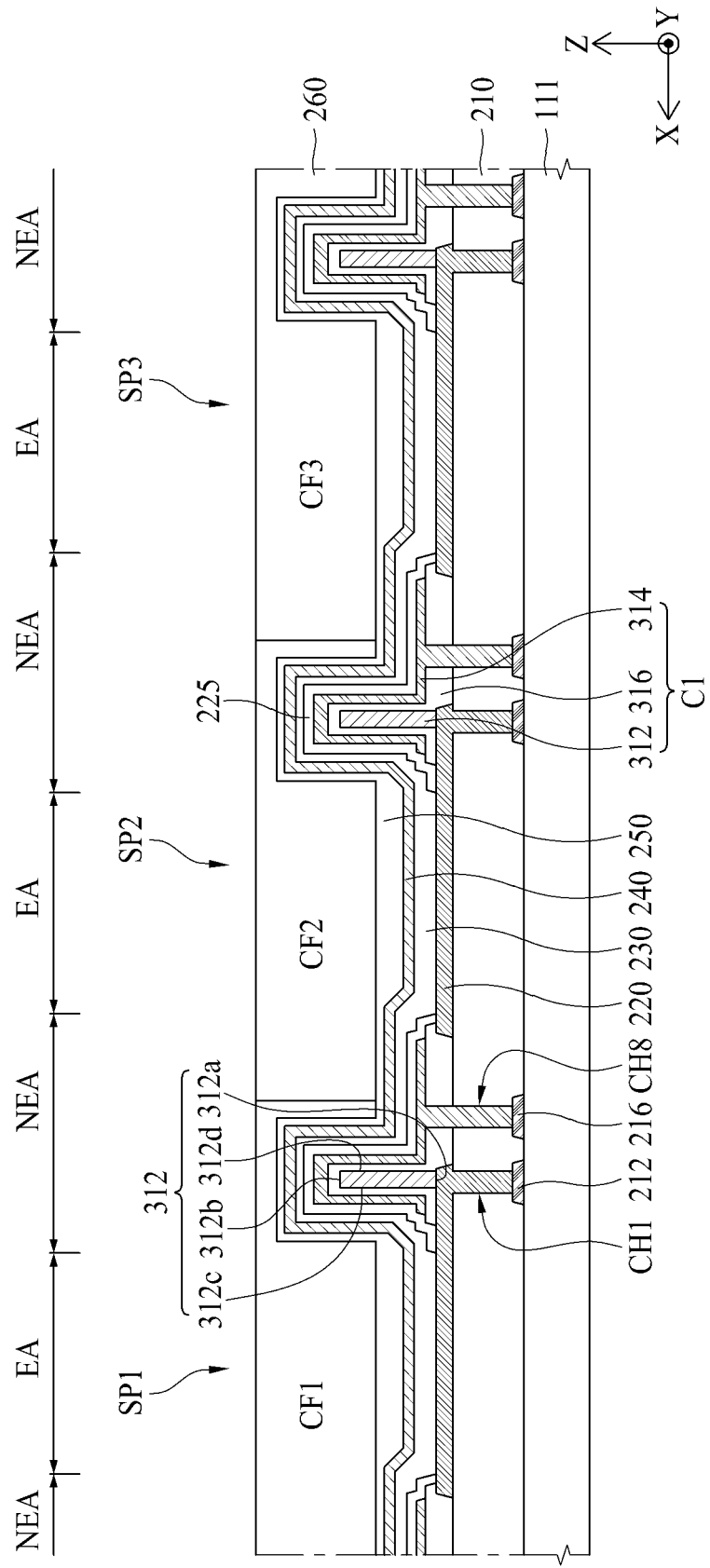
FIG. 21 is a cross sectional view illustrating another embodiment of a display device having a sub pixel shown in FIG. 17.
Figure 22:
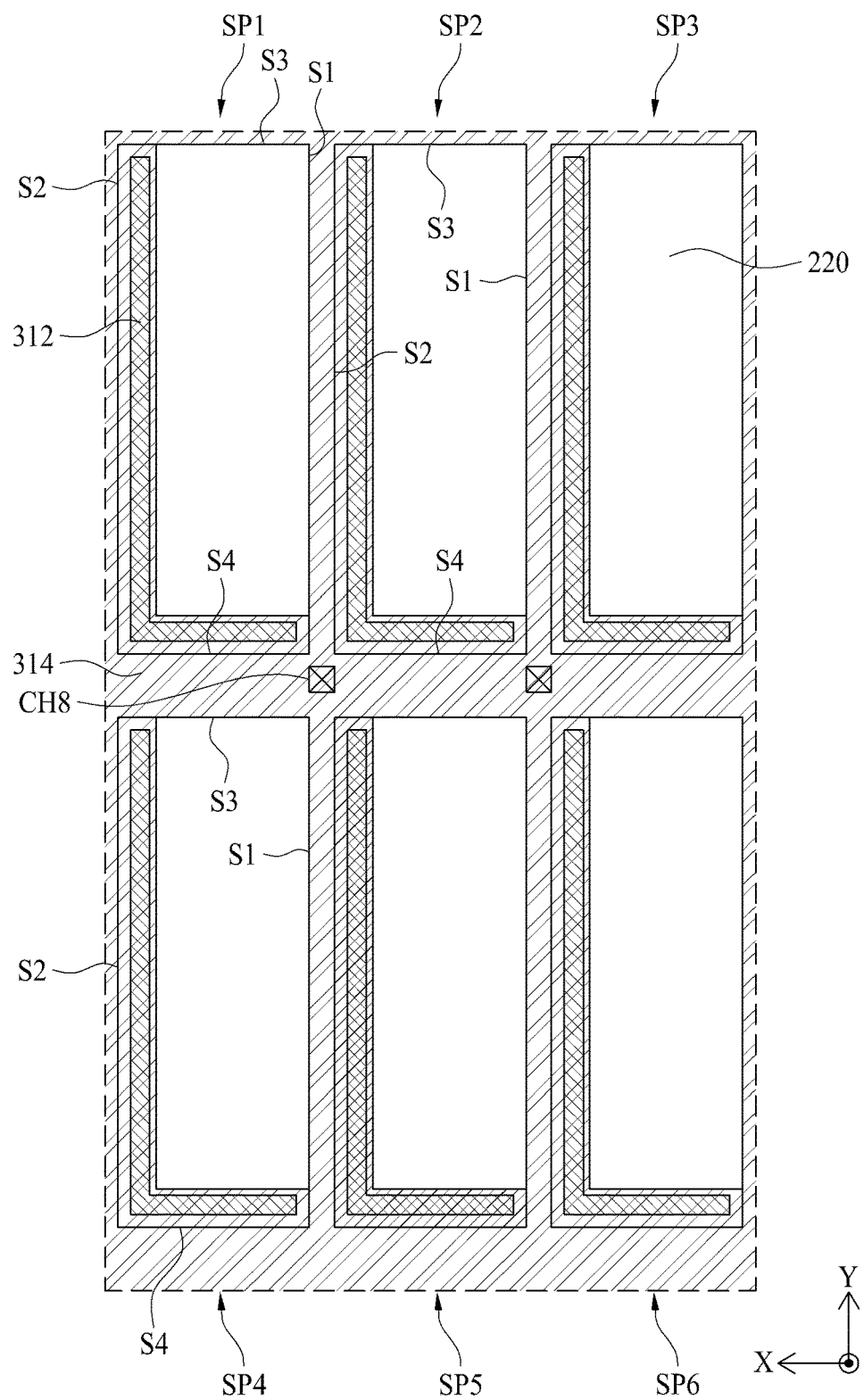
FIG. 22 is a plane view illustrating one example of a first electrode, a first capacitor electrode, and a second capacitor electrode shown in FIG. 21 according to an embodiment of the present disclosure.
Figure 23:
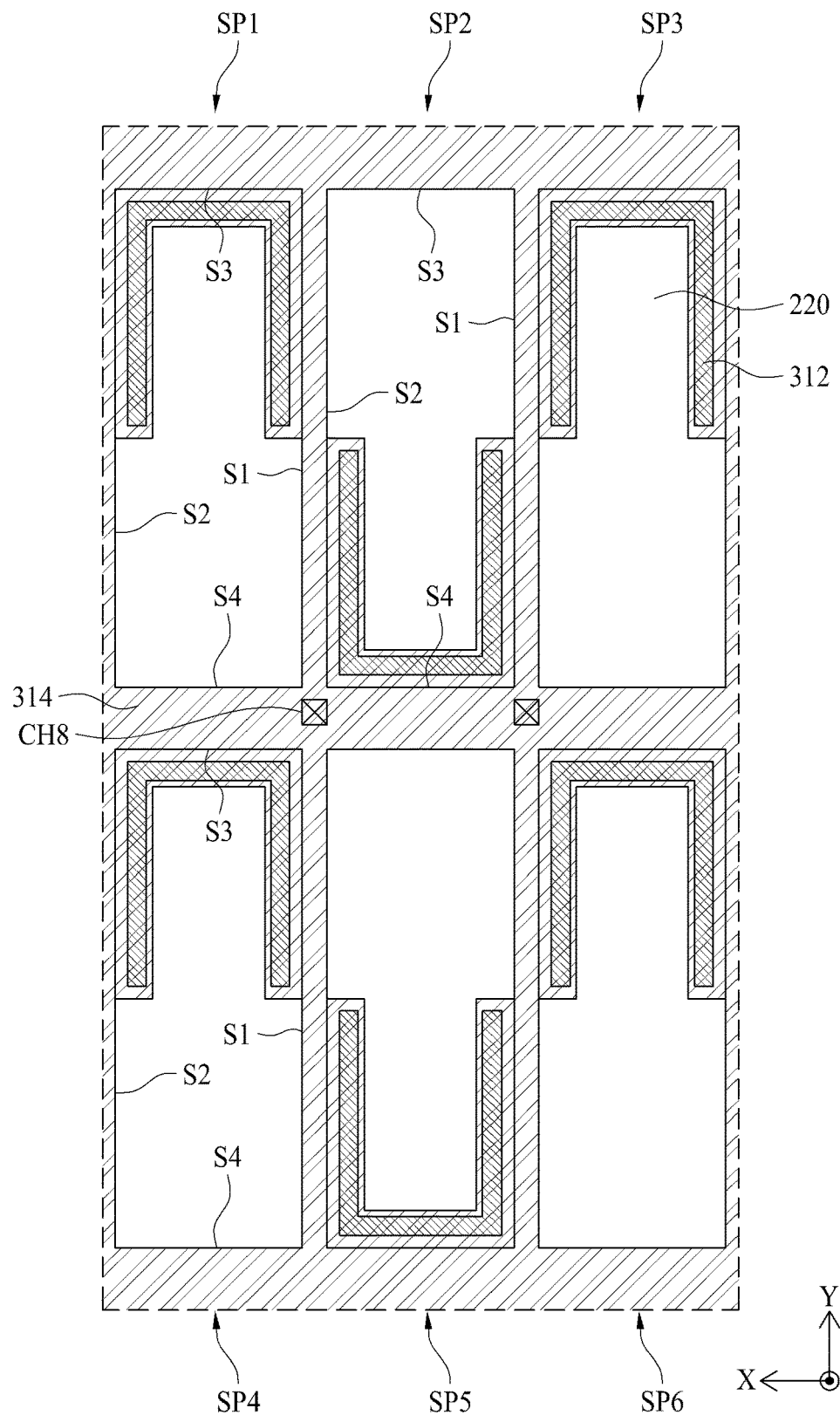
FIG. 23 is a plane view illustrating another example of a first electrode, a first capacitor electrode, and a second capacitor electrode shown in FIG. 21 according to an embodiment of the present disclosure.
Figure 24:
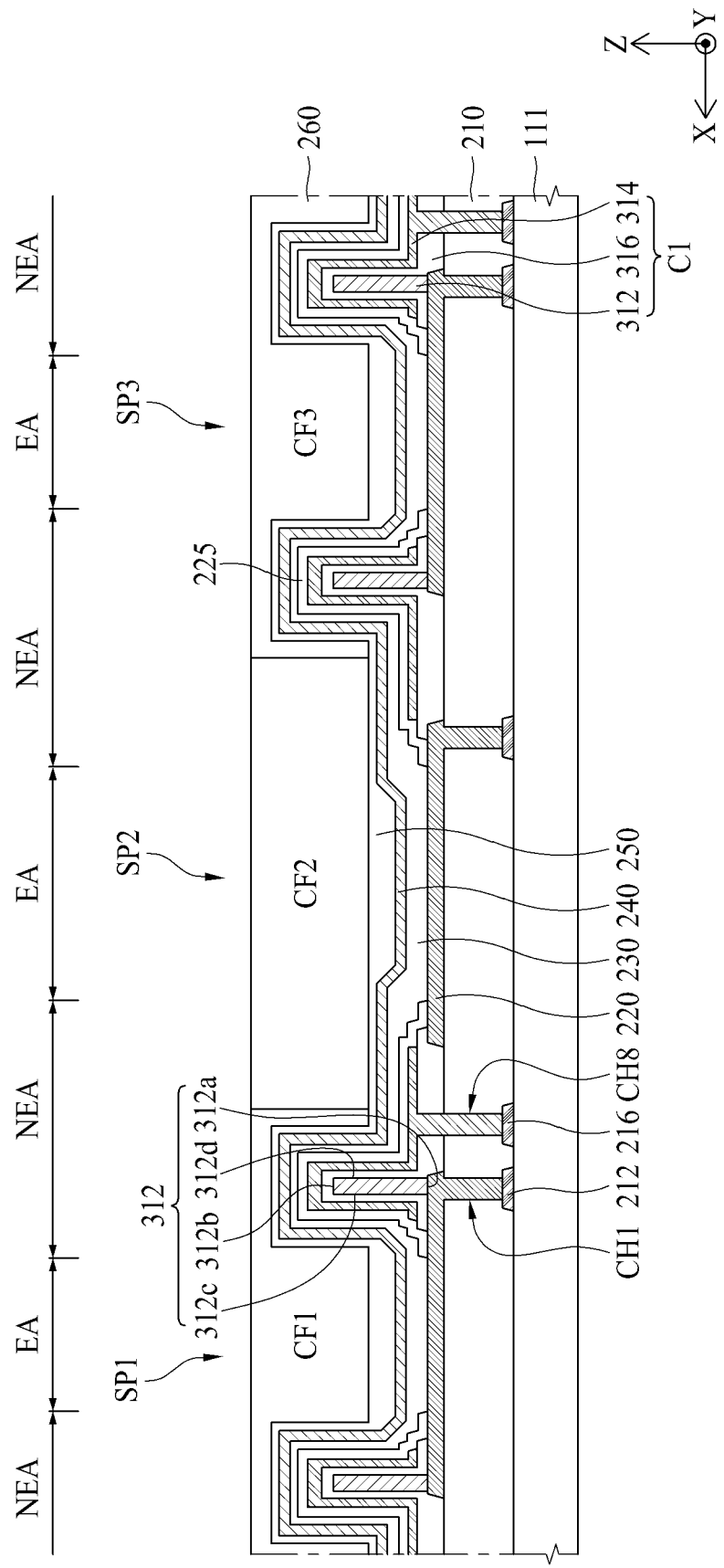
FIG. 24 is a cross sectional view illustrating a modified embodiment of FIG. 21.
Figure 25:
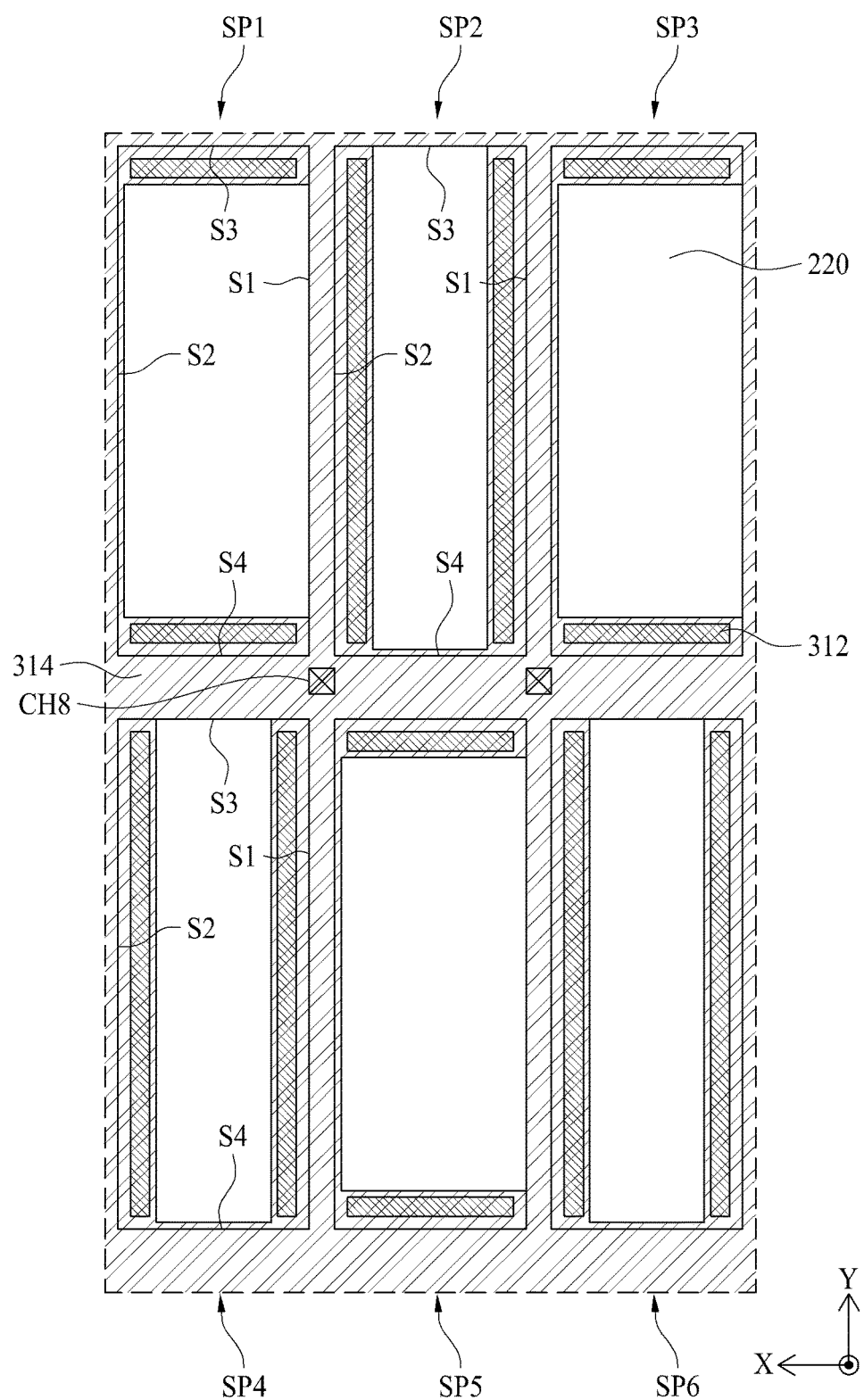
FIG. 25 is a plane view illustrating one example of a first electrode, a first capacitor electrode, and a second capacitor electrode shown in FIG. 24 according to an embodiment of the present disclosure.

FIG. 21 is a cross sectional view illustrating a fourth embodiment of a display device having a sub pixel shown in FIG. 17. FIG. 22 is a plane view illustrating one example of a first electrode, a first capacitor electrode, and a second capacitor electrode shown in FIG. 21. FIG. 23 is a plane view illustrating another example of a first electrode, a first capacitor electrode, and a second capacitor electrode shown in FIG. 21. FIG. 24 is a cross sectional view illustrating a modified embodiment of FIG. 21. FIG. 25 is a plane view illustrating one example of a first electrode, a first capacitor electrode, and a second capacitor electrode shown in FIG. 24.

Referring to FIGS. 21 to 25, the display device 100 according to the fourth embodiment of the present disclosure includes a planarization film 210, a first electrode 220, an organic light emitting layer 230, a second electrode 240, an encapsulation film 250, a color filter layer 260, a first capacitor (C1), a second capacitor (C2) and a bank 225, which are provided on a first substrate 111.

The first substrate 111, the planarization layer 210, the first electrode 220, the organic light emitting layer 230, the second electrode 240, the encapsulation film 250, the color filter layer 260, the second capacitor (C2) and the bank 225 included in the display device 100 according to the fourth embodiment of the present disclosure are identical in structure to those of the display device 100 shown in FIGS. 18 to 20, whereby a detailed description for the first substrate 111, the planarization layer 210, the first electrode 220, the organic light emitting layer 230, the second electrode 240, the encapsulation film 250, the color filter layer 260, the second capacitor (C2) and the bank 225 included in the display device 100 according to the fourth embodiment of the present disclosure will be omitted.

In the display device 100 according to the fourth embodiment of the present disclosure, the first capacitor (C1) is provided in some portions of a peripheral area of the first substrate 220 while being disposed on the first substrate 220. In this respect, the display device 100 according to the fourth embodiment of the present disclosure is different from the display device 100 according to the third embodiment of the present disclosure. Hereinafter, the structural difference between the display device 100 according to the fourth embodiment of the present disclosure and the display device 100 according to the third embodiment of the present disclosure will be described mainly.

The first capacitor (C1) is patterned by each sub pixel (SP1, SP2, SP3) on the first electrode 220. One of the first capacitor (C1) is provided in the first sub pixel (SP1), another of the first capacitor (C1) is provided in the second sub pixel (SP2), and another of the capacitor (C1) is provided in the third sub pixel (SP3).

The first capacitor (C1) includes a first capacitor electrode 312, a second capacitor electrode 314, and a capacitor dielectric film 316.

The first capacitor electrode 312 is patterned by each sub pixel (SP1, SP2, SP3) on the first electrode 220. One of the first capacitor electrode 312 is provided in the first sub pixel (SP1), another of the first capacitor electrode 312 is provided in the second sub pixel (SP2), and another of the first capacitor electrode 312 is provided in the third sub pixel (SP3).

The first capacitor electrode 312 is electrically connected with the first electrode 220 while being disposed on the first electrode 220. As shown in FIG. 20, the first capacitor electrode 312 can be directly provided on the first electrode 220. Thus, the first capacitor electrode 312 can be in direct contact with the first electrode 220.

The first capacitor electrode 312 can be formed of a carbon nanotube. In detail, in order to form the first capacitor electrode 312, a catalytic material, such as nickel (Ni) or iron (Fe) can be patterned on the first electrode 220. In this situation, the catalytic material can be patterned in the periphery of the first electrode 220. And, a chemical vapor deposition (CVD) process is carried out by the use of gas, such as methane gas or ethylene gas, at a temperature of about 600~700° C. Accordingly, a vertical aligned carbon nanotube (VACNT) having a first height (H1) is formed along the periphery of the first electrode 220, in which the catalytic material is patterned in the periphery of the first electrode 220. In this situation, the vertical aligned carbon nanotube (VACNT) has conductivity, whereby the vertical aligned carbon nanotube (VACNT) can be used as the first capacitor electrode 312 of the first capacitor (C1).

Accordingly, the first capacitor electrode 312 having the first height (H1) can be formed along some portions of the periphery of the first electrode 220. In this situation, the first height (H1) of the first capacitor electrode 312 is about 3.5 µm or more than 3.5 µm, which is relatively higher. According as the first capacitor electrode 312 has the relatively-high first height (H1), it can serve as a barrier.

In addition, the first capacitor electrode 312 according to the fourth embodiment of the present disclosure can be formed in the periphery area of some sides of the first electrode 220.

The first capacitor electrode 312 can be configured to have the first height in all the peripheries of the first, second, third, and fourth sides (S1, S2, S3, S4) of the first electrode 220 provided in the first sub pixel (SP1). Also, the first capacitor electrode 312 can be configured to have the first height in all the peripheries of the first, second, third, and fourth sides (S1, S2, S3, S4) of the first electrode 220 provided in the second sub pixel (SP2) which is disposed adjacent to the first sub pixel (SP1).

The first side (S1) of the first electrode 220 provided in the first sub pixel (SP1) confronts the second side (S2) of the first electrode 220 provided in the second sub pixel (SP2) under the circumstances that the first side (S1) of the first electrode 220 provided in the first sub pixel (SP1) is spaced apart from the second side (S2) of the first electrode 220 provided in the second sub pixel (SP2). Also, one surface of the first capacitor electrode 312 provided in the peripheral area of the first side (S1) of the first electrode 220 provided in the first sub pixel (SP1) confronts one surface of the first capacitor electrode 312 provided in the peripheral area of the second side (S2) of the first electrode 220 provided in the second sub pixel (SP2). In this situation, a parasitic capacitance can be formed between the two of first capacitor electrodes 312 due to a small interval between the two of first capacitor electrodes 312, whereby the first capacitor (C1) may be not driven normally. As an interval between the sub pixels (SP1, SP2, SP3) becomes smaller, the parasitic capacitance may be increased between the first capacitor electrodes 312 disposed in the neighboring sub pixels.

In the display device 100 according to the fourth embodiment of the present disclosure, the first capacitor electrode 312 is formed only in the some portions of the peripheral area among the first, second, third and fourth sides (S1, S2, S3, S4) of the first electrode 220 so that it is possible to minimize or prevent the parasitic capacitance between the first capacitor electrodes 312 disposed in the neighboring sub pixels.

In order to minimize or prevent the parasitic capacitance, the first capacitor electrode 312 provided in each of the neighboring two sub pixels can be provided only in any one peripheral area of the two confronting sides of the first electrodes 220 provided in each of the two sub pixels. For example, the first electrode 220 provided in the first sub pixel (SP1) can confront the second side (S2) of the first electrode 220 provided in the second sub pixel (SP2). The first capacitor electrode 312 can be provided in any one peripheral area of the first side (S1) of the first electrode 220 provided in the first sub pixel (SP1) and the second side (S2) of the first electrode 220 provided in the second sub pixel (SP2).

According to one embodiment of the present disclosure, the first capacitor electrode 312 can be provided in the peripheral areas of the two sides, which are not opposite to each other, among the first, second, third and fourth sides (S1, S2, S3, S4) of the first electrode 220, as shown in FIG. 22 (e.g., providing an "L" shaped capacitor).

For example, the first electrode 220 can be formed in a rectangular shape. In this situation, the first electrode 220 can include a first side (S1), a second side (S2) which is opposite to the first side (S1), and third and fourth sides (S3, S4) provided to connect the first and second sides (S1, S2) with each other. The first capacitor electrode 312 can be formed only in the second and fourth sides (S2, S4), which are not opposite to each other, in each of the plurality of sub pixels (SP1, SP2, SP3).

The first capacitor electrode 312 is provided in the peripheral area of the second side (S2) of the first electrode 220 provided in the second sub pixel (SP2), however, the first capacitor electrode 312 is not provided in the peripheral area of the first side (S1) of the first electrode 220 provided in the first sub pixel (SP1). Thus, one surface of the first capacitor electrode 312 provided in the peripheral area of the second side (S2) of the first electrode 220 provided in the second sub pixel (SP2) confronts one surface of the first capacitor electrode 312 provided in the peripheral area of the second side (S2) of the first electrode 220 provided in the first sub pixel (SP1). As an interval between the confronting two of the first capacitor electrodes 312 is large, it is possible to prevent the parasitic capacitance between the two of the first capacitor electrodes 312.

Also, the fourth side (S4) of the first electrode 220 provided in the first sub pixel (SP1) confronts the third side (S3) of the first electrode 220 provided in the fourth sub pixel (SP4) under the circumstances that the fourth side (S4) of the first electrode 220 provided in the first sub pixel (SP1) is spaced apart from the third side (S3) of the first electrode 220 provided in the fourth sub pixel (SP4). The first capacitor electrode 312 is provided in the peripheral area of the fourth side (S4) of the first electrode 220 provided in the first sub pixel (SP1), however, the first capacitor electrode 312 is not provided in the peripheral area of the third side (S3) of the first electrode 220 provided in the fourth sub pixel (SP4). Accordingly, one surface of the first capacitor electrode 312 provided in the peripheral area of the fourth side (S4) of the first electrode 220 provided in the first sub pixel (SP1) confronts one surface of the first capacitor electrode 312 provided in the peripheral area of the fourth side (S4) of the first electrode 220 provided in the fourth sub pixel (SP4). As an interval between the confronting two of the first capacitor electrodes 312 is large, it is possible to prevent the parasitic capacitance between the two of the first capacitor electrodes 312.

In addition, if the first capacitor electrode 312 is formed in the peripheral areas of the two sides, which are not opposite to each other, among the first, second, third and fourth sides (S1, S2, S3, S4) of the first electrode 220, as shown in FIG. 22, the first capacitor (C1) can be provided in the peripheral areas of the two sides, which are not opposite to each other, among the first, second, third and fourth sides (S1, S2, S3, S4) of the first electrode 220.

According to another embodiment of the present disclosure, the first capacitor electrode 312 is formed in the peripheral areas of the three sides among the first, second, third and fourth sides (S1, S2, S3, S4) of the first electrode 220, as shown in FIG. 23 (e.g., "C" shapes alternately arranged in the sub pixel areas).

For example, the first capacitor electrode 312 can be provided only in the peripheral area of the first, second and third sides (S1, S2, S3) in each of the plurality of sub pixels (SP1, SP2, SP3), or can be provided only in the peripheral area of the first, second and fourth sides (S1, S2, S4) in each of the plurality of sub pixels (SP1, SP2, SP3).

In this situation, the first capacitor electrodes 312 provided in the neighboring sub pixels can be disposed while being not confronting each other. For example, the first capacitor electrode 312 can be provided in the peripheral area of the first, second and third sides (S1, S2, S3) of the first electrode 220 in the first sub pixel (SP1). In detail, the first capacitor electrode 312 provided in the first sub pixel (SP1) can be provided along the peripheral area of the third side (S3) of the first electrode 220. The first capacitor electrode 312 provided in the first sub pixel (SP1) can extend from the peripheral area of the third side (S3) of the first electrode 220 to the peripheral area of the first side (S1) of the first electrode 220. Also, the first capacitor electrode 312 provided in the first sub pixel (SP1) can extend from the peripheral area of the third side (S3) of the first electrode 220 to the peripheral area of the second side (S2) of the first electrode 220. In this situation, the first capacitor electrode 312 provided in each of the first and second sides (S1, S2) of the first electrode 220 can be provided only in some portions without being extended to the peripheral area of the fourth side (S4). The first capacitor electrode 312 provided in the first sub pixel (SP1) can be disposed while being not confronting the first capacitor electrode 312 provided in the second sub pixel (SP2).

In the second sub pixel (SP2), the first capacitor electrode 312 can be provided in the peripheral area of the first, second and fourth sides (S1, S2, S4) of the first electrode 220. In detail, the first capacitor electrode 312 provided in the second sub pixel (SP2) can be provided along the peripheral area of the fourth side (S4) of the first electrode 220. The first capacitor electrode 312 provided in the second sub pixel (SP2) can extend from the peripheral area of the fourth side (S4) of the first electrode 220 to the peripheral area of the first side (S1) of the first electrode 220. Also, the first capacitor electrode 312 provided in the second sub pixel (SP2) can extend from the peripheral area of the third side (S3) of the first electrode 220 to the peripheral area of the second side (S2) of the first electrode 220. In this situation, the first capacitor electrode 312 provided in each of the first and second sides (S1, S2) of the first electrode 220 can be provided only in some portions without being extended to the peripheral area of the third side (S3). The first capacitor electrode 312 provided in the second sub pixel (SP2) can be disposed while being not confronting the first capacitor electrode 312 provided in the first sub pixel (SP1).

Accordingly, the parasitic capacitance is not formed between the first capacitor electrode 312 provided in the first sub pixel (SP1) and the first capacitor electrode 312 provided in the second sub pixel (SP2).

The first capacitor electrode 312 shown in FIGS. 21 to 22 is formed in the peripheral area of the two sides which are not opposite to each other on the first electrode 220.

In another embodiment of the present disclosure, the first capacitor electrode 312 can be provided in the peripheral area of the two non-confronting sides (opposite sides) (S3, S4) among the first, second, third and fourth sides (S1, S2, S3, S4) of the first electrode 220, as shown in FIGS. 24 and 25.

For example, the first capacitor electrode 312 can be formed only in the peripheral area of the first and second sides (S1, S2) which are opposite to each other in each of the plurality of sub pixels (SP1, SP2, SP3), or can be formed only in the peripheral area of the third and fourth sides (S3, S4) which are opposite to each other in each of the plurality of sub pixels (SP1, SP2, SP3).

In this situation, the first capacitor electrodes 312 provided in the neighboring sub pixels can be disposed while being not confronting each other. In more detail, the first capacitor electrode 312 can be provided only in the peripheral area of the third and fourth sides (S3, S4) of the first electrode 220 provided in the first sub pixel (SP1). The first capacitor electrode 312 can be provided only in the peripheral area of the first and second sides (S1, S2) of the first electrode 220 provided in each of the second and fourth sub pixels (SP2, SP4) which are adjacent to the first sub pixel (SP1).

The first capacitor electrode 312 is provided in the peripheral area of the second side (S2) of the first electrode 220 provided in the second sub pixel (SP2), however, the first capacitor electrode 312 is not formed in the peripheral area of the first side (S1) of the first electrode 220 provided in the first sub pixel (SP1). The first capacitor electrode 312 provided in the first sub pixel (SP1) does not confront the first capacitor electrode 312 provided in the peripheral area of the second side (S2) of the first electrode 220 provided in the second sub pixel (SP2). Accordingly, the parasitic capacitance is not formed between the first capacitor electrode 312 provided in the first sub pixel (SP1) and the first capacitor electrode 312 provided in the second sub pixel (SP2).

Also, the first capacitor electrode 312 is provided in the peripheral area of the fourth side (S4) of the first electrode 220 provided in the first sub pixel (SP1), however, the first capacitor electrode 312 is not formed in the peripheral area of the third side (S3) of the first electrode 220 provided in the fourth sub pixel (SP4). The first capacitor electrode 312 provided in the first sub pixel (SP1) does not confront the first capacitor electrode 312 provided in the peripheral area of the third side (S3) of the first electrode 220 provided in the fourth sub pixel (SP4). Accordingly, the parasitic capacitance is not formed between the first capacitor electrode 312 provided in the first sub pixel (SP1) and the first capacitor electrode 312 provided in the fourth sub pixel (SP4).

In addition, if the first capacitor electrode 312 is formed in the peripheral areas of the two non-confronting sides (opposite sides) among the first, second, third and fourth sides (S1, S2, S3, S4) of the first electrode 220, as shown in FIGS. 24 and 25, the first capacitor (C1) can be provided in the peripheral areas of the two non-confronting sides (opposite sides) among the first, second, third and fourth sides (S1, S2, S3, S4) of the first electrode 220.

As described above, the first capacitor electrode 312 formed in some peripheral areas of the first, second, third and fourth sides of the first electrode 220 is in contact with the first electrode 220, whereby they can be electrically connected with each other through the first electrode 220 without the direct connection.

The capacitor dielectric film 316 is provided on the first capacitor electrode 312. The capacitor dielectric film 316 is provided between the first capacitor electrode 312 and the second capacitor electrode 314, whereby charges are stored therein.

The capacitor dielectric film 316 can be provided to cover the first capacitor electrode 312. In this situation, the capacitor dielectric film 316 can cover the end of the first electrode 220 provided in the neighboring sub pixels. For example, as shown in FIG. 20, at one end of the capacitor dielectric film 316, the capacitor dielectric film 316 can cover the first capacitor electrode 312 provided in the first sub pixel (SP1). Also, at the other end of the capacitor dielectric film 316, the capacitor dielectric film 316 can cover one end of the first electrode 220 provided in the second sub pixel (SP2). As a result, the capacitor dielectric film 316 can cover the end of the first electrode 200 so that it is possible to prevent a current from being concentrated on both ends of the first electrode 220.

The capacitor dielectric film 316 can be formed of an inorganic film, for example, a silicon oxide film or a silicon nitride film.

The second capacitor electrode 314 is provided on the capacitor dielectric film 316. The second capacitor electrodes 314 can be connectedly provided in the sub pixels (SP1, SP2, SP3). That is, the second capacitor electrode 314 is not patterned by each sub pixel (SP1, SP2, SP3), but provided in one pattern for the sub pixels (SP1, SP2, SP3) while being provided in the periphery of each sub pixel (SP1, SP2, SP3) and provided in the area between the neighboring sub pixels (SP1, SP2, SP3).

The second capacitor electrode 314 according to the fourth embodiment of the present disclosure can be connected with the ground. In detail, the second capacitor electrode 314 can be connected with the third terminal 216 via the eighth contact hole (CH8) penetrating through the capacitor dielectric film 316 and the planarization film 220. The third terminal 216 can be connected with the ground, whereby the second capacitor electrode 314 can be connected with the ground through the third terminal 216.

The second capacitor electrode 314 according to the fourth embodiment of the present disclosure is provided in one pattern, and can be connected with the third terminal 216 through at least one of the eighth contact hole (CH8).

For example, the first sub pixel (SP1), the second sub pixel (SP2), and the third sub pixel (SP3) can be disposed adjacent to each other in a first direction (X-axis direction). The fourth sub pixel (SP4) can be disposed while being adjacent to the first sub pixel (SP1) in a second direction (Y-axis direction). The fourth sub pixel (SP4), a fifth sub pixel (SP5), and a sixth sub pixel (SP6) can be disposed adjacent to each other in the first direction (X-axis direction).

The second capacitor electrode 314 can be formed in the periphery of each of the first sub pixel (SP1), the second sub pixel (SP2), the third sub pixel (SP3), the fourth sub pixel (SP4), the fifth sub pixel (SP5), and the sixth sub pixel (SP6), and formed in the area between the neighboring sub pixels (SP1, SP2, SP3, SP4, SP5, SP6), as shown in FIGS. 21, 22 and 23.

In addition, at least one of the eighth contact holes (CH8), for example, two of the eighth contact holes (CH8) can be formed in the area between the neighboring sub pixels (SP1, SP2, SP3, SP4, SP5, SP6). The second capacitor electrode 314 can be connected with one of the third terminal 216 via one of the eighth contact hole (CH8). Also, the second capacitor electrode 314 can be connected with another of the second terminal 214 via another of the eighth contact hole (CH8).

In addition, the second capacitor electrode 314 confronts at least one surface of the first capacitor electrode 312 with the capacitor dielectric film 316 interposed in-between. In detail, the first capacitor electrode 312 includes a lower surface 312a being in contact with the first electrode 220, an upper surface 312b being opposite to the lower surface 312a, and a first lateral surface 312c and a second lateral surface 312d provided to connect the lower surface 312a and the upper surface 312b with each other. The second capacitor electrode 314 can confront the first lateral surface 312c and the second lateral surface 312d of the first capacitor electrode 312. Accordingly, in the first capacitor (C1), charges can be stored between the first lateral surface 312c of the first capacitor electrode 312 and the second capacitor electrode 314, and between the second lateral surface 312d of the first capacitor electrode 312 and the second capacitor electrode 314, at the same time. Furthermore, as shown in FIG. 20, the second capacitor electrode 314 can confront the upper surface 312b of the first capacitor electrode 312.

The second capacitor electrode 314 can be formed of a metal material with high reflectance, for example, aluminum (Al), argentums (Ag), and etc. In the display device 100 according to the fourth embodiment of the present disclosure, the second capacitor electrode 314 is formed of the metal material with high reflectance, whereby some of light emitted from the organic light emitting layer 230, which would other advance toward the neighboring sub pixel, can be reflected to a front direction towards the viewer's eyes. Accordingly, the display device 100 according to the fourth embodiment of the present disclosure is capable of preventing colors from being mixed in the neighboring sub pixels (SP1, SP2, SP3) without using a black matrix.

The display device 100 according to the fourth embodiment of the present disclosure is characterized in that the first capacitor (C1) is provided on the first electrode 220. In this situation, the first capacitor (C1) corresponding to the vertical aligned carbon nanotube (VACNT) can form the first capacitor electrode 312. The first capacitor electrode 312 having the first height (H1) in the vertical direction is formed along the periphery of the first electrode 220 so that it is possible to increase a total area of the first capacitor electrode 312. Accordingly, the first capacitor (C1) according to the fourth embodiment of the present disclosure can have a high capacitance even in the situation of a high resolution.

For example, it is assumed that a capacitance of capacitor is 6.25 fF when the first capacitor electrode 312 has a width of 180 nm, a height of 3.5 μm, and a length of 1.0 μm. One of the first electrode 220 can be formed to be 1.2 μm in a first direction (X-axis direction), and 4.5 μm in a second direction (Y-axis direction). A width in one of the first capacitor electrode 312 can be 180 nm, and a height in one of the first capacitor electrode 312 can be 3.5 μm. In this situation, one of the first capacitor electrode 312 is formed along some portions of the periphery of the first electrode 220, whereby a length becomes 5.7 μm. Accordingly, a capacitance of one capacitor becomes 35.63 fF.

Furthermore, in a related art capacitor electrode formed horizontally, it has limitations on the increase of area due to an arrangement relation between other wirings or electrodes. In addition, the first capacitor electrode 312 according to the fourth embodiment of the present disclosure is formed vertically so that it is possible to increase a formation area regardless of an arrangement relation between other wirings or electrodes. That is, the display device 100 according to the fourth embodiment of the present disclosure facilitates to increase a capacitance of the first capacitor (C1) in accordance with a resolution.

Also, in the display device 100 according to the fourth embodiment of the present disclosure, the first capacitors (C1) are provided in such a manner that an interval between the first capacitors (C1) disposed in the neighboring sub pixels, and more particularly, an interval between the first capacitor electrodes 312 is more than a predetermined value. Accordingly, it is possible to minimize or prevent the parasitic capacitance between the first capacitors (C1) disposed in the neighboring sub pixels of the display device 100 according to the fourth embodiment of the present disclosure.

In addition, the area provided with the first capacitor (C1) becomes a non-emission area (NEA). In the display device 100 according to the fourth embodiment of the present disclosure, the first capacitor (C1) is formed only in some portions of the peripheral area of the sides of the first electrode 220, instead of the peripheral area in all the sides of the first electrode 220, so that it is possible to minimize the increase in size of the non-emission area (NEA). In comparison to the display device 100 according to the third embodiment of the present disclosure, the display device 100 according to the fourth embodiment of the present disclosure can have a relatively small size of the non-emission area (NEA). That is, in comparison to the display device 100 according to the third embodiment of the present disclosure, the display device 100 according to the fourth embodiment of the present disclosure can have a relatively large size of an emission area (EA).

Fifth Embodiment

Figure 26:
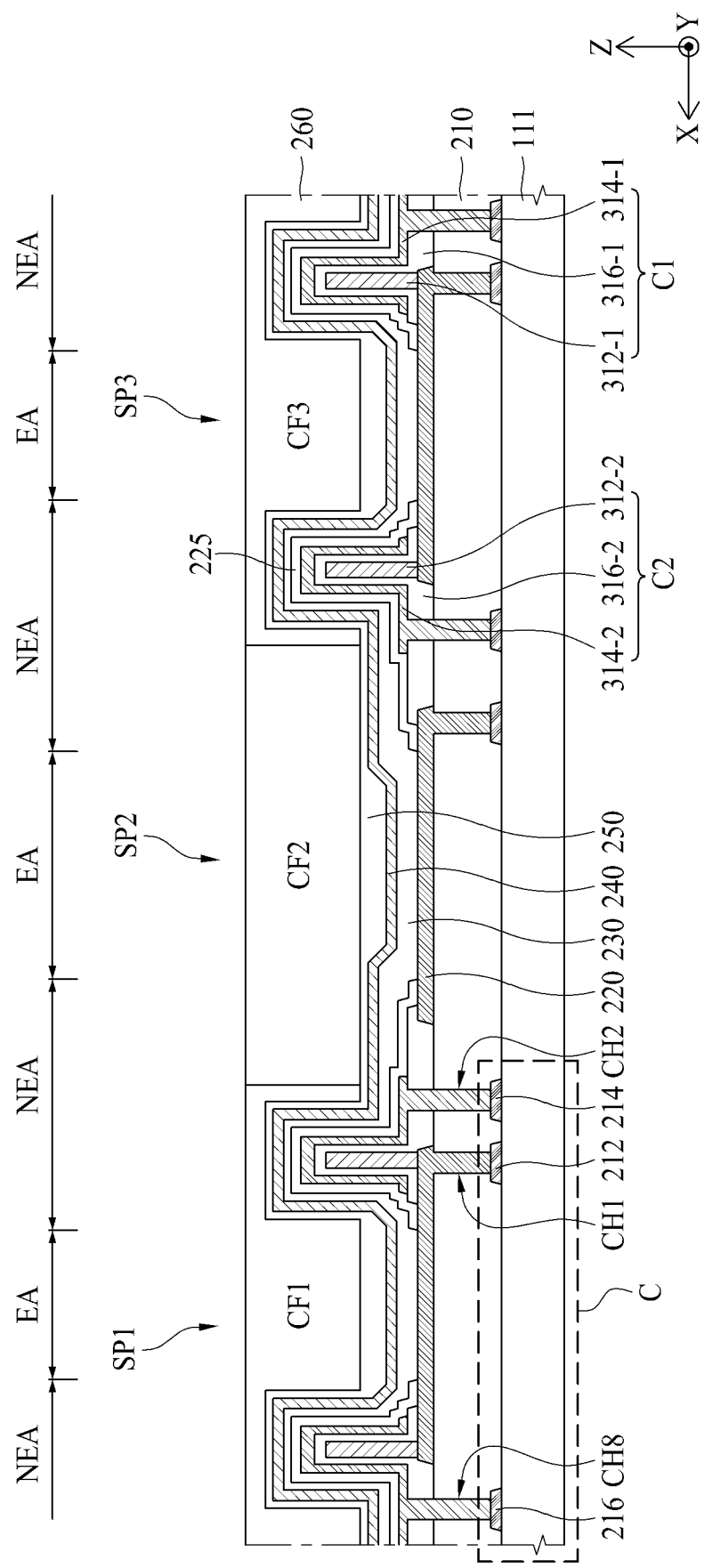
FIG. 26 is a cross sectional view illustrating another embodiment of a display device having a sub pixel shown in FIG. 17.
Figure 27:
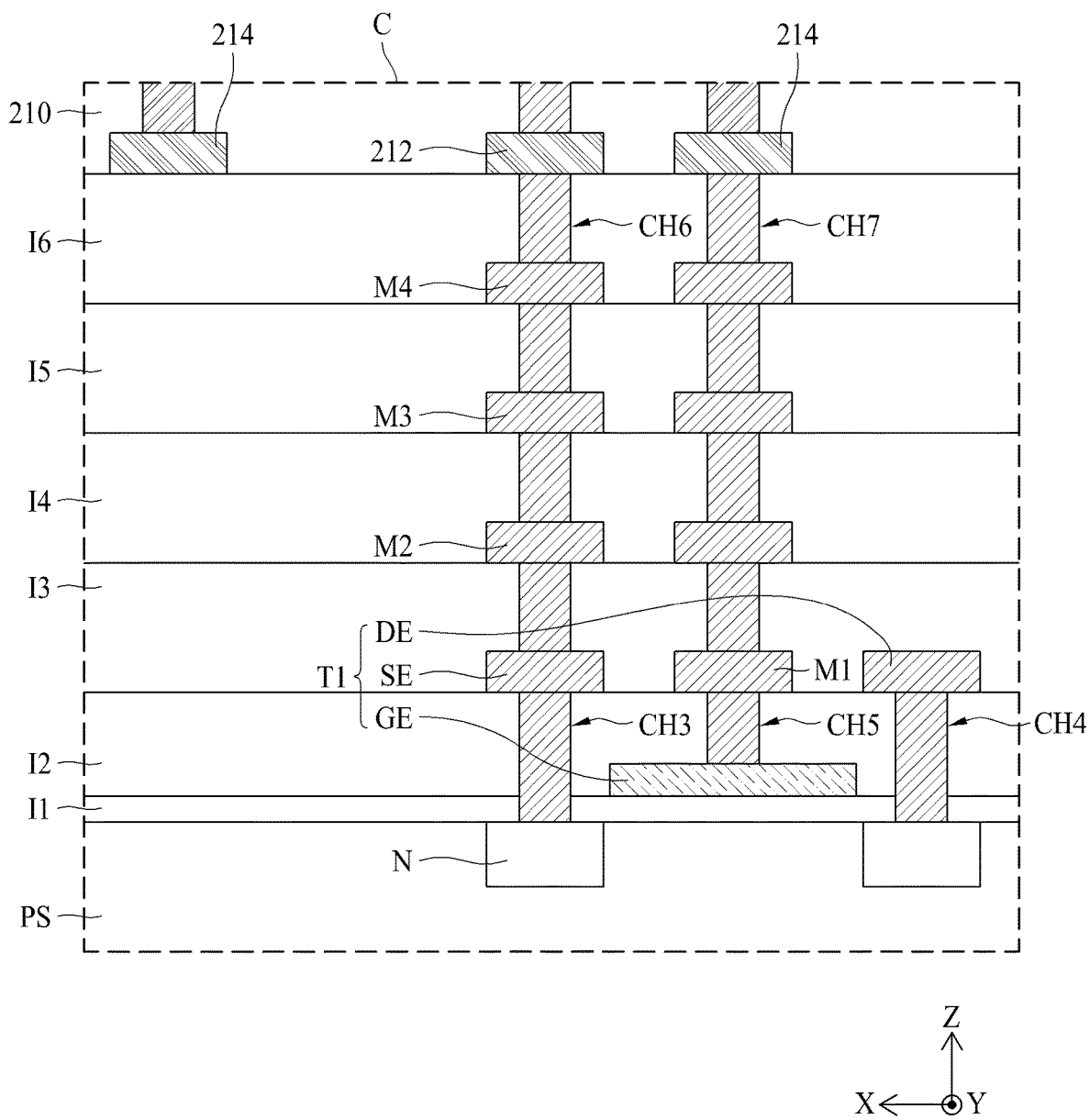
FIG. 27 is an expanded view illustrating one example of "C" area in FIG. 26 according to an embodiment of the present disclosure.
Figure 28:
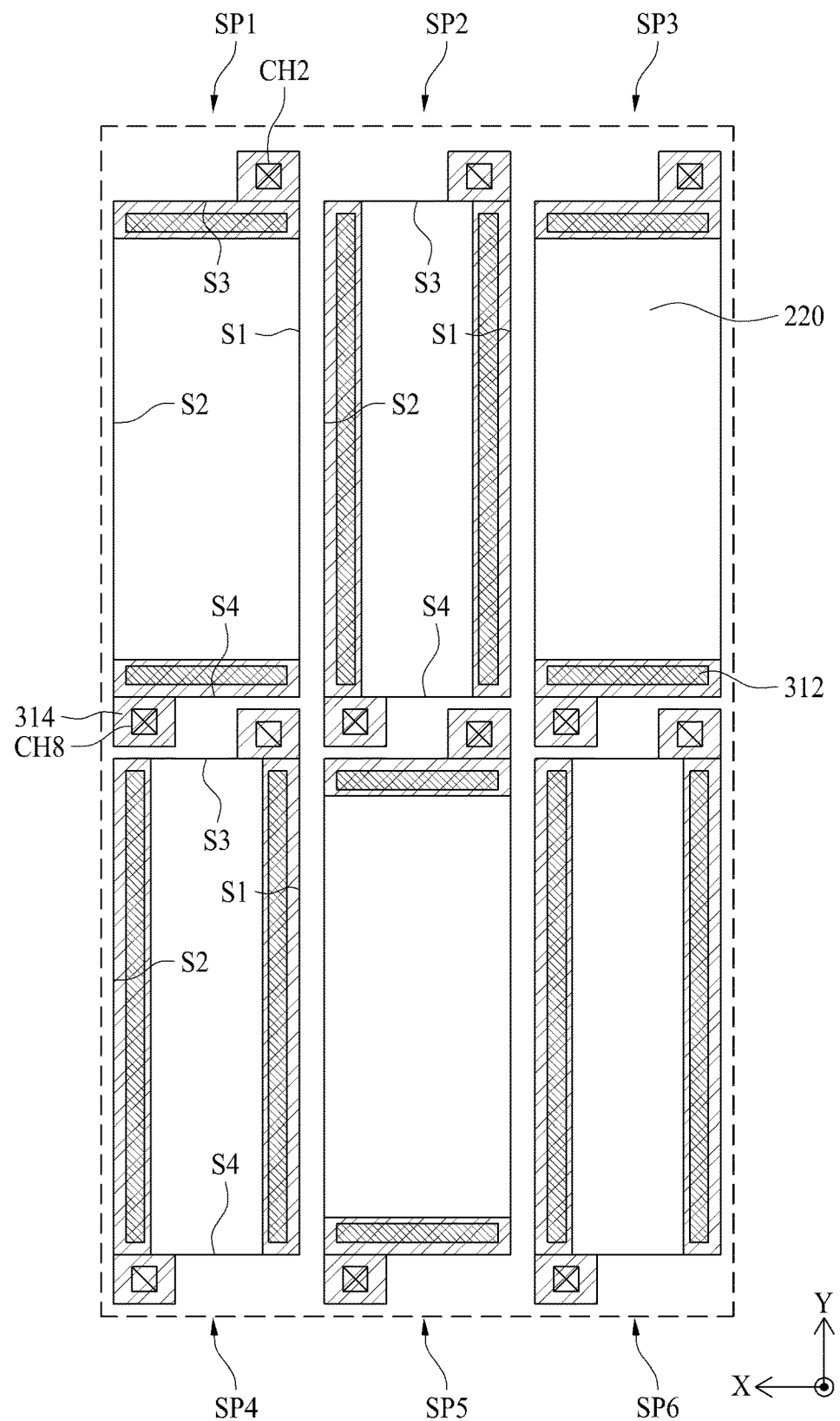
FIG. 28 is a plane view illustrating a first electrode, a first capacitor electrode, and a second capacitor electrode shown in FIG. 26 according to an embodiment of the present disclosure.

FIG. 26 is a cross sectional view illustrating a fifth embodiment of a display device having a sub pixel shown in FIG. 17. FIG. 27 is an expanded view illustrating one example of "C" area in FIG. 26. FIG. 28 is a plane view illustrating a first electrode, a first capacitor electrode, and a second capacitor electrode shown in FIG. 26.

Referring to FIGS. 26 to 28, the display device 100 according to the fifth embodiment of the present disclosure includes a planarization film 210, a first electrode 220, an organic light emitting layer 230, a second electrode 240, an encapsulation film 250, a color filter layer 260, a first capacitor (C1), a second capacitor (C2) and a bank 225, which are provided on a first substrate 111.

The planarization layer 210, the first electrode 220, the organic light emitting layer 230, the second electrode 240, the encapsulation film 250, the color filter layer 260 and the bank 225 included in the display device 100 according to the fifth embodiment of the present disclosure are identical in structure to those of the display device 100 shown in FIGS. 18 to 20, whereby a detailed description for the planarization layer 210, the first electrode 220, the organic light emitting layer 230, the second electrode 240, the encapsulation film 250, the color filter layer 260 and the bank 225 included in the display device 100 according to the fifth embodiment of the present disclosure will be omitted.

In the display device 100 according to the fifth embodiment of the present disclosure, all of the first capacitor (C1) and the second capacitor (C2) can be provided in the peripheral area of the first electrode 220. In this respect, the display device 100 according to the fifth embodiment of the present disclosure is different from the display device 100 according to the third embodiment of the present disclosure. Hereinafter, the structural difference between the display device 100 according to the fifth embodiment of the present disclosure and the display device 100 according to the third embodiment of the present disclosure will be described mainly.

On the first substrate 111, there are a first sub pixel (SP1) for emitting red (R) colored light, a second sub pixel (SP2) for emitting green (G) colored light, and a third sub pixel (SP3) for emitting blue (B) colored light, but not limited to this structure. In addition, a fourth sub pixel for emitting white (W) colored light can be additionally provided on the first substrate 111. Also, an arrangement order of the sub pixels (SP1, SP2, SP3, SP4) can be changed in various ways.

The first substrate 111 can be formed of glass or plastic, but not limited to these materials. The first substrate 111 can be formed of a semiconductor material, such as silicon wafer. The first substrate 111 can be formed of a transparent material or an opaque material.

The display device 100 according to the fifth embodiment of the present disclosure can be formed in a top emission type where emitted light advances upwardly, but not limited to this type. If the display device 100 is formed in the top emission type, the first substrate 111 can be formed of an opaque material as well as a transparent material. If the display device 111 is formed in a bottom emission type where emitted light advances downwardly, the first substrate 111 can be formed of a transparent material.

Hereinafter, for convenience of explanation, it is assumed that the display device 100 is formed in the top emission type, and the first substrate 111 is formed of the opaque material, such as silicon wafer, but not necessarily.

If the first substrate 111 is formed of the semiconductor material, such as silicon wafer, the driving transistor (T1) shown in FIG. 27 can be provided in the first substrate 111. The driving transistor shown in FIG. 27 is identical to the driving transistor shown in FIG. 6, whereby a detailed description for the driving transistor shown in FIG. 27 will be omitted.

On the first substrate 111, there are a first terminal 212, a second terminal 214, and a third terminal 216. The first terminal 212 can be connected with an M4 metal pattern (M4), which is electrically connected with a source electrode (SE) or a drain electrode (DE), via a sixth contact hole (CH6) penetrating through a fourth insulating layer (I6). As a result, the first terminal 212 can be electrically connected with the source electrode (SE) or the drain electrode (DE).

The second terminal 214 can be connected with the M4 metal pattern (M4), which is electrically connected with a gate electrode (GE), via a seventh contact hole (CH7) penetrating through the fourth insulating layer (I6). As a result, the second terminal 214 can be electrically connected with the gate electrode (GE). In addition, the third terminal 216 can be connected with the ground.

The first capacitor (C1) is patterned by each sub pixel (SP1, SP2, SP3) on the first electrode 220. One of the first capacitor (C1) is provided in the first sub pixel (SP1), another of the first capacitor (C1) is provided in the second sub pixel (SP2), and another of the first capacitor (C1) is provided in the third sub pixel (SP3). The first capacitor (C1) includes a first capacitor electrode 312-1, a second capacitor electrode 314-1, and a capacitor dielectric film 316-1.

The first capacitor electrode 312-1 is patterned by each sub pixel (SP1, SP2, SP3) on the first electrode 220. One of the first capacitor electrode 312-1 is provided in the first sub pixel (SP1), another of the first capacitor electrode 312-1 is provided in the second sub pixel (SP2), and another of the first capacitor electrode 312-1 is provided in the third sub pixel (SP3).

The first capacitor electrode 312-1 is electrically connected with the first electrode 220 while being disposed on the first electrode 220. As shown in FIG. 26, the first capacitor electrode 312-1 can be directly provided on the first electrode 220. Thus, the first capacitor electrode 312-1 of the first capacitor (C1) can be in direct contact with the first electrode 220.

The first capacitor electrode 312-1 of the first capacitor (C1) can be formed of a carbon nanotube. In detail, in order to form the first capacitor electrode 312-1 of the first capacitor (C1), a catalytic material, such as nickel (Ni) or iron (Fe) can be patterned on the first electrode 220. In this situation, the catalytic material can be patterned in the periphery of one side of the first electrode 220. And, a chemical vapor deposition (CVD) process is carried out by the use of gas, such as methane gas or ethylene gas, at a temperature of about 600~700° C. Accordingly, a vertical aligned carbon nanotube (VACNT) having a first height (H1) is formed along the periphery of one side of the first electrode 220, in which the catalytic material is patterned in the periphery of the first electrode 220. In this situation, the vertical aligned carbon nanotube (VACNT) has conductivity, whereby the vertical aligned carbon nanotube (VACNT) can be used as the first capacitor electrode 312-1 of the first capacitor (C1).

Accordingly, the first capacitor electrode 312-1 of the first capacitor (C1), which has the first height (H1), can be formed along the periphery of the first electrode 220. In this situation, the first height (H1) of the first capacitor electrode 312-1 of the first capacitor (C1) is about 3.5 μm or more than 3.5 μm, which is relatively higher. According as the first capacitor electrode 312-1 of the first capacitor (C1) has the relatively-high first height (H1), it can serve as a barrier.

In addition, if the first capacitor electrode 312-1 of the first capacitor (C1) according to the fifth embodiment of the present disclosure can be formed in the peripheral area of one side of the first electrode 220. In detail, as shown in FIGS. 26 to 28, the first capacitor electrode 312-1 of the first capacitor (C1) can be provided in the peripheral area of one side among the first, second, third and fourth sides (S1, S2, S3, S4) of the first electrode 220.

In addition, if the first capacitor electrode 312-1 of the first capacitor (C1) can be provided in the peripheral area of one side among the first, second, third and fourth sides (S1, S2, S3, S4) of the first electrode 220, as shown in FIGS. 26 to 28, the first capacitor (C1) can be provided in the peripheral area of one side among the first, second, third and fourth sides (S1, S2, S3, S4) of the first electrode 220.

The capacitor dielectric film 316-1 of the first capacitor (C1) is provided on the first capacitor electrode 312-1 of the first capacitor (C1). The capacitor dielectric film 316-1 of the first capacitor (C1) is provided between the first capacitor electrode 312-1 and the second capacitor electrode 314-1, whereby charges are stored therein.

The capacitor dielectric film 316-1 of the first capacitor (C1) can be provided to cover the first capacitor electrode 312-1 of the first capacitor (C1). In this situation, the capacitor dielectric film 316-1 of the first capacitor (C1) can cover the end of the first electrode 220 provided in the neighboring sub pixels. The capacitor dielectric film 316-1 of the first capacitor (C1) can be formed of an inorganic film, for example, a silicon oxide film or a silicon nitride film.

The second capacitor electrode 314-1 of the first capacitor (C1) can be patterned by each sub pixel (SP1, SP2, SP3) on the capacitor dielectric film 316-1 of the first capacitor (C1). One of the second capacitor electrode 314-1 is provided in the first sub pixel (SP1), another of the second capacitor electrode 314-1 is provided in the second sub pixel (SP2), and another of the second capacitor electrode 314-1 is provided in the third sub pixel (SP3).

The second capacitor electrode 314-1 of the first capacitor (C1) is connected with the gate electrode (GE) of the driving transistor (T1) provided in the first substrate 111. In detail, the second capacitor electrode 314-1 of the first capacitor (C1) can be connected with the second terminal 214 via a second contact hole (CH2) penetrating through the capacitor dielectric film 316-1 and the planarization film 220. According as the second terminal 214 is electrically connected with the gate electrode (GE) of the driving transistor (T1), the second capacitor electrode 314-1 can be electrically connected with the gate electrode (GE) of the driving transistor (T1) via the second terminal 214.

One of the second capacitor electrode 314-1 of the first capacitor (C1) is connected with one of the second terminal 214 via one of the second contact hole (CH2). That is, the second capacitor electrode 314-1 of the first capacitor (C1) is patterned by each sub pixel (SP1, SP2, SP3), and one of the second contact hole (CH2) is formed by each sub pixel (SP1, SP2, SP3). The second capacitor electrode 314-1 of the first capacitor (C1) provided in each sub pixel (SP1, SP2, SP3) can protrude from one side as shown in FIG. 28 so that the second capacitor electrode 314-1 of the first capacitor (C1) provided in each sub pixel (SP1, SP2, SP3) can be connected with the second terminal 214 via the second contact hole (CH2).

The second capacitor electrode 314-1 of the first capacitor (C1) can be formed of a metal material with high reflectance, for example, aluminum (Al), argentums (Ag), and etc. In the display device 100 according to the fifth embodiment of the present disclosure, the second capacitor electrode 314-1 of the first capacitor (C1) is formed of the metal material with high reflectance, whereby some of light emitted from the organic light emitting layer 230, which advance toward the neighboring sub pixel, can be reflected to a front direction. Accordingly, the display device 100 according to the fifth embodiment of the present disclosure is capable of preventing colors from being mixed in the neighboring sub pixels (SP1, SP2, SP3) without using a black matrix.

The second capacitor (C2) is patterned by each sub pixel (SP1, SP2, SP3) on the first electrode 220. One of the second capacitor (C2) is provided in the first sub pixel (SP1), another of the second capacitor (C2) is provided in the second sub pixel (SP2), and another of the second capacitor (C2) is provided in the third sub pixel (SP3).

The second capacitor (C2) includes a first capacitor electrode 312-2, a second capacitor electrode 314-2, and a capacitor dielectric film 316-2.

The first capacitor electrode 312-2 of the second capacitor (C2) is patterned by each sub pixel (SP1, SP2, SP3) on the first electrode 220. One of the first capacitor electrode 312-2 is provided in the first sub pixel (SP1), another of the first capacitor electrode 312-2 is provided in the second sub pixel (SP2), and another of the first capacitor electrode 312-2 is provided in the third sub pixel (SP3).

The first capacitor electrode 312-2 of the second capacitor (C2) is electrically connected with the first electrode 220 while being disposed on the first electrode 220. As shown in FIG. 26, the first capacitor electrode 312-2 can be directly provided on the first electrode 220. Thus, the first capacitor electrode 312-2 of the second capacitor (C2) can be in direct contact with the first electrode 220.

The first capacitor electrode 312-2 of the second capacitor (C2) can be formed of a carbon nanotube. In detail, in order to form the first capacitor electrode 312-2 of the second capacitor (C2), a catalytic material, such as nickel (Ni) or iron (Fe), can be patterned on the first electrode 220. In this situation, the catalytic material can be patterned in the peripheral area of one side of the first electrode 220. Herein, the peripheral area of one side can be the peripheral area of the side confronting the area to be provided with the first capacitor electrode 312-1 of the first capacitor (C1). And, a chemical vapor deposition (CVD) process is carried out by the use of gas, such as methane gas or ethylene gas, at a temperature of about 600~700° C. Accordingly, a vertical aligned carbon nanotube (VACNT) having a first height (H1) is formed along the periphery of the first electrode 220, in which the catalytic material is patterned in the periphery of one side of the first electrode 220. In this situation, the vertical aligned carbon nanotube (VACNT) has conductivity, whereby the vertical aligned carbon nanotube (VACNT) can be used as the first capacitor electrode 312-2 of the second capacitor (C2).

Accordingly, the first capacitor electrode 312-2 of the second capacitor (C2) having the first height (H1) can be formed along the peripheral area of one side of the first electrode 220. In this situation, the first height (H1) of the first capacitor electrode 312-2 of the second capacitor (C2) is about 3.5 µm or more than 3.5 µm, which is relatively higher. According as the first capacitor electrode 312-2 of the second capacitor (C2) has the relatively-high first height (H1), it can serve as a barrier.

In addition, the first capacitor electrode 312-2 of the second capacitor (C2) according to the fifth embodiment of the present disclosure can be formed in the peripheral area of one side of the first electrode 220. In detail, as shown in FIGS. 26 and 28, the first capacitor electrode 312-2 of the second capacitor (C2) can be formed in the peripheral area of the side confronting the first capacitor electrode 312-1 of the first capacitor (C1) among the first, second, third and fourth sides (S1, S2, S3, S4) of the first electrode 220. The first capacitor electrode 312-2 of the second capacitor (C2) can be provided while being confronting the first capacitor electrode 312-1 of the first capacitor (C1), and being spaced apart from the first capacitor electrode 312-1 of the first capacitor (C1).

In addition, if the first capacitor electrode 312-2 of the second capacitor (C2) can be formed in the peripheral area of the side confronting the first capacitor electrode 312-1 of the first capacitor (C1) among the first, second, third and fourth sides (S1, S2, S3, S4) of the first electrode 220, as shown in FIGS. 26 and 28, the second capacitor (C2) can be formed in the peripheral area of the side confronting the first capacitor (C1) among the first, second, third and fourth sides (S1, S2, S3, S4) of the first electrode 220.

For example, the first capacitor electrode 312-1 of the first capacitor (C1) is formed in the peripheral area of the first side (S1), and the first capacitor electrode 312-2 of the second capacitor (C2) can be formed in the peripheral area of the second side (S2) confronting the first side (S1).

In addition, the first capacitor electrodes 312-1 and 312-2 provided in the neighboring sub pixels can be disposed while being not confronting each other. In more detail, in the first sub pixel (SP1), the first capacitor electrode 312-1 of the first capacitor (C1) is provided in the peripheral area of the third side (S3) of the first electrode 220, and the first capacitor electrode 312-2 of the second capacitor (C2) is provided in the peripheral area of the fourth side (S4) of the first electrode 220.

In each of the second and fourth sub pixels (SP2, SP4) disposed adjacent to the first sub pixel (SP1), the first capacitor electrode 312-1 of the first capacitor (C1) is provided in the peripheral area of the first side (S1) of the first electrode 220, and the first capacitor electrode 312-2 of the second capacitor (C2) is provided in the peripheral area of the second side (S2) of the first electrode 220.

The first capacitor electrode 312-2 of the second capacitor (C2) is provided in the peripheral area of the second side (S2) of the first electrode 220 provided in the second sub pixel (SP2), however, the first capacitor electrodes 312-1 and 312-2 are not formed in the peripheral area of the first side (S1) of the first electrode 220 provided in the first sub pixel (SP1). Accordingly, a parasitic capacitance is not formed between the first capacitor electrodes 312-1 and 312-2 of the first sub pixel (SP1) and the first capacitor electrodes 312-1 and 312-2 of the second sub pixel (SP2).

Also, the first capacitor electrode 312-2 of the second capacitor (C2) is provided in the peripheral area of the fourth side (S4) of the first electrode 220 provided in the first sub pixel (SP1), however, the first capacitor electrodes 312-1 and 312-2 are not formed in the peripheral area of the third side (S3) of the first electrode 220 provided in the fourth sub pixel (SP4). Accordingly, a parasitic capacitance is not formed between the first capacitor electrode 312 provided in the first sub pixel (SP1) and the first capacitor electrode 312 provided in the fourth sub pixel (SP4).

The capacitor dielectric film 316-2 of the second capacitor (C2) is provided on the first capacitor electrode 312-2 of the second capacitor (C2). The capacitor dielectric film 316-2 of the second capacitor (C2) is provided between the first capacitor electrode 312-2 and the second capacitor electrode 314-2, whereby charges are stored therein.

The capacitor dielectric film 316-2 of the second capacitor (C2) can be formed to cover the first capacitor electrode 312-2 of the second capacitor (C2). In this situation, the capacitor dielectric film 316-2 of the second capacitor (C2) can cover the end of the first electrode 220 provided in the neighboring sub pixels. The capacitor dielectric film 316-2 of the second capacitor (C2) can be formed of an inorganic film, for example, a silicon oxide film or a silicon nitride film.

The second capacitor electrode 314-2 of the second capacitor (C2) is patterned by each sub pixel (SP1, SP2, SP3) on the capacitor dielectric film 316-2 of the second capacitor (C2). One of the second capacitor electrode 314-2 is provided in the first sub pixel (SP1), another of the second capacitor electrode 314-2 is provided in the second sub pixel (SP2), and another of the second capacitor electrode 314-2 is provided in the third sub pixel (SP3).

The second capacitor electrode 314-2 of the second capacitor (C2) can be connected with the ground. In detail, the second capacitor electrode 314-2 of the second capacitor (C2) can be connected with the third terminal 216 via the eighth contact hole (CH8) penetrating through the capacitor dielectric film 316-2 and the planarization film 220. The third terminal 216 can be connected with the ground, whereby the second capacitor electrode 314-2 of the second capacitor (C2) can be connected with the ground through the third terminal 216.

One of the second capacitor electrode 314-2 of the second capacitor (C2) is connected with one of the third terminal 216 via one of the eighth contact hole (CH8). That is, the second capacitor electrode 314-2 is patterned by each sub pixel (SP1, SP2, SP3), and one of the eighth contact hole (CH8) is formed by each sub pixel (SP1, SP2, SP3). The second capacitor electrode 314-2 of the second capacitor (C2) provided in each sub pixel (SP1, SP2, SP3) can protrude from one side as shown in FIG. 28 so that the second capacitor electrode 314-2 of the second capacitor (C2) provided in each sub pixel (SP1, SP2, SP3) can be connected with the third terminal 216 via the eighth contact hole (CH8).

The second capacitor electrode 314-2 of the second capacitor (C2) can be formed of a metal material with high reflectance, for example, aluminum (Al), argentums (Ag), and etc. In the display device 100 according to the fifth embodiment of the present disclosure, the second capacitor electrode 314-2 of the second capacitor (C2) is formed of the metal material with high reflectance, whereby some of light emitted from the organic light emitting layer 230, which advance toward the neighboring sub pixel, can be reflected to a front direction. Accordingly, the display device 100 according to the fifth embodiment of the present disclosure is capable of preventing colors from being mixed in the neighboring sub pixels (SP1, SP2, SP3) without using a black matrix.

Figure 29A:
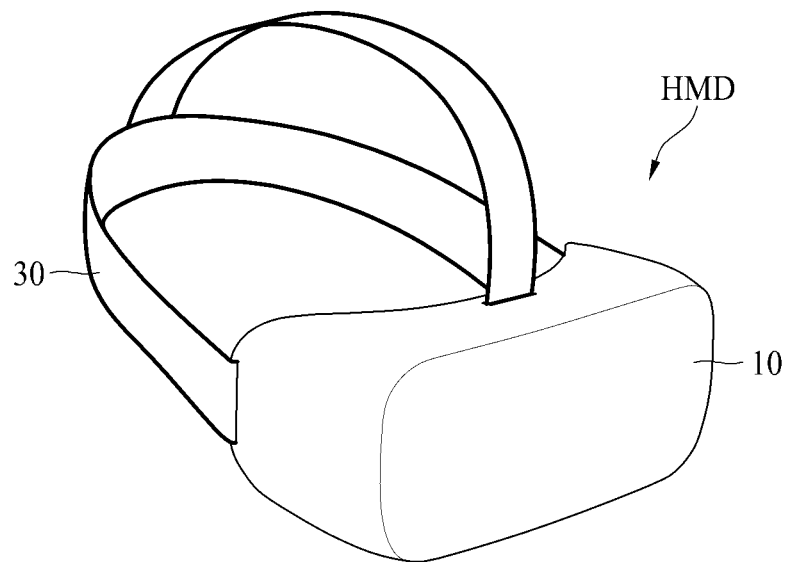
FIGS. 29A to 29C illustrate a display device according to another embodiment of the present disclosure, which relate to a head mounted display (HMD) device.
Figure 29B:
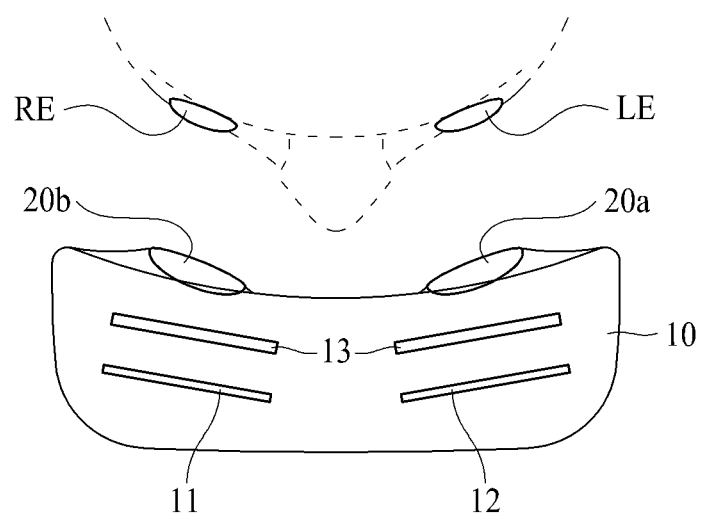
Figure 29C:
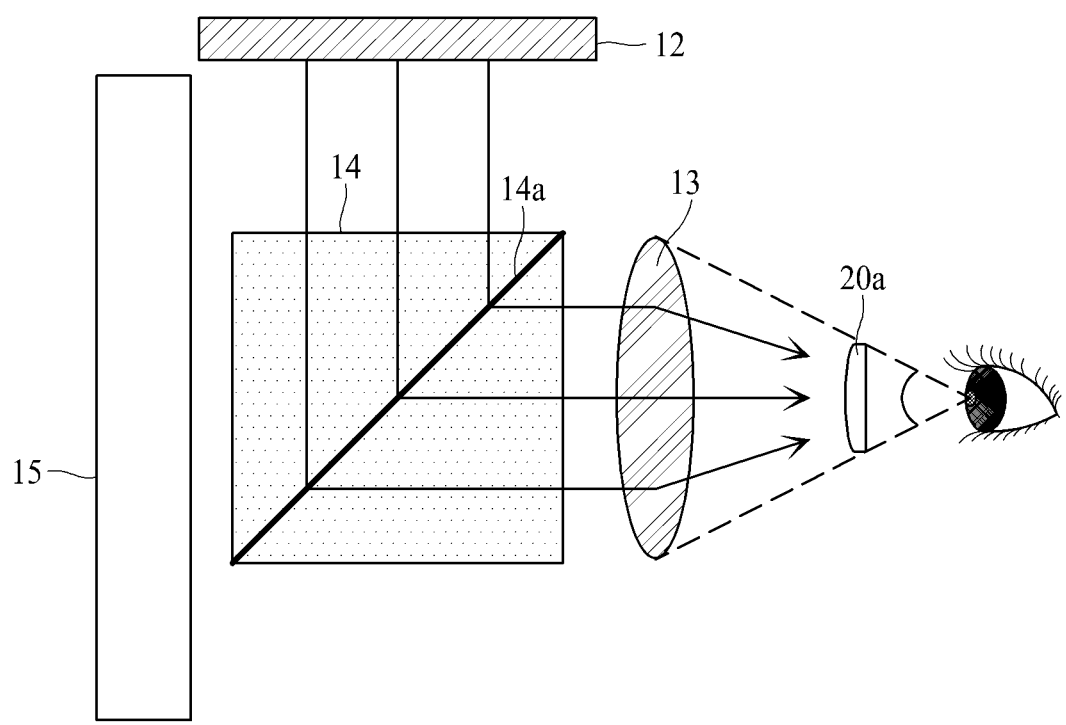

FIGS. 29A to 29C illustrate a display device according to another embodiment of the present disclosure, which relate to a head mounted display (HMD) device. FIG. 29A is a schematic perspective view, FIG. 29B is a schematic plane view of a virtual reality (VR) structure, and FIG. 29C is a cross sectional view of an augmented reality (AR) structure.

As shown in FIG. 29A, the head mounted display (HMD) device according to the present disclosure includes a receiving case 10, and a head mounted band 30.

A display device, a lens array, and an ocular eyepiece can be received in the inside of the receiving case 10.

The head mounted band 30 is fixed to the receiving case 10. In the drawings, the head mounted band 30 is configured to surround an upper surface and both lateral surfaces in a user's head, but not limited to this structure. For example, the head mounted band is provided to fix the head mounted display (HMD) device to a user's head, which can be substituted by an eyeglass-frame shape or a helmet-shaped structure.

As shown in FIG. 29B, the head mounted display (HMD) device of the virtual reality (VR) structure according to the present disclosure includes a left-eye display device 12, a right-eye display device 11, a lens array 13, a left-eye ocular eyepiece 20a, and a right-eye ocular eyepiece 20b.

The left-eye display device 12, the right-eye display device 11, the lens array 13, and the left-eye ocular eyepiece 20a, and the right-eye ocular eyepiece 20b are received in the aforementioned receiving case 10.

The same image can be displayed on the left-eye display device 12 and the right-eye display device 11. In this situation, a user can watch a two-dimensional (2D) image. If an image for a left eye is displayed on the left-eye display device 12, and an image for a right eye is displayed on the right-eye display device 11, a user can watch a three-dimensional (3D) image. Each of the left-eye display device 12 and the right-eye display device 11 can be formed of the aforementioned display device shown in FIGS. 1 to 28. In this situation, an upper portion corresponding to a surface for displaying an image in FIGS. 1 to 28, for example, the color filter layer 260 confronts the lens array 13.

The lens array 13 can be disposed between the left-eye ocular eyepiece 20a and the left-eye display device 12 while being apart from each of the left-eye ocular eyepiece 20a and the left-eye display device 12. That is, the lens array 13 can be positioned at the front of the left-eye ocular eyepiece 20a and at the rear of the left-eye display device 12. Also, the lens array 13 can be disposed between the right-eye ocular eyepiece 20b and the right-eye display device 11 while being apart from each of the right-eye ocular eyepiece 20b and the right-eye display device 11. That is, the lens array 13 can be positioned at the front of the right-eye ocular eyepiece 20b and at the rear of the right-eye display device 11.

The lens array 13 can be a micro lens array. The lens array 13 can be substituted by a pin hole array. Owing to the lens array 13, an image displayed on the left-eye display device 12 or the right-eye display device 11 can be expanded and perceived by a user.

A user's left eye (LE) can be positioned at the left-eye ocular eyepiece 20a, and a user's right eye (RE) can be positioned at the right-eye ocular eyepiece 20b.

As shown in FIG. 29C, the head mounted display (HMD) device of the augmented reality (AR) structure according to the present disclosure includes a left-eye display device 12, a lens array 13, a left-eye ocular eyepiece 20a, a transmissive reflecting portion 14, and a transmission window 15. FIG. 29C shows only the left-eye structure, for convenience of explanation. The right-eye structure is identical in structure to the left-eye structure.

The left-eye display device 12, the lens array 13, the left-eye ocular eyepiece 20a, the transmissive reflecting portion 14, and the transmission window 15 are received in the aforementioned receiving case 10.

The left-eye display device 12 can be disposed at one side of the transmissive reflecting portion 14, for example, an upper side of the transmissive reflecting portion 14 without covering the transmission window 15. Accordingly, an image can be provided to the transmissive reflecting portion 14 under the condition that an ambient background seen through the transmission window 15 is not covered by the left-eye display device 12.

The left-eye display device 12 can be formed of the display device shown in FIGS. 1 to 28. In this situation, an upper portion corresponding to a surface for displaying an image in FIGS. 1 to 28, for example, the color filter layer 260 confronts the transmissive reflecting portion 14.

The lens array 13 can be provided between the left-eye ocular eyepiece 20a and the transmissive reflecting portion 14.

A user's left eye is positioned at the left-eye ocular eyepiece 20a.

The transmissive reflecting portion 14 is disposed between the lens array 13 and the transmission window 15.

The transmissive reflecting portion 14 can include a reflection surface 14a which partially transmits some of light, and also reflects the remaining light. The reflection surface 14a is configured to guide an image, which is displayed on the left-eye display device 12, toward the lens array 13. Thus, a user can watch an image displayed on the left-eye display device 12 together with the ambient background through the transmission window 15. That is, a user can watch one image obtained by a virtual image overlaid with the ambient real background, to thereby realize an augmented reality (AR).

The transmission window 15 is disposed in front of the transmissive reflecting portion 14.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A display device comprising:
a first sub pixel disposed on a substrate;
a second sub pixel disposed on the substrate, the second sub pixel being adjacent to the first sub pixel;
a first electrode disposed in each of the first and second sub pixels;
a first capacitor disposed on the first electrode in each of the first and second sub pixels, the first capacitor being located at a periphery of the corresponding first electrode;
an emission layer disposed on the first electrode in each of the first and second sub pixels; and
a second electrode disposed on the emission layer in each of the first and second sub pixels.

2. The display device according to claim 1, wherein the first capacitor in each of the first and second sub pixels includes:
a first capacitor electrode having a first height from a surface of the corresponding first electrode,
a capacitor dielectric film disposed on the first capacitor electrode, and
a second capacitor electrode disposed on the capacitor dielectric film.

3. The display device according to claim 2, wherein the first capacitor electrode is electrically connected with the first electrode.

4. The display device according to claim 3, wherein the first capacitor electrode is in direct contact with the first electrode.

5. The display device according to claim 2, wherein the first capacitor electrode is a carbon nanotube.

6. The display device according to claim 2, wherein the first capacitor electrode is formed along the periphery of the corresponding first electrode.

7. The display device according to claim 2, wherein the capacitor dielectric film covers the first capacitor electrode.

8. The display device according to claim 2, wherein the first capacitor electrode includes:
a lower surface in contact with the corresponding first electrode,
an upper surface opposite to the lower surface, and a first lateral surface and a second lateral surface opposite to the first lateral surface, the first and second lateral surfaces being between the lower surface and the upper surface, and wherein the second capacitor electrode faces the upper surface of the first capacitor electrode, the first lateral surface of the first capacitor electrode and the second lateral surface of the first capacitor electrode.

9. The display device according to claim 2, wherein the second capacitor electrode includes a reflective metal material.

10. The display device according to claim 2, further comprising:
a driving transistor disposed in each of the first and second sub pixels, the driving transistor being located between the substrate and the corresponding first electrode, and including a gate electrode, a source electrode and a drain electrode,
wherein the second capacitor electrode in each of the first and second sub pixels is electrically connected with the gate electrode of the corresponding driving transistor.

11. The display device according to claim 10, wherein the second capacitor electrode in each of the first and second sub pixels is electrically connected with the gate electrode of the corresponding driving transistor via a contact hole penetrating through the capacitor dielectric film.

12. The display device according to claim 2, further comprising:
a second capacitor disposed between the substrate and the first electrode in each of the first and second sub pixels.

13. The display device according to claim 12, wherein the second capacitor electrode of the first capacitor is connected to ground.

14. The display device according to claim 12, wherein the second capacitor electrode of the first capacitor in the first sub pixel is connected with the second capacitor electrode of the first capacitor in the second sub pixel.

15. The display device according to claim 14, wherein the second capacitor electrode of the first capacitor in the first sub pixel and the second capacitor electrode of the first capacitor in the second sub pixel are each connected with ground via one contact hole penetrating through the capacitor dielectric film.

16. The display device according to claim 1, wherein the emission layer is a white light emission layer.

17. The display device according to claim 1, further comprising:
a color filter layer disposed on the second electrode.

18. The display device according to claim 1, further comprising:
a bank disposed on the first capacitor in each of the first and second sub pixels, the bank covering at least three sides of the first capacitor in each of the first and second sub pixels.

19. The display device according to claim 1, wherein the first electrode in each of the first and second sub pixels includes a first side, a second side opposite to the first side, and third and fourth sides disposed between the first and second sides, and
wherein the first capacitor in each of the first and second sub pixels is formed in a peripheral area of at least one side among the first, second, third and fourth sides of the corresponding first electrode.

20. The display device according to claim 19, wherein the first side of the first electrode in the first sub pixel is adjacent to the second side of the first electrode in the second sub pixel, and wherein the first capacitor in the first sub pixel is disposed at a peripheral area of the second side of the first electrode in the first subpixel, and the first capacitor in the second sub pixel is disposed at a peripheral area of the second side of the first electrode in the second subpixel.

21. The display device according to claim 20, wherein the first capacitor in each of the first and second sub pixels is formed along the second and fourth sides of the corresponding first electrode in an "L" shape.

22. The display device according to claim 20, wherein the first capacitor in the first sub pixel is formed along the first and second sides of the corresponding first electrode, and
wherein the first capacitor in the second sub pixel is formed along the third and fourth sides of the corresponding first electrode.

23. The display device according to claim 19, wherein the first capacitor in each of the first and second sub pixels is disposed along two confronting sides of the corresponding first electrode, or
wherein the first capacitor in each of the first and second sub pixels is disposed along two opposite sides of the corresponding first electrode.

24. The display device according to claim 23, wherein the first capacitor in each of the first and second sub pixels includes:
a first capacitor electrode disposed on the first electrode,
a capacitor dielectric film disposed on the first capacitor electrode, and
a second capacitor electrode disposed on the capacitor dielectric film, the second capacitor electrode being electrically connected with a gate electrode of a driving transistor or ground.

25. The display device according to claim 1, wherein the first capacitor in each of the first and second sub pixels includes:
a lower surface in contact with the corresponding first electrode,
an upper surface opposite to the lower surface, a first lateral surface disposed between the lower surface and the upper surface with each other and facing toward an emission area, and
a second lateral surface opposite to the first lateral surface, and
wherein the second lateral surface of the first capacitor in the first sub pixel and the second lateral surface of the first capacitor in the second sub pixel face in opposite directions or do not face each other.

26. The display device according to claim 1, further comprising:
a lens array including a plurality of lens disposed in front of the substrate and configured to expand an image displayed by the first and second sub pixels; and
a receiving case for receiving the substrate and the lens array therein.

27. A display device comprising:
first and second sub pixels disposed on a substrate, the second sub pixel being adjacent to the first sub pixel;
a first electrode disposed in the first sub pixel;
a first electrode disposed in the second sub pixel;
a common electrode disposed across the first and second sub pixels;
an organic emission layer disposed between the common electrode and the first electrode in each of the first and second sub pixels;

a first capacitor disposed on a periphery of the first electrode in the first sub pixel, the first capacitor having a first capacitor electrode and a second capacitor electrode; and a second capacitor disposed on a periphery of the first electrode in the second sub pixel, the second capacitor having a third capacitor electrode and a fourth capacitor electrode, wherein the first capacitor electrode of the first capacitor is perpendicular to the first electrode in the first sub pixel, and wherein the third capacitor electrode of the second capacitor is perpendicular to the first electrode in the second sub pixel.

* * * * *